US006634007B1

(12) United States Patent
Koetter et al.

(10) Patent No.: US 6,634,007 B1
(45) Date of Patent: Oct. 14, 2003

(54) ALGEBRAIC SOFT DECODING OF REED-SOLOMON CODES

(75) Inventors: Ralf Koetter, Urbana, IL (US); Alexander Vardy, San Diego, CA (US)

(73) Assignee: CodeVector Technology, San Diego, CA (US)

( * ) Notice: Subject to any disclaimer, the term of this patent is extended or adjusted under 35 U.S.C. 154(b) by 0 days.

(21) Appl. No.: 09/602,914

(22) Filed: Jun. 23, 2000

Related U.S. Application Data

(60) Provisional application No. 60/164,095, filed on Nov. 8, 1999.

(51) Int. Cl.[7] .............................................. H03M 13/00
(52) U.S. Cl. ...................................... 714/784; 714/782
(58) Field of Search .................................. 714/784, 781, 714/782, 755–57, 762, 792–95, 703, 763; 703/2; 701/99

(56) References Cited

U.S. PATENT DOCUMENTS

| | | | | |
|---|---|---|---|---|
| 4,336,612 A | * | 6/1982 | Inoue et al. ................. | 714/755 |
| 4,633,470 A | | 12/1986 | Welch et al. | |
| 4,821,268 A | | 4/1989 | Berlekamp | |
| 4,958,348 A | | 9/1990 | Berlekamp et al. | |
| 5,099,484 A | | 3/1992 | Smelser | |
| 5,107,503 A | | 4/1992 | Riggle et al. | |
| 5,291,496 A | * | 3/1994 | Andaleon et al. ........... | 714/703 |
| 5,432,822 A | | 7/1995 | Kaewell, Jr. | |
| 5,537,429 A | | 7/1996 | Inoue | |
| 5,604,752 A | * | 2/1997 | Iwamura ...................... | 714/785 |
| 5,712,861 A | | 1/1998 | Inoue et al. | |
| 5,742,620 A | | 4/1998 | Iwamura | |
| 5,745,525 A | * | 4/1998 | Hunsinger et al. .......... | 375/147 |
| 5,754,563 A | | 5/1998 | White | |
| 5,790,568 A | | 8/1998 | Luong et al. | |
| 5,825,807 A | * | 10/1998 | Kumar ........................ | 370/203 |
| 5,838,728 A | | 11/1998 | Alamouti et al. | |
| 5,862,186 A | * | 1/1999 | Kumar ........................ | 375/142 |
| 5,875,199 A | | 2/1999 | Luthi | |
| 5,875,200 A | | 2/1999 | Glover et al. | |
| 5,949,796 A | * | 9/1999 | Kumar ........................ | 370/487 |
| 5,966,401 A | * | 10/1999 | Kumar ........................ | 375/200 |
| 5,996,401 A | * | 12/1999 | Lewis ......................... | 73/49.2 |
| 6,005,894 A | * | 12/1999 | Kumar ........................ | 329/357 |
| 6,034,996 A | | 3/2000 | Herzberg | |
| 6,405,342 B1 | * | 6/2002 | Lee ............................ | 714/792 |

OTHER PUBLICATIONS

Kotter et al. "Algebraic soft–decision decoding of Reed–Solomon codes; IEEE, International Symposium on Information Theory, pp 61, Jun. 30, 2000".*

(List continued on next page.)

Primary Examiner—Albert Decady
Assistant Examiner—Guy Lamarre
(74) Attorney, Agent, or Firm—Ingrassia Fisher & Lorenz, P.C.

(57) ABSTRACT

An algorithmic soft-decision decoding method for Reed-Solomon codes proceeds as follows. Given the reliability matrix $\Pi$ showing the probability that a code symbol of a particular value was transmitted at each position, computing a multiplicity matrix M which determines the interpolation points and their multiplicities. Given this multiplicity matrix M, soft interpolation is performed to find the non-trivial polynomial $Q_M(X,Y)$ of the lowest (weighted) degree whose zeros and their multiplicities are as specified by the matrix M. Given this non-trivial polynomial $Q_M(X,Y)$, all factors of $Q_M(X,Y)$ of type $Y-f(X)$ are found, where $f(X)$ is a polynomial in X whose degree is less than the dimension k of the Reed-Solomon code. Given these polynomials $f(X)$, a codeword is reconstructed from each of them, and the most likely of these codewords selected as the output of the algorithm. The algorithmic method is algebraic, operates in polynomial time, and significantly outperforms conventional hard-decision decoding, generalized minimum distance decoding, and Guruswami-Sudan decoding of Reed-Solomon codes. By varying the total number of interpolation points recorded in the multiplicity matrix M, the complexity of decoding can be adjusted in real time to any feasible level of performance. The algorithmic method extends to algebraic soft-decision decoding of Bose-Chaudhuri-Hocquenghem codes and algebraic-geometry codes.

50 Claims, 9 Drawing Sheets

OTHER PUBLICATIONS

D. Augot and L, Pecquet, "A Hensel lifting to replace factorization in list–decoding of algebraic–geometric and Reed–Solomon codes," IEEE Trans. Inform. Theory, vol. 46, pp. 2605–2614, Nov. 2000.

L.R. Bahl, J. Cocke, F. Jelinek, and J. Raviv, "Optimal decoding of linear codes for minimizing symbol error rate," IEEE Trans. Inform. Theory, vol. 20, pp. 284–287, Mar. 1974.

E.R. Berlekamp, "Bounded distance +1 soft–decision Reed–Solomon decoding," IEEE Trans. Inform. Theory, vol. 42, pp. 704–721, May 1996.

D. Chase, "A class of algorithms for decoding block codes with channel measurement information," IEEE Trans. Inform. Theory, vol. 18, pp. 170–182, Jan. 1972.

A.B. Cooper, III, "Soft–decision decoding of Reed–Solomon codes," pp. 108–124, in S.B. Wicker and V.K. Bhargava, Editors, Reed–Solomon Codes and their Applications, New York: IEEE Press, 1994.

G.D. Forney, Jr., "Generalized minimum distance decoding," IEEE Trans. Inform. Theory, vol. 12, pp. 125–131, Apr. 1966.

M.P.C. Fossorier and S. Lin, "Soft–decision decoding of linear block codes based on ordered statistics," IEEE Trans. Inform. Theory, vol. 41, pp. 1379–1396, Sep. 1995; also correction, vol. 42, p. 328, Jan. 1996.

V. Guruswami and M. Sudan, "Improved decoding of Reed–Solomon and algebraic–geometric codes," IEEE Trans. Inform. Theory, vol. 45, pp. 1755–1764, Sep. 1999.

V. Guruswami and M. Sudan, "On representations of algebraic–geometric codes for list decoding," IEEE Trans. Inform. Theory, submitted for publication, Apr. 1999.

R. Kötter, "Fast generalized minimum distance decoding of algebraic geometric and Reed–Solomon codes," IEEE Trans. Inform. Theory, vol. 42, pp. 721–738, May 1996.

J.L. Massey, "Shift–register synthesis and BCH decoding," IEEE Trans. Inform. Theory, vol. 15, pp. 122–127, Jan. 1969.

R.R. Nielsen and T. Hoholdt, "Decoding Reed–Solomon codes beyond half the minimum distance," preprint, 1998; see also http://www.student.dtu.dk/~p938546.

R.R. Nielsen, "Decoding concatenated codes with Sudan's algorithm," IEEE Trans. Inform. Theory, submitted for publication, May 2000.

V. Olshevsky and A. Shokrollahi, "A displacement structure approach to efficient decoding of Reed–Solomon and algebraic–geometric codes," in Proceedings 31th ACM Symp. Theory of Computing (STOC), pp. 235–244, Atlanta, GA., May 1999.

X–W. Wu and P.H. Siegel, "Efficient list decoding of algebraic–geometric codes beyond the error correction bound," IEEE Trans. Inform. Theory, submitted May 2000.

S. Ray–Chaudhuri and A.H. Chan, "Bit–level parallel decoding of Reed–Solomon codes," in Proc. 31th Allerton Conf. Comm., Contr., and Computing, Monticello, IL., Sep. 1993.

R.M. Roth and G. Ruckenstein, "Efficient decoding of Reed–Solomon codes beyond half the minimum distance," IEEE Trans. Inform. Theory, vol. 46, pp. 246–258, Jan. 2000.

M.A. Shokrollahi and H. Wasserman, "List decoding of algebraic–geometric codes," IEEE Trans. Inform. Theory, vol. 45, pp. 432–437, Mar. 1999.

U. Sorger, "A new Reed–Solomon decoding algorithm based on Newton's interpolation," IEEE Trans. Inform. Theory, vol. 39, pp. 358–365, Mar. 1993.

M. Sudan, "Decoding of Reed–Solomon codes beyond the error correction bound," J. Complexity, vol. 12, pp. 180–193, 1997.

A. Vardy and Y. Be'ery, "Bit–level soft–decision decoding of Reed–Solomon codes," IEEE Trans. Commun., vol. 39, pp. 440–445, Mar. 1991.

* cited by examiner

ALGEBRAIC SOFT DECODING OF REED-SOLOMON CODES

REFERENCE TO A RELATED PATENT APPLICATION

The present utility patent application is descended from, and claims benefit of priority of, U.S. provisional patent application Serial No. 60/164,095 filed on Nov. 8, 1999, having the same name, and to the same inventors, as is the present application.

BACKGROUND OF THE INVENTION

1. Field of the Invention

The present invention generally relates to decoding of error-correcting codes, and in particular, to efficient soft-decision decoding of Reed-Solomon and related codes.

The present invention particularly concerns an algorithmic soft-decision decoding procedure for Reed-Solomon codes, the procedure (i) making optimal use of the "soft-decision" reliability information available from a communication or storage system (channel), while (ii) executing in a time that scales polynomially with the length of the code. Said decoding procedure also extends to the decoding of Bose-Chaudhuri-Hocquenghem (BCH) codes and most algebraic-geometry (AG) codes; significantly outperforming the generalized minimum distance (GMD) decoding of Forney, Jr.

2. Description of Prior and Related Art

2.1. Reed-Solomon Codes

Reed-Solomon (RS) codes are among the most extensively used error-correcting codes today, and their practical importance is well established. See the book S. B. Wicker, V. K. Bhargava, Reed-Solomon Codes and Their Applications, IEEE Press, 1994, and in particular the chapters by K. A. S. Immink, Reed-Solomon codes and the compact disc, ibid, 1994; R. J. McEliece, L. Swanson, Reed-Solomon codes and the exploration of the solar system, ibid, 1994; S. B. Wicker, M. Bartz, Reed-Solomon codes in hybrid automatic repeat-request systems, ibid,. 1994; M. B. Pursley, Reed-Solomon codes in frequency-hop communications, ibid, 1994; D. Sarwate, Reed-Solomon codes and the design of sequences for spread-spectrum multiple-access communications, ibid, 1994; and E. R. Berlekamp, G. Seroussi, P. Tong, A hypersystolic Reed-Solomon decoder, ibid, 1994. See also E. R. Berlekamp, R. E. Peile, S. P. Pope, The application of error control to communications, IEEE Commun. Mag., vol. 25, pp. 44–57, 1987; W. W, Wu, D. Haccoun, R. E. Peile, Y. Hirata, Coding for satellite communication, IEEE J. Select. Areas Commun., vol. SAC-5, pp. 724–785, 1987; Consultative Committee for Space Data Systems, Recommendations for Space Data System Standards, Blue Book, 1984; M. B. Pursley, W. E. Stark, Performance of Reed-Solomon coded frequency-hop spread-spectrum communication in partial band interference, IEEE Trans. Commun., vol. COM-33, pp. 767–774, 1985; and D. Divsalar, R. M. Gagliardi, J. H. Yuen, PPM performance for Reed-Solomon decoding over an optical-RF relay link, IEEE Trans. Commun., vol. COM-32, pp. 302–305, 1984.

Reed-Solomon codes are used in digital audio disks (CD's) and digital versatile disks (DVD's). See S. B. Wicker, V. K. Bhargava, op. cit. and K. A. S. Immink, op. cit.

Reed-Solomon codes are used in satellite communications. See S. B. Wicker, V. K. Bhargava, op. cit., E. R. Berlekamp, R. E. Peile, S. P. Pope, op. cit., and W. W, Wu, et. al. op. cit.

Reed-Solomon codes are used in deep-space telecommunication systems, including multiple deep-space communication standards. See S. B. Wicker, V. K. Bhargava, op. cit., R. J. McEliece, L. Swanson, op. cit, and Consultative Committee for Space Data Systems, op. cit.

Reed-Solomon codes are used in frequency-hop and spread-spectrum systems. See M. B. Pursley, op. cit., D. Sarwate, op. cit, and M. B. Pursley, W. E. Stark, op. cit.

Reed-Solomon codes are used in error-control systems with feedback. See S. B. Wicker, V. K. Bhargava, op. cit. and S. B. Wicker, M. Bartz, op. cit.

Reed-Solomon codes are used in optical communications. See S. B. Wicker, V. K. Bhargava, op. cit. and D. Divsalar, et. al., op. cit.

2.2 Decoding of Reed-Solomon Codes

The decoding of Reed-Solomon codes is one of the most frequently performed tasks in today's communication and storage systems. Since the discovery of Reed-Solomon codes in the early 1960's (see I. S. Reed, G. Solomon, Polynomial codes over certain finite fields, J. Soc. Indust. Appl. Math., vol. 8. pp. 300–304, 1960), a steady stream of work has been directed towards streamlining their decoding algorithms. Today (circa 2000), very efficient techniques are available to accomplish that task. In particular, hard-decision decoders for RS codes have been implemented in hyper-systolic VLSI using algebraic decoding algorithms. Such decoders have been designed to operate at sustained data rates of 820 Mb/s. See E. R. Berlekamp, G. Seroussi, P. Tong, A hypersystolic Reed-Solomon decoder, op. cit.

An important problem in hard-decision decoding of Reed-Solomon codes is that of decoding beyond the error-correction radius (which is equal to one half of the minimum distance of the code). Search techniques have traditionally dominated approaches to this problem. See e.g., R. E. Blahut, Theory and Practice of Error Control Codes, Addison Wesley, 1994. However, for polynomially-bounded decoding complexity, these techniques do not achieve decoding beyond half the minimum distance of the code, in an asymptotic sense.

A breakthrough in this area was achieved by Sudan in 1997. Reference M. Sudan, Decoding of Reed-Solomon codes beyond the error correction bound, J. Compl. vol. 13, pp. 180–193, 1997; and also V. Guruswami, M. Sudan, Improved decoding of Reed-Solomon and algebraic-geometric codes, IEEE Trans. Inform. Theory, vol. 45, pp. 1755–1764, 1999. In the form presented in V. Guruswarni, M. Sudan op. cit., Sudan's algorithm corrects any fraction of up to $\tau \leq 1-\sqrt{R}$ erroneous positions in an RS code of rate R. Thus the error correction capabilities exceed the minimum distance error-correction bound $(1-R)/2$ for all rates in the interval $[0,1]$. The present invention makes use of the methods and algorithms developed by V. Guruswami, M. Sudan, op. cit.

2.3 Soft-Decision Decoding

Early in the development of coding theory, it was found convenient to represent communication channels as conveyors of symbols drawn from finite sets. The effects of channel noise were represented by the occasional (random) reception of a symbol other than the one that was transmitted. This abstraction of reality permitted the application of powerful algebraic and combinatoric tools to the code design and decoding problems; Reed-Solomon codes themselves were developed through this abstraction.

In reality, however, channel noise is almost always a continuous phenomenon. What is transmitted may be selected from a discrete set, but what is received comes from a continuum of values. This viewpoint leads to the soft-decision decoder, which accepts a vector of real samples of the noisy channel output and estimates the vector of channel input symbols that was transmitted. Alternatively, a soft-decision decoder can accept any quantization of the real samples of the noisy channel output. By contrast, the hard-decision decoder requires that its input be from the same alphabet as the channel input. It is now well known that soft-decision decoding techniques can provide up to 3 dB more coding gain for the additive white Gaussian channel.

A soft-decision decoder accepts analog values directly from the channel; the demodulator is not forced to decide which of the q possible symbols a given signal is supposed to represent. The decoder is thus able to make decisions based on the quality of a received signal. All of the information on the "noisiness" of a particular received signal is lost when the demodulator assigns a symbol to the signal prior to decoding. It has been estimated that this loss of information results in a 2 to 3 dB loss in performance.

2.4. Soft-decision Decoding of Reed-Solomon Codes

Soft-decision decoding of Reed-Solomon codes is different in many ways from hard-decision decoding. The advantage of soft-decision over hard-decision decoding is adequately established in many works. See, for example, J. G. Proakis, Digital Communications, New York: McGraw-Hill, 1983; C. G. Clark, J. B. Cain, Error Correction Coding for Digital Communication, New York: Plenum, 1981; and U. Cheng, G. K. Huth, Bounds on the bit error probability of a linear cyclic code $GF(2^f)$ and its extended code, IEEE Trans. Inform. Theory, vol. 34, pp. 776–735, 1988. This later reference also contains graphs of soft-decision coding gain versus signal-to-noise ratio (SNR) for various RS codes.

The mainstream approach to the problem of soft-decision decoding was pioneered by Forney, and is known as generalized minimum-distance (GMD) decoding. See G. D. Forney, Jr., Generalized minimum distance decoding, IEEE Trans. Inform. Theory, vol. IT-12, pp. 125–131, 1966, and G. D. Forney, Jr., Concatenated Codes, MIT Press, 1966. The complexity of GMD decoding is moderate and ultimately is of the same order as the complexity of hard-decision decoding. See U. Sorger, A new Reed-Solomon decoding algorithm bases on Newton's interpolation, IEEE Trans. Inform. Theory, vol. IT-39, pp. 358–365, 1993; and also R. Kötter, Fast generalized minimum distance decoding of algebraic geometric and Reed-Solomon Codes, IEEE Trans. Inform. Theory, vol. 42, pp. 721–738, 1996. However, the gains that can be realized by GMD decoding are also moderate.

Even though the decoder can often be supplied with reliable soft-decision data relatively easily, the high complexity of optimal soft decoding makes utilization of such data prohibitive. In fact, all the available optimal soft decoding algorithms—e.g. the algorithm of Vardy and Be'ery (see A. Vardy, Y. Be'ery, Bit-level soft decision decoding of Reed-Solomon codes, IEEE Trans. Communications, vol. 39, pp. 440–445, March 1991) or its extensions (see e.g. V. Ponnampalam, B. S. Vucetic, Soft decision decoding of RS codes, in Proc. 13th AAECC Symposium on Applied Algebra, Algebraic Algorithms and Error-Correcting Codes, Hawaii, USA, November 1999; S. Ray-Chaudhuri, A. H. Chan, Bit-level parallel decoding of Reed-Solomon codes, in Proc. 31st Allerton Conference on Communications, Control and Computing, Monticello, Ill., September, 1993)—run in time that scales exponentially with the length of the code. This makes the use of such algorithms generally infeasible in practice.

In this context, the reference of E. R. Berlekamp et. al., op. cit., states that "the major drawback with RS codes for satellite use is that the present generation of decoders do not make full use of bit-based soft-decision information." In the same context, the reference of S. B. Wicker, V. K. Bhargava. op. cit., states that "the 'Holy Grail' of Reed-Solomon decoding research is the maximum-likelihood soft-decision decoder." Thus, due to the ubiquity of RS codes in today's communication and recording systems, efficient soft decoding of RS codes, while making full use of the soft-decision reliability data, remains one of the most important tasks of coding theory and practice.

The present invention will be seen to concern a soft-decision Reed-Solomon decoding method and decoder that (i) makes full use of soft decision information and (ii) runs in time that scales polynomially with the length of the code. The soft-decision decoding method and decoder of the present invention will be also seen to be effective in operating on hard-decision input data.

BRIEF SUMMARY OF THE INVENTION

This invention provides a method for soft-decision decoding of error correction codes such as Reed-Solomon, BCH, and, in general, algebraic-geometric codes. Analog samples that have been received from a communication channel are processed to estimate the likelihoods of the symbols that were input to the communication channel. In accordance with one embodiment of the invention, reliability information concerning the relative likelihoods of different symbols is converted into a set of algebraic interpolation conditions. The interpolation conditions are used to produce a polynomial which, when factored, will yield factors that correspond to codewords. In accordance with a further embodiment of the invention, a vector of symbols received from the communication channel is used to compute a set of algebraic interpolation conditions. The computed set of algebraic interpolation conditions is interpolated to find an interpolation polynomial that satisfies the algebraic interpolation conditions. The interpolation polynomial is then factored to find factors that correspond to codewords of the error correcting code. In this manner, a list of candidate codewords is generated.

SUMMARY OF THE INVENTION

It is a primary object of the present invention to provide an efficient algorithmic method for soft-decision decoding of Reed-Solomon codes and related error-correcting codes.

More particularly, it is a primary object of the present invention to provide an algorithm that always runs in time that scales polynomially with the length of the code, while significantly outperforming (i) conventional hard-decision decoding, (ii) decoding beyond half the minimum distance, as taught by Guruswami and Sudan op. cit., and (iii) GMD soft-decision decoding. Specifically, the algorithmic method of the present invention provides substantially more coding gain than any of the above methods.

Reference is now made to FIG. 2, which should be considered exemplary only and not delimiting of the scope of the present invention. FIG. 2 is a graph showing a comparison of the performance of the method of the present invention for a simple concatenated Reed-Solomon coding scheme. An RS(256,144,113) code of length 256 and dimension 144 over a finite field with 256 elements is concatenated with a binary parity check code of length 9, so that the overall coding scheme represents a binary code of rate 1/2. The channel is an additive, white, Gaussian noise (AWGN) channel. The inner parity check code is in all cases decoded with a maximum a posteriori likelihood decoding algorithm. The four different curves of FIG. 2 correspond to the performance achieved by two hard-decision decoding algorithms and two soft-decision decoding algorithms. The two hard-decision decoding algorithms are (i) conventional Berlekamp-Welch 40 decoding up to half the minimum distance, and (ii) the algorithm by Guruswami and Sudan 41 that decodes beyond half the minimum distance. The two soft-decision decoding algorithms are (iii) Forney's GMD decoding 42 and (iv) the algebraic soft-decision decoding algorithm 43 of the present invention taught within this specification. It can be seen from FIG. 2 that the algorithmic method of the present invention significantly outperforms the other methods.

It is a related object of the present invention that the efficient, algorithmic method for the soft-decision decoding of Reed-Solomon codes should have additional useful features. Among the most useful features of the algorithmic method of the present invention is that there exists a trade-off between complexity and performance and, moreover, this trade-off can be chosen freely in real-time by adjusting a single parameter in the decoding procedure. Hence, the coding gain provided by the Reed-Solomon code can be traded for computational complexity in real-time. This is true in any application. For any desired level of performance, the complexity is bounded by a polynomial in the length of the code. In particular, the computational complexity can be adjusted to any required performance within a fundamental bound. (This bound is described in detail in Appendix A to this application.)

In still yet another object of the present invention that the efficient, algorithmic method of soft-decision decoding of Reed-Solomon codes should readily extend to the decoding of Bose-Chaudhuri-Hocquenghem codes (BCH) and most algebraic-geometry (AG) codes.

Briefly, to achieve the objects of the present invention, an algorithmic decoding method consisting of three major steps is disclosed. For much later reference, let $F_q=\{\alpha_1, \alpha_2, \ldots, \alpha_q\}$ denote a finite field with q elements, where q is a nonnegative integer power of a prime integer. Given that a codeword $c=(c_1, c_2, \ldots, c_n)$ of a Reed-Solomon code over the alphabet $F_q=\{\alpha_1, \alpha_2, \ldots, \alpha_q\}$ is transmitted over a channel, and a vector $y=(y_1, y_2, \ldots, y_n)$ is observed at the channel output, the input to the algorithm consists of the q×n soft-decision reliability matrix Π whose entries are $$\pi_{i,j} = Pr(c_j = \alpha_i | y_j)$$

where $Pr(c_j=\alpha_i|y_j)$ is the probability that the j-th transmitted symbol was $\alpha_i$ given that the j-th observed symbol $y_j$. The three major steps of the algorithmic method are as follows:

1. Determination of Interpolation Points: Given the reliability matrix Π, compute the multiplicity matrix M which determines the interpolation points and their multiplicities.
2. Soft Interpolation: Given the multiplicity matrix M from the previous step, find the non-trivial polynomial $Q_M(X,Y)$ of the lowest (weighted) degree whose zeros and their multiplicities are as specified by the matrix M.
3. Factorization Step: Given the non-trivial polynomial $Q_M(X,Y)$ from the previous step, find all factors of $Q_M(X,Y)$ of type $Y-f(X)$, where $f(X)$ is a polynomial in X whose degree is less than the dimension k of the Reed-Solomon code. Given the polynomials $f(X)$, reconstruct from each of them a codeword of the RS code.

These three steps can be performed either sequentially or in a pipeline. The overall output of the algorithmic method are the codewords resulting from the factorization step. Each of the three steps may be realized and obtained as described below and in the detailed specification.

1. An Algebraic Soft-decision Decoding Method

It should first be understood as background to understanding the present invention that the word "soft" occurring in the phrase "soft-decision decoding of Reed-Solomon codes" means something other, and different, than the more common, and older, hard-decision decoding of Reed-Solomon codes. As explained in the Background section of this specification, a soft-decision decoder accepts a vector of real samples of a noisy channel output, which samples correspond to the reliabilities of possible input symbols, and estimates the vector of channel input symbols that was transmitted.

There is but little prior art of direct relevance to the present invention being that soft decoding is considerably different from, and advanced over, standard ("hard") Reed-Solomon decoding. All previous art regarding standard hard-decision RS decoding is somewhat distant from the present invention. On the other hand, the prior art of direct relevance to the present invention is relatively new: The method of the present invention builds on, and significantly extends upon, an algebraic interpolation algorithm proposed recently by V. Guruswami, M. Sudan op. cit. (for hard-decision decoding).

Accordingly, in one of its aspects the present invention will be recognized to be embodied in a method of decoding an error-correction code wherein the method is algebraic, i.e., algebraic soft-decision decoding. In the context of this invention, algebraic soft-decision decoding may be understood as a decoding method that proceeds by converting reliability information concerning the relative likelihoods of different symbols into a set of algebraic interpolation conditions. A set of algebraic interpolation conditions may be understood, for example, as a system of equations over a finite field. Although soft-decision decoding of various codes has previously been performed (see E. R. Berlekamp, Soft Decision Reed-Solomon Decoder, U.S. Pat. No. 4,821, 268, issued Apr. 11, 1989; E. R. Berlekamp, Bounded distance+1 soft-decision Reed-Solomon decoding, IEEE Trans. Inform. Theory, vol. 42, pp. 704–721, 1996; N. Kamiya, A sufficient condition for a generalized minimum distance, Reed-Solomon decoder to ensure correct decoding, IEICE Transactions Fundamentals, vol. E80-A, pp. 2073–2088, 1997; M. S. Oh, P. Sweeney, Bit-level soft-decision sequential decoding for Reed Solomon codes, Workshop on Coding and Cryptography, Paris, France, January 1999; V. Ponnampalam, B. S. Vucetic, Soft decision decoding of Reed-Solomon codes, in Proc. 13th Symp. Applied Algebra, Algebraic Algorithms, and Error-Correcting Codes, Honolulu, Hi., USA, November 1999; S. Ray-Chaudhuri, A. H. Chan, Bit-level parallel decoding of Reed-Solomon codes, in Proc. 31st Allerton Conference on Communications, Control and Computing, Monticello, Ill., September 1993; S. K. Shin, P. Sweeney, Soft decision decoding of Reed-Solomon codes using trellis methods, IEE Proc.-Commun., vol. 141, pp. 303–308, 1994; S. K. Shin, P. Sweeney, Evaluation of efficient trellis methods for soft decision decoding of Reed-Solomon codes, IEE Proc.-Commun., 1996, vol. 143, pp. 61–67, 1996; D. J. Taipale, M. J. Seo, An efficient soft-decision Reed-Solomon decoding algorithm, IEEE Trans. Inform. Theory, vol. 40, pp. 1130–1132, 1994; A. Vardy, Y. Be'ery, Bit-level soft-decision decoding of Reed-Solomon codes, IEEE Trans. Commun., vol. 39, pp. 440–445, 1991), it has never been algebraically so performed, as was previously discussed. The error-correction code to be decoded may in particular be a code of the Reed-Solomon, BCH, or algebraic-geometry types.

Alternatively, the present invention may be considered to be embodied in a method of decoding an error-correction code that is characterized by transpiring in polynomial time. Again, and although optimal soft-decision decoding has previously been performed, it has never heretofore been so performed in polynomial time, again as was previously discussed. The code may again, in particular, be a code of the Reed-Solomon, BCH, or algebraic-geometry types.

In greater detail, in the preferred embodiment of the present invention a q×n reliability matrix Π with elements $\pi_{i,j}$ is received upon a communications channel. The alphabet is of size q, and n is the length of the Reed-Solomon code.

The preferred algebraic soft-decision decoding method, in accordance with the present invention, then consists of (i) computing a multiplicity matrix M, (ii) interpolating so as to find a non-trivial polynomial which passes through the points specified by M, (iii) factorizing the non-trivial polynomial into factors that correspond to codewords, and (iv) selecting a single codeword from among these factors.

Namely, (i) a multiplicity matrix M is found that has non-negative integer entries $m_{i,j}$ corresponding to the received reliability matrix Π, which entries $m_{i,j}$ specify interpolation points.

Then, given this multiplicity matrix M, (ii) interpolating is performed so as to find a non-trivial polynomial $Q_M(X,Y)$ of lowest (1,k−1)-weighted degree such that $Q_M(X,Y)$ has a zero of multiplicity at least $m_{i,j}$ in the point $(x_j, \alpha_i)$.

Then, given this non-trivial polynomial $Q_M(X,Y)$, (iii) the polynomial is factored so as to find factors of type $Y - f(X)$, $\deg(f) < k$, which factors correspond to codewords.

Then, given these codewords, (iv) a single codeword, most suitable to reconstitute from the received reliability matrix Π the data that was originally transmitted upon the communications channel, is selected.

In still greater detail, the (i) finding the multiplicity matrix M preferably transpires by a process of:

1) commencing with an initial reliability matrix Π*=Π as received, and with an empty all-zero matrix M into which the interpolation points will be recorded, and with an integer s representing the total number of interpolation points,
2) finding a position (i,j) of the largest element in Π*,
3) deriving $\pi^*_{i,j} \leftarrow \pi_{i,j}/(m_{i,j}+2)$; $m_{i,j} \leftarrow m_{i,j}+1$; and s←s−1
4) deciding if s=0, and if so then outputting M, else returning to performing the 2) finding and the 3) deriving and the 4) deciding.

2. Operation to the Algorithmic Method of the Present Invention in Determining the Interpolation Points, by Example The algorithmic method of the present invention will be taught, and proved, within this specification disclosure in the formal language of mathematics, which language of mathematics also serves to rigorously define the invention. However, and at the risk of oversimplification, it is possible to illustrate, by way of a simple example, one of the main components of the present invention, thereby according insight into how the invention works.

An example of the present invention that substantially illustrates the main idea behind the determination of interpolation points (which example is later again set forth in Section 2 of the Description of the Preffered Embodiment part of this specification disclosure, although at that point almost exlusively in mathematical language) is as follows.

Suppose there are five positions in an exemplary set, and each position can take five possible values i.e., {1, 2, 3, 4}. Suppose a codeword c=(1, 2, 3, 4, 0) is sent. For later reference, we make note now, in passing, that this particular sent codeword c has a very easy, and straightforward, relationship to its positions: namely, if a position i of the sent codeword c is represented as $x_i$, and the value of that position i represented as $y_i$, then $y_1 = x_i + 1$ modulo 5. Similarly, any sent codeword can be represented as a polynomial expression. Mathematically, this is expressed as:

$$\mathcal{C}_5(5,2) = \{(f(0), f(1), f(2), f(3), f(4)) := f(X)a+bX, \; a,b \in \mathbb{Z}_5\}$$

where $\mathcal{C}_5(5,2)$ is Reed-Solomon code of length 5 and dimension 2 over the field $\mathbb{F}_5 = \mathbb{Z}_5$. Accordingly, there are $q^k = 5^2 = 25$ codewords, corresponding to 25 different polynomials, as shown in the following table:

| a | b | f(x)   | $(c_0,c_1,c_2,c_3,c_4)$ |
|---|---|--------|-------------------------|
| 0 | 0 | 0      | (0, 0, 0, 0, 0)         |
| 1 | 0 | 1      | (1, 1, 1, 1, 1)         |
| 2 | 0 | 2      | (2, 2, 2, 2, 2)         |
| 3 | 0 | 3      | (3, 3, 3, 3, 3)         |
| 4 | 0 | 4      | (4, 4, 4, 4, 4)         |
| 0 | 1 | X      | (0, 1, 2, 3, 4)         |
| 1 | 1 | 1 + X  | (1, 2, 3, 4, 0)         |
| 2 | 1 | 2 + X  | (2, 3, 4, 0, 1)         |
| 3 | 1 | 3 + X  | (3, 4, 0, 1, 2)         |
| 4 | 1 | 4 + X  | (4, 0, 1, 2, 3)         |
| 0 | 2 | 2X     | (0, 2, 4, 1, 3)         |
| 1 | 2 | 1 + 2X | (1, 3, 0, 2, 4)         |
| 2 | 2 | 2 + 2X | (2, 4, 1, 3, 0)         |
| 3 | 2 | 3 + 2X | (3, 0, 2, 4, 1)         |
| 4 | 2 | 4 + 2X | (4, 1, 3, 0, 2)         |
| 0 | 3 | 3X     | (0, 3, 1, 4, 2)         |
| 1 | 3 | 1 + 3X | (1, 4, 2, 0, 3)         |
| 2 | 3 | 2 + 3X | (2, 0, 3, 1, 4)         |
| 3 | 3 | 3 + 3X | (3, 1, 4, 2, 0)         |
| 4 | 3 | 4 + 3X | (4, 2, 0, 3, 1)         |
| 0 | 4 | 4X     | (0, 4, 3, 2, 1)         |
| 1 | 4 | 1 + 4X | (1, 0, 4, 3, 2)         |
| 2 | 4 | 2 + 4X | (2, 1, 0, 4, 3)         |
| 3 | 4 | 3 + 4X | (3, 2, 1, 0, 4)         |
| 4 | 4 | 4 + 4X | (4, 3, 2, 1, 0)         |

Now, assume that the sent the sent codeword is received as a vector y such that the 5×5 matrix Π with elements $\pi_{i,j} = \Pr(c_j = i | y_j)$ reads:

| i | 0    | 1      | 2    | 3    | 4    |
|---|------|--------|------|------|------|
| 0 | 0.01 | 0.0025 | 0.05 | 0.14 | 0.20 |
| 1 | 0.06 | 0.0025 | 0.09 | 0.21 | 0.05 |
| 2 | 0.02 | 0.9900 | 0.15 | 0.07 | 0.20 |
| 3 | 0.01 | 0.0012 | 0.61 | 0.44 | 0.40 |
| 4 | 0.90 | 0.0038 | 0.10 | 0.21 | 0.15 |

This matrix Π is called the reliability matrix; it shows the probability that a code symbol of a particular value was received at each position of the code. The reliability matrix can be computed from the receive vector y using the method taught in Section 2 of the Description of the Preferred Embodiment part of this specification.

Although some positions of the exemplary reliability matrix Π show a high probability that some one particular code value was indeed received in a particular position (with correspondingly low probabilities that any other value should have been received in that position), other positions of the same matrix show only but low confidence in the value of the received symbol. For example, the 0.9900 probability value at position (2,1) of the reliability matrix Π indicates a very high probability that the value 2, and no other, was received at position 1. Conversely, the 0.40 probability value at position (3,4) of the reliability matrix Π indicates only but slight confidence that the value 3, and no other, was received at position 4.

In classic Reed-Solomon "hard" decoding, a decision is derived from each column of the reliability matrix Π. Interpreting the maximum value in each of the five columns, as explained above, the sent codeword c is interpreted to be (4,2,3,3,3). This represents three errors (out of five positions) relative to the codeword (1,2,3,4,0) that was actually sent. The communications channel upon which the codeword c was sent is apparently very noisy.

However, the present invention will show how the codeword actually sent may be fully accurately recovered in this example. First, the reliability matrix Π contains a great deal of information. Given the information in Π, it is clear that we would like to weigh each position differently. This can be done by requiring that a polynomial $Q_M(X,Y)$ should pass through different points with different multiplicities. This is akin to finding the equation of a curve that passes through given discrete points on a plane. If the equation of such a curve can be found, then it contains information regarding all the points.

As discussed above, the three major steps of the algorithm, in accordance with the present invention, to recover the codeword are: 1) Determination of Interpolation Points, 2) Soft Interpolation, and 3) Factorization Step. The first step (1) Determination of Interpolation Points is now illustrated by example.

The determination consists of computing entries in the multiplicity matrix M by an iterative and recursive process. Mathematically the process commences with (i) an initial reliability matrix Π*=Π as received from a communications channel, (ii) an empty all-zero matrix M into which the entries will be recorded, and (iii) an integer s representing the total number of interpolation points.

Next, a position (i,j) of the largest element in Π* is found. Next, each of (i) $\pi^*_{i,j} \leftarrow \pi_{i,j}/(m_{i,j}+2)$; (ii) $m_{i,j} \leftarrow m_{i,j}+1$; and (iii) $s \leftarrow s-1$, are derived. Finally, it is decided if s=0, and if so then M is outputted, else return is made to performing the finding and the deriving and the deciding.

An easy way to understand what this means is by example. Let s, or the number of iterations to be made, equal 7. This number s is arbitrary: it will later be discussed that the number of iterations in the algorithm of the present invention may be traded-off for accuracy in the recovery of RS codewords. It will later be found that, for the noise experienced on this channel in the example that follows, 7 iterations will suffice for accurate codeword recovery. More iterations could be performed, but are unnecessary.

The initial, empty and all zero matrix M is:

$$M$$

$$\begin{matrix} 0 & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{matrix}$$

Displaying this matrix M, and the initial exemplary reliability matrix Π*=Π together we have:

| Π* | | | | | M |
|---|---|---|---|---|---|
| 0.01 | 0.0025 | 0.05 | 0.14 | 0.20 | 0 0 0 0 0 |
| 0.06 | 0.0025 | 0.09 | 0.14 | 0.05 | 0 0 0 0 0 |
| 0.02 | 0.9900 | 0.15 | 0.07 | 0.20 | 0 0 0 0 0 |
| 0.01 | 0.0012 | 0.61 | 0.44 | 0.40 | 0 0 0 0 0 |
| 0.90 | 0.0038 | 0.10 | 0.21 | 0.15 | 0 0 0 0 0 |

Now, by the process of the present invention, (i) the single largest numerical probability in the matrix Π* is located, (ii) the corresponding position of the matrix M is augmented by +1, and (iii) this single largest probability in the matrix Π is divided by the augmented value +1 (or in this case, by the number 2) and replaced in the matrix Π*. For matrix M, and matrix Π*, we then get the following (changed positions are shown in boldface for convenience of reference):

| Π* | | | | | M |
|---|---|---|---|---|---|
| 0.01 | 0.0025 | 0.05 | 0.14 | 0.20 | 0 0 0 0 0 |
| 0.06 | 0.0025 | 0.09 | 0.14 | 0.05 | 0 0 0 0 0 |
| 0.02 | 0.4950 | 0.15 | 0.07 | 0.20 | 0 1 0 0 0 |
| 0.01 | 0.0012 | 0.61 | 0.44 | 0.40 | 0 0 0 0 0 |
| 0.90 | 0.0038 | 0.10 | 0.21 | 0.15 | 0 0 0 0 0 |

The process continues: locate the now-highest probability in the matrix Π*, and adjust it and the corresponding position of the matrix M. Thus the next, second, iteration produces:

| Π* | | | | | M |
|---|---|---|---|---|---|
| 0.01 | 0.0025 | 0.05 | 0.14 | 0.20 | 0 0 0 0 0 |
| 0.06 | 0.0025 | 0.09 | 0.14 | 0.05 | 0 0 0 0 0 |
| 0.02 | 0.4950 | 0.15 | 0.07 | 0.20 | 0 1 0 0 0 |
| 0.01 | 0.0012 | 0.61 | 0.44 | 0.40 | 0 0 0 0 0 |
| 0.45 | 0.0038 | 0.10 | 0.21 | 0.15 | 1 0 0 0 0 |

Likewise, the third iteration produces:

| Π* | | | | | M |
|---|---|---|---|---|---|
| 0.01 | 0.0025 | 0.05 | 0.14 | 0.20 | 0 0 0 0 0 |
| 0.06 | 0.0025 | 0.09 | 0.14 | 0.05 | 0 0 0 0 0 |
| 0.02 | 0.4950 | 0.15 | 0.07 | 0.20 | 0 1 0 0 0 |
| 0.01 | 0.0012 | 0.305 | 0.44 | 0.40 | 0 0 1 0 0 |
| 0.45 | 0.0038 | 0.10 | 0.21 | 0.15 | 1 0 0 0 0 |

Consider that in the fourth iteration the division of the original probability $\pi_{2,2}$ is now by 3, and no longer by 2:

| Π* | | | | | M | | | | |
|---|---|---|---|---|---|---|---|---|---|
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.44 | 0.40 | 0 | 0 | 1 | 0 | 0 |
| 0.45 | 0.0038 | 0.10 | 0.21 | 0.15 | 1 | 0 | 0 | 0 | 0 |

Doubtless by now, the mathematical expression of this process, which is given above, will be better understood. The process continues:

| Π* | | | | | M | | | | |
|---|---|---|---|---|---|---|---|---|---|
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.44 | 0.40 | 0 | 0 | 1 | 0 | 0 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.22 | 0.40 | 0 | 0 | 1 | 1 | 0 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.22 | 0.20 | 0 | 0 | 1 | 1 | 1 |
| 0.30 | 0.0038 | 0.10 | 0.21 | 0.10 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.2475 | 0.15 | 0.07 | 0.20 | 0 | 3 | 0 | 0 | 0 |
| 0.01 | 0.0012 | 0.305 | 0.22 | 0.20 | 0 | 0 | 1 | 1 | 1 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.2475 | 0.15 | 0.07 | 0.20 | 0 | 3 | 0 | 0 | 0 |
| 0.01 | 0.0012 | 0.1525 | 0.22 | 0.20 | 0 | 0 | 2 | 1 | 1 |
| 0.30 | 0.0038 | 0.10 | 0.21 | 0.15 | 2 | 0 | 0 | 0 | 0 |

Eventually, the iteration count s having decreased to zero, the iterative process terminates. The final reliability matrix M, given immediately above, can alternatively be expressed as:

| point (x,y) | (1,2) | (0,4) | (2,3) | (3,3) | (4,3) |
|---|---|---|---|---|---|
| multiplicity | 3 | 2 | 2 | 1 | 1 |

Importantly to understanding the scope of the present invention, from this point forward, certain mathematical processes employed are substantially conventional. Namely, using conventional interpolation methods, the final multiplicity matrix M is interpreted so as to find a non-trivial polynomial $Q_M(X,Y)$ of lowest $(1,k-1)$-weighted degree such that $Q_M(X,Y)$ has a zero of multiplicity at least $m_{i,j}$ at the point $(\alpha_i, x_j)$.

For the derived multiplicity matrix M above, this polynomial $Q_M(X,Y)$ turns out to be:

$$Q_M(X,Y)=1+X+Y-X^2-Y^2-2X^2Y+Y^2X-Y^3+X^4-2YX^3-X^2Y^2+2Y^3X.$$

Continuing, this polynomial is factorized into factors of type $Y-f(X)$, where $\deg(f)<k$. This factoring, while non-trivial, is mathematically well understood and is, for example, taught in the prior art reference of Guruswami and Sudan, op. cit.

In accordance with the present invention, these factors correspond to potential codewords. Given these potential codewords, a single new codeword—suitable to reconstitute from the received reliability matrix Π the data that was originally transmitted upon the communications channel—is selected. Continuing with the example, the derived polynomial $Q_M(X,Y)$ factors as:

$$Q_M(X,Y)=(Y-X-1)(Y+1+2X)(Y+1+3XY+3X+3X^2).$$

We identify the two solutions $(Y-X-1)$ and $(Y+1+2X)$ as corresponding to tentative codewords. Of these two solutions, the solution $(Y-X-1)$, or, equivalently, $Y=X+1$, corresponds to the sent codeword. It may now be recalled that $y=x+1$ was indeed the relationship between the bit positions $x_i$ and $y_i$ of the sent codeword c.

The mathematical process of the present invention has thus sufficed to precisely recover the Reed-Solomon codeword transmitted upon a channel. This has efficiently transpired, in polynomial time, nonetheless that the channel is so noisy that less than half, or forty percent (40%), of the codeword was received correctly.

3. Features of the Present Invention

As a more restrictive characterization of the present invention, the invention will be recognized to be embodied in method of soft-decision decoding a forward error-correction code of the Reed-Solomon, BCH, or algebraic-geometry types, wherein the method is both (i) algebraic, and (ii) transpiring in polynomial time.

The decoding method is characterized in that the magnitude of a coding gain provided by the Reed-Solomon code can be traded-off for computational complexity; relatively more coding gain being realized at relatively more computational complexity while relatively less coding gain is realized at relatively less computational complexity. In this method, the computational complexity is always bounded by a polynomial function of the length of a codeword of the Reed-Solomon code.

If this method of decoding a Reed-Solomon code (or a BCH subfield subcode of the Reed-Solomon code) is applied on a q-ary symmetric communication channel then, as the number of interpolation points becomes very large, it will produce a list of candidate codewords containing the particular codeword at the input to the q-ary symmetric communications channel, provided that less than t errors have occurred, further provided that $\tau=t/n$ satisfies the inequality $$(1-\tau)^2 + \frac{\tau^2}{q-1} > R$$

where q is the number of symbols of the symmetric communication channel, and R is the rate of the Reed-Solomon code.

Similarly, if this method of decoding of a Reed-Solomon code (or a BCH subfield subcode of the Reed-Solomon code) is applied on a q-ary symmetric erasure communication channel then, as the number of interpolation points becomes very large, it will produce a list of candidate codewords containing the particular codeword at the input to the q-ary symmetric erasure communication channel, provided that less than t errors have occurred, further provided that the fraction $\tau=t/n$ satisfies the inequality:

$$\frac{1}{1-\sigma}\left((1-\tau-\sigma)^2 + \frac{\tau^2}{q-1}\right) + \frac{\sigma}{q} \geq R$$

where q is the number of symbols of the q-ary symmetric erasure communication channel, not counting the symbol φ denoting erasure, σ is the number of erasures that occurred, and R is the rate of the Reed-Solomon code.

Similarly, if this method of decoding a Reed-Solomon code (or a BCH subfield subcode of the Reed-Solomon code) is applied on a q-PSK communication channel then, as the number of interpolation points becomes very large, it will produce a list of candidate codewords containing the particular codeword at the input to the q-PSK channel, provided that less than s errors to the nearest neighbors and less than t errors beyond the nearest neighbors have occurred, further provided that the fractions σ=s/n and τ=t/n satisfy the inequality:

$$(1-\tau-\sigma)^2 + \frac{\tau^2}{q-3} + \frac{\sigma^2}{2} \geq R$$

where q is the number of symbols of the q-PSK communication channel and R is the rate of the Reed-Solomon code.

4. Aspects and Embodiments of the Present Invention

Accordingly, in one of its aspects, the present invention may be considered to be embodied in a method of decoding an error-correcting code. The error-correcting code has a number of codewords, with each codeword having multiple symbols. The error-correcting code is of the Reed-Solomon type and/or of the Bose-Chaudhuri-Hocquenghem (BCH) type.

The decoding method constitutes algebraic soft-decision decoding by act of converting reliability information concerning the relative likelihoods of the different code symbols into algebraic interpolation conditions. Ergo, by its reliance on the "soft" reliability information, the method is called a soft-decision decoding method.

In accordance with the present invention, data inputs to the algebraic soft-decision decoding method commonly include reliability information concerning the relative likelihoods of different code symbols and/or data from which the reliability information concerning the relative likelihoods of different code symbols can be computed. With these inputs, the algebraic soft-decision decoding consists essentially of three steps.

First, given the reliability information, computing from this reliability information a set of algebraic interpolation conditions.

Next, given the computed algebraic interpolation conditions, interpolating to find a non-trivial interpolation polynomial that satisfies these conditions.

Then, given the interpolation polynomial, factoring the polynomial to find factors that correspond to codewords of the Reed-Solomon code or the BCH code, therein generating a list of candidate codewords.

In more formal, mathematical terms, the algebraic soft-decision decoding method may be considered to be applied to an (n,k,d) Reed-Solomon code over a finite field $\mathbb{F}_q$ with q elements, or, equivalently (for the operation of the present invention) and alternatively, an (n,k',d') BCH code over a finite field $\mathbb{F}_{q'}$ with q' elements. In these expressions $n \geq 1$ is the length, $k \leq n$ is the dimension, and d=n-k+1 is the minimum distance of the Reed-Solomon code, while n is the length, $k' \leq k$ is the dimension, and $d' \geq d$ is the minimum distance of the BCH code, the BCH code being but a subfield subcode of the Reed-Solomon code. For each of the n code symbols of the Reed-Solomon code, the input to the method of the present invention includes reliability information concerning the relative likelihood of each code symbol being equal to a $\alpha \in \mathbb{F}_q$ for each element α of the finite field $\mathbb{F}_q$, and/or data from which such reliability information can be computed.

With these inputs, the three steps of the algebraic soft-decision decoding method are as follows:

First, given the reliability information, non-negative integer-valued numbers $m_{i,j}$ are computed for each position j in the code, where $1 \leq j \leq n$, and for each element $\alpha_i \in \mathbb{F}_q$, where $1 \leq i \leq q$, so that the total number of non-zeros among the non-negative integer-valued numbers $m_{i,j}$ depends on the reliability information.

Second, given these numbers $m_{i,j}$, a (non-trivial) polynomial $Q_M(X,Y)$ is found by interpolating, so that $Q_M(X,Y)$ has a zero of multiplicity at least $m_{i,j}$ at the point $(x_j, \alpha_i)$ for each j in the range $1 \leq j \leq n$ and each i in the range $1 \leq i \leq q$, this polynomial $Q_M(X,Y)$ best having the least possible (1,k-1)-weighted degree. (By "best having" it is meant only that the method works faster to produce better results when the polynomial $Q_M(X,Y)$ so has the least possible (1,k-1)-weighted degree; the method will still work even if the polynomial $Q_M(X,Y)$ does not so have the least possible (1,k-1)-weighted degree.)

Third, given the polynomial $Q_M(X,Y)$, this polynomial is factored to find factors of type $Y-f(X)$, where the degree of the polynomial f(X) is less than k, each factor corresponding to a codeword of the Reed-Solomon code or the BCH code, thereby generating a list of candidate codewords.

In the preferred methods, each of the computing and the interpolating and the factoring have a computational complexity that is always bounded by a polynomial function of the length n of the Reed-Solomon code and/or the BCH code. Accordingly, the entire algebraic soft-decision decoding has a computational complexity that is always bounded by a polynomial function of the length n of the Reed-Solomon code and/or the BCH code.

Any of the computing, the interpolating, and the factoring may be implemented in special purpose digital logic, including digital signal processing (DSP), circuits, and/or by software in a general purpose digital computer.

The method of the present invention is most often used in concatenated coding schemes, multilevel coding schemes, and combinations thereof. It may be, for example, used in a communication system, in a recording system, or in multitudinous other systems in which error-correcting codes are employed.

In another of its aspects, the present invention may be considered to be embodied in a method of decoding a Reed-Solomon error-correcting code of length n and rate R over a finite field $\mathbb{F}_q$ with q elements, or, equivalently, a Bose-Chaudhuri-Hocquenghem (BCH) error-correcting code of length n and rate R' over the finite field $\mathbb{F}_{q'}$, on a channel of type drawn from the group consisting of q-ary symmetric channels, q-ary symmetric erasure channels, and q-PSK channels.

In such an environment, the input to the method comprises data that includes a vector $y=(y_1, y_2, \ldots, y_n)$ observed at the channel output, where all the n elements of the vector y belong to the finite field $\mathbb{F}_q$ in the case of q-ary symmetric channels and q-PSK channels, but, in the case of q-ary symmetric erasure channels, all the n elements of the vector y belong to $\mathbb{F}_q \cup \phi$, the special symbol $\phi$ denoting erasure.

The method essentially consists of three steps.

First, given the vector $y=(y_1, y_2, \ldots, y_n)$, from this vector y a set of algebraic interpolation conditions is computed.

Second, the computed set of algebraic interpolation conditions is interpolated to find a (non-trivial) interpolation polynomial that satisfies the algebraic interpolation conditions.

Third, given the interpolation polynomial, this polynomial is factored to find factors that correspond to codewords of the Reed-Solomon code or the BCH code. Thus a list of candidate codewords is generated.

Each of the computing, the interpolating and the factoring has computational complexity that is always bounded by a polynomial function of the length of the Reed-Solomon code and/or the BCH code.

The present invention may be thus characterized by its application to Reed-Solomon error-correcting codes, to BCH error-correcting codes, and to algebraic-geometric codes in general. Notably, the present invention can be also applied to the output of a hard-decision channel. Since no probability accompanies the output of a hard-decision channel, the substantial power of the soft-decision decoding of the present invention is wasted, but the present invention will still operate to decode RS, BCH, and algebraic-geometric error-correcting codes, while outperforming all the existing hard-decision decoding methods.

The present invention is thus better defined by what it does than exactly (i) what it operates on, as inputs, and, indeed, (ii) what it produces, as output. In illustration of (ii), the output can be considered to be the list of candidate codewords, or, by selection in a fourth step, some subset of these codewords (which may include a subset of one, meaning one codeword). In all cases, the essence of the present invention is that it is converting reliability information concerning the relative likelihoods of the different code symbols into algebraic interpolation conditions, and then proceeding to produce from the interpolation conditions a polynomial which, when factored, will deliver up factors that correspond to codewords. Ergo, the soft-decision decoding of the present invention uses reliability information— commonly heretofore discarded—to decode Reed-Solomon, BCH, and algebraic-geometric codes.

5. Applications and Implementations of the Present Invention

In still yet another of its aspects, the present invention may be used in a concatenated coding scheme, wherein a maximum a posteriori likelihood (MAP) algorithm, such as the BCJR decoding algorithm (see L. R. Bahl, J. Cocke, F. Jelinek, J. Raviv, Optimal decoding of linear codes for minimizing symbol error rate, En; Trans. Inform. Theory, vol. 20, pp. 284–287, 1974), is preferably employed to decode the inner code(s). The present invention may be also used in a multilevel coding scheme, or in a coding scheme that combines multilevel coding with concatenated coding.

The method of the present invention may be implemented in either software or hardware or any combination thereof. In particular, any one of the computation (determination of interpolation points), interpolation, and factorization steps of the decoding method may be implemented in either special purpose digital logic or by software in a general purpose digital computer.

The present invention may be used in a communication system, such as a cable-modem, an ISDN line, a satellite telecommunications link, a wireless communications (multi-user) system, and many others. The present invention may be also used in a recording system, such as a magnetic disk (read and write channels), a magnetic tape, a compact disk, a DVD, as well as other magnetic, optical, and holographic storage media.

The following illustrates a possible implementation of the present invention in a communication system 20. The communication system has a source of a data 22, a Reed-Solomon encoder 23 of the data producing a Reed-Solomon codeword, and a decoder 24, as illustrated in FIG. 1.

The decoder includes (1) a re-encoder 26 receiving the reliability matrix $\Pi$ and producing an estimated received Reed-Solomon codeword, the re-encoder supplying this Reed-Solomon codeword to each of (2) an interpolator 28, also receiving chosen interpolation points from an interpolation point chooser 30 to produce a function $Q_M(X,Y)$, (3) a factorizer 32 also receiving the function $Q_M(X,Y)$ from the interpolator to produce a list of candidate Reed-Solomon codewords, (4) an interpolation point chooser operating with the reliability matrix $\Pi$, and (5) a selector 34, also receiving the candidate codewords from the factorizer, for selecting a subset of codewords as does best permit the reconstituting of the sent data from the received matrix $\Pi$.

The (4) interpolation point chooser records points in the multiplicity matrix M by process of—as was stated before— (1) commencing with an initial reliability matrix $\Pi^* = \Pi$ as received, and with an empty all-zero matrix M into which the points will be recorded, and with an integer s representing the number of interpolation points, (2) finding a position (i,j) of the largest element in $\Pi^*$, (3) deriving $\pi^*_{i,j} \leftarrow \pi_{i,j}/(m_{i,j}+2)$; $m_{i,j} \leftarrow m_{i,j}+1$; and $s \leftarrow s-1$, and (4) deciding if $s=0$, and if so then outputting M, else returning to performing the (2) finding and the (3) deriving and the (4) deciding.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow.

DESCRIPTION OF THE PREFERRED EMBODIMENT

Figure 1:
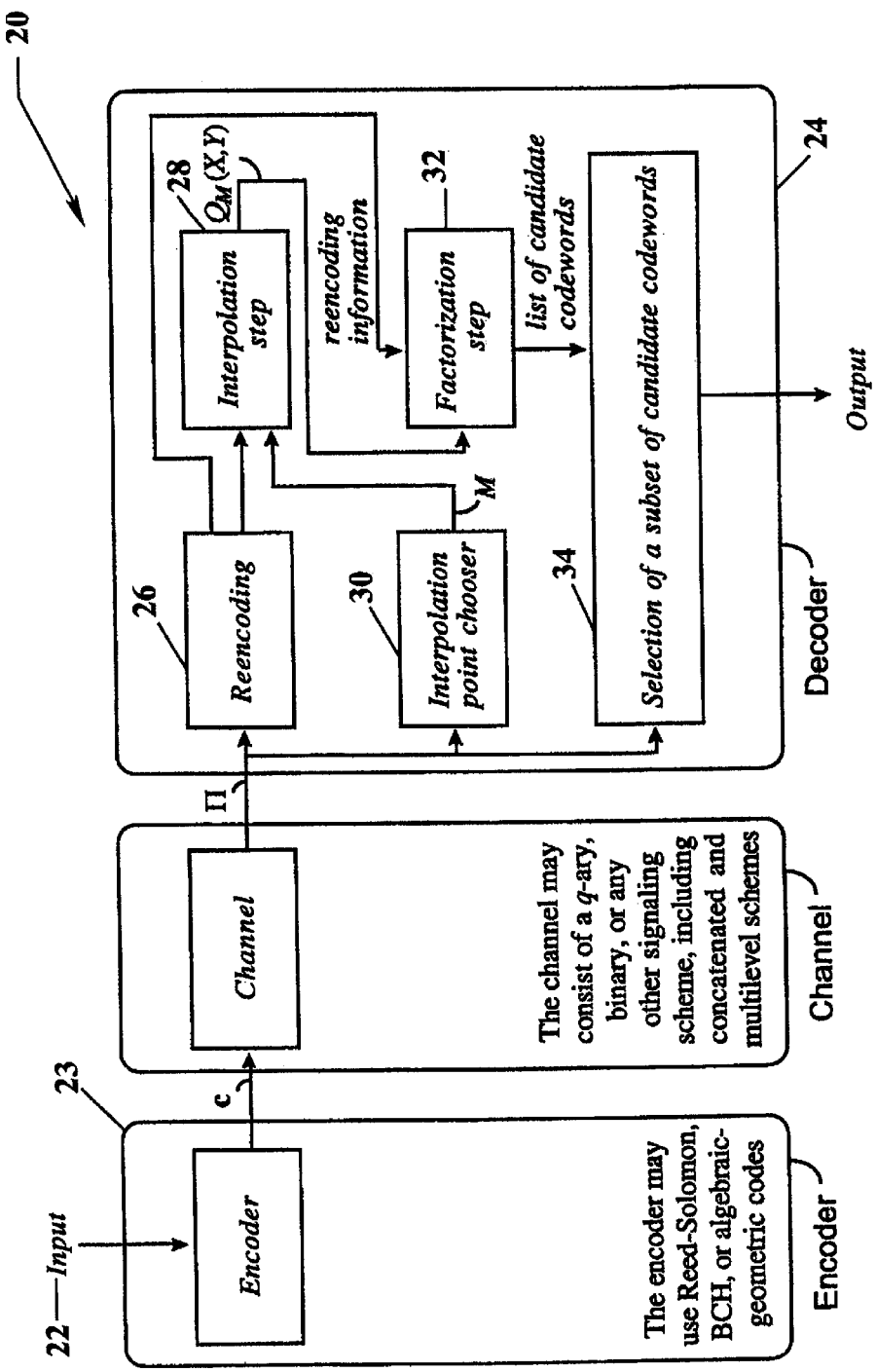
FIG. 1 is a diagrammatic view of a system 20 performing algebraic soft-decision decoding of Reed-Solomon codes in accordance with the present invention.

Although specific embodiments of the invention will now be described, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope, and contemplation of the invention as further defined in the appended claims.

1. Preliminaries

Let $\mathbb{F}_q$ be the finite field with q elements. The ring of polynomials over $\mathbb{F}_q$ in a variable X is denoted $\mathbb{F}_q[X]$. Reed-Solomon codes are obtained by evaluating subspaces of $\mathbb{F}_q[X]$ in a set of points D={$x_1, x_2, \ldots, x_n$} which is a subset of $\mathbb{F}_q$. Specifically, the RS code $C_q(n,k)$ of length $n \leq q$, where $n \geq 1$, and dimension $k \leq n$, where $k \geq 1$, is defined as follows:

$$C_q(n,k) \stackrel{def}{=} \quad (1)$$
$$\{(f(x_1), \ldots, f(x_n)) : x_n, \ldots, x_n \in D, f(X) \in \mathbb{F}_q[X], deg f(X) < k\}$$

The point set D is usually taken as $\mathbb{F}_q$ or as $\mathbb{F}^*_q$, the set of all nonzero elements of $\mathbb{F}_q$. Unless stated otherwise, we shall henceforth assume that D=$\mathbb{F}^*_q$, so that n=q−1. The set of polynomials of degree less than k in $\mathbb{F}_q[X]$ is a linear space, which together with the linearity of the evaluation map (1) establishes that $C_q(n,k)$ is a linear code. The minimum Hamming distance of $C_q(n,k)$ is d=n−k+1, which follows from the fact that any non-zero polynomial of degree less than k evaluates to zero in less than k positions.

Given an arbitrary vector y∈$\mathbb{F}_q^n$, the hard-decision decoding task consists of finding the codeword c∈$C_q(n,k)$ such that the Hamming weight wt(e) of the error vector e=y−c is minimized. The Berlekamp-Welch algorithm (L. R. Welch, E. R. Berlekamp, Error correction for algebraic block codes, U.S. Pat. No. 4,633,470) is a well-known algorithm that accomplishes this task provided wt(e)<d/2. Generalizing upon Berlekamp-Welch, M. Sudan (Decoding of Reed-Solomon codes beyond the error correction bound, J. Complexity, vol. 12, pp. 180–193, 1997, op cit.) and V. Guruswami, M. Sudan (Improved decoding of Reed-Solomon and algebraic-geometric codes, IEEE Trans. Inform. Theory, vol. 45, pp. 1755–1764, 1999, op. cit.)

derived a polynomial-time algorithm that achieves error correction substantially beyond half the minimum distance of the code. In the remainder of this section we describe the essential elements of this algorithm.

Definition 1. Let $A(X,Y)=$ $$\sum_{i=0}^{\infty} \sum_{j=0}^{\infty} a_{i,j} X^i Y^j$$

be a bivariate polynomial over $\mathbb{F}_q$ and let $w_X, w_Y$ be nonnegative real numbers. The $(w_X, w_Y)$-weighted degree of $A(X,Y)$ is defined as the maximum over all numbers $iw_X + jw_Y$ such that $a_{i,j} \neq 0$.

The (1,1)-weighted degree is simply the degree of a bivariate polynomial. The number of monomials of $(w_X, w_Y)$-weighted degree at most $\delta$ is denoted $N_{w_X, w_Y}(\delta)$. Thus $$N_{w_X, w_Y}(\delta) \stackrel{def}{=} |\{X^i Y^j : i, j \geq 0 \text{ and } iw_X + jw_Y \leq \delta\}|$$

The following lemma provides a closed-form expression for $N_{w_X, w_Y}(\delta)$ for the case $w_X=1$. Similar statements can be found in V. Guruswami, M. Sudan, op. cit.; R. R. Nielsen, T. Høholdt, Decoding Reed-Solomon codes beyond the minimum distance, preprint, 1998; R. M. Roth, G. Ruckenstein, Efficient decoding of Reed-Solomon codes beyond half the minimum distance, IEEE Trans. Inform. Theory, vol. 46, pp. 246–258, January 2000; and M. Sudan op. cit. Let [x] denote the largest integer not greater than x.

Lemma 1.

$$N_{1,k}(\delta) = \left[\frac{\delta+1}{k}\right]\left(\delta - \frac{k}{2}\left[\frac{\delta}{k}\right] + 1\right)$$

The lemma follows by straightforward counting of monomials; for a detailed proof, see V. Guruswami, M. Sudan, op. cit. The exact, but elaborate, expression in Lemma 1 can be converted into a simple lower bound as follows:

$$N_{1,k}(\delta) = \frac{(\delta+1)^2}{2(k-1)} + \frac{k-1}{2}\left(\left[\frac{\delta+1}{k-1}\right] - \left(\left[\frac{\delta+1}{k-1}\right] - \frac{\delta+1}{k-1}\right)^2\right) > \frac{\delta^2}{2k} \quad (2)$$

Given the vector $y=c-e=(y_1, y_2, \ldots, y_n)$ and the corresponding point set $D=\{x_1, x_2, \ldots, x_n\}$, we consider the set of pairs $P=\{(x_1, y_2), (x_2, y_2), \ldots, (x_n, y_n)\}$ as points two-dimensional affine space. Given a point $(\alpha, \beta)$ and a bivariate polynomial $A(X,Y)$ in $\mathbb{F}_q[X,Y]$, we say that $(\alpha, \beta)$ lies on $A(X,Y)$ if $A(\alpha, \beta)=0$. Equivalently, we say that $A(X,Y)$ passes through the point $(\alpha, \beta)$.

In the error-free case, we have $e=0$ and therefore $y_i = c_i = f(x_i)$ for a unique polynomial $f(X) \in \mathbb{F}_q[X]$ of degree less than k. It follows that all points in P lie on a polynomial of type $Y-f(X)$, where $\deg f(X)<k$. Furthermore, this polynomial is unique, and can be found by interpolation techniques. If some of the positions of the error vector e are nonzero, then no polynomial of type $Y-f(X)$ with $\deg f(X)<k$ passes through all the points in P, unless e itself is a codeword. In this case, we let $\Lambda(X,Y)$ be an error-locator polynomial in $\mathbb{F}_q[X,Y]$, defined by the property that $\Lambda(x_i, y_i)=0$ whenever $e_i \neq 0$. The error-locator polynomial annihilates the effect of the nonzero error vector. In other words, one can always find a polynomial of type $\Lambda(X,Y)(Y-fX)$ with $\deg f(X)<k$ that passes through all the points of P. This leads to the following interpolation problem: find a bivariate polynomial $A(X,Y)$ of type $$A(X,Y)=\Lambda(X,Y)(Y-f(X)) \text{ with } \deg f(X)<k \quad (3)$$

such that $A(X,Y)$ passes through all $(x_i, y_i) \in P$ and $Y-f(X)$ passes through a maximal number of points in P. Providing $wt(e)<d/2$, a solution to (3) solves the decoding problem since then the polynomial $f(X)$ corresponds to the transmitted codeword $c=y-e$.

The algorithm of V. Guruswami, M. Sudan, op. cit., results by relaxing the classical interpolation problem (3) and, at the same time, constraining it further. We relax the requirement that $A(X,Y)$ should be of the type $\Lambda(X,Y)(Y-f(X))$. On the other hand, we will be interested in bivariate polynomials that not only pass through all the points in P but do so with high multiplicity.

Definition 2. A bivariate polynomial $A(X,Y)$ is said to pass through a point $(\alpha, \beta)$ with multiplicity m if the shifted polynomial $A(X+\alpha, Y+\beta)$ contains a monomial of degree m and does not contain a monomial of degree less than m. Equivalently, the point $(\alpha, \beta)$ is said to be a zero of multiplicity m of the polynomial $A(X,Y)$.

Using a well-known explicit relation between the coefficients of a bivariate polynomial $A(X,Y)$ and the coefficients of the shifted polynomial, we find that Definition 2 imposes the following linear constraints $$\sum_{i=k}^{\infty} \sum_{j=l}^{\infty} \binom{i}{j}\binom{j}{l} \alpha^{i-k} \beta^{j-l} a_{ij} = 0 \text{ for all } k, l \geq 0 \text{ such that } k+l<m \quad (4)$$

on the coefficients $a_{i,j}$ of $A(X,Y)$. Thus $A(X,Y)$ passes through a given point with multiplicity at least m if and only if its coefficients $a_{i,j}$ satisfy the $m(m+1)/2$ constraints specified by (4). We are now ready to formulate the first step of the Sudan algorithm.

Interpolation step: Given the set P of points in $\mathbb{F}_q \times \mathbb{F}_q$ and a positive integer m, compute the nontrivial bivariate polynomial $Q_P(X,Y)$ of minimal $(1,k-1)$-weighted degree that passes through all the points in P with multiplicity at least m.

The number of linear constraints imposed on the coefficients of $Q_P(X,Y)$ by the interpolation step is $nm(m+1)/2$. If the $(1,k-1)$ weighted degree of $Q_P(X,Y)$ is $\delta$, then $Q_P(X,Y)$ may have up to $N_{1,k-1}(\delta)$ nonzero coefficients. These coefficients should be chosen so as to satisfy the $nm(m+1)/2$ linear constraints of the type (4). This produces a system of $nm(m+1)/2$ linear equations (not all of them necessarily linearly independent) over $\mathbb{F}_q$ in $N_{1,k-1}(\delta)$ unknowns. It is clear that this system has a solution as long as $$N_{1,k-1}(\delta) > \frac{nm(m+1)}{2} \quad (5)$$

For an efficient algorithm to solve such a system of equations and, hence, accomplish the interpolation step of the Sudan algorithm, see R. Kötter, *On Algebraic Decoding of Algebraic-Geometric and Cyclic Codes*, p. 88, Ph.D. Thesis, Prentice-Hall, 1991; R. R. Nielsen, T. Høholdt, Decoding Reed-Solomon codes beyond half the minimum distance, preprint, 1998 (see also R. M. Roth, G. Ruckenstein, Efficient decoding of Reed-Solomon codes beyond half the minimum distance, IEEE Trans. Inform. Theory, vol. 46, pp. 246–258, January 2000).

The idea of Sudan's algorithm is that, under certain constraints on the weight of the error vector, the relaxation of the classical interpolation problem (3) to the problem of finding the polynomial $Q_P(X,Y)$ does not affect the solution. Hence, we hope that $Q_P(X,Y)$ factors as $\Lambda(X,Y)(Y-f(X))$ and, reversing arguments, we can read-off a list of tentative decoding decisions as factors of $Q_P(X,Y)$ of type $Y-f(X)$. Thus the second (and last) step of the Sudan algorithm is as follows.

---

Factorization step: Given bivariate polynomial $Q_P(X,Y)$, identify all the factors of $Q_P(X,Y)$ of type $Y - f(X)$ with deg $f(X) < k$. The output of the algorithm is a list of the codewords that correspond to these factors.

---

The factorization of $Q_P(X,Y)$ into factors of type $Y-f(X)$ with deg $f(X)<k$ is a surprisingly simple task. Efficient algorithms to accomplish such factorization can be found in D. Augot, L. Pecquet, A Hensel lifting to replace factorization in list-decoding of algebraic-geometric and Reed-Solomon codes, IEEE Trans. Inform. Theory, vol. 46, November 2000, in press; and M. A. Shokrollahi, Computing roots of polynomials over function fields of curves, preprint, 1998, for example. The fundamental question is under which conditions can one guarantee that the correct decoding decision is found on the list produced by the factorization step.

Theorem 2. Suppose that a vector y and a positive integer m are given. Then the factorization step produces a list that contains all codewords of $C_q(n,k)$ at distance less than $$t = n - \left\lfloor \frac{\delta}{m} \right\rfloor > \left\lceil n\left(1 - \sqrt{R\frac{m+1}{m}}\right) \right\rceil \qquad (6)$$

from y, where $\delta$ is the smallest integer such that $N_{1,k-1}(\delta) >$ nm(m+1)/2 and R=k/n.

For a proof of (6), see V. Guruswami, M. Sudan, op. cit. and R. R. Nielsen, T. Høholdt, op. cit. The inequality in (6) follows from (2). We note that Theorem 2 is a special case of Theorem 3, which we prove in the next section.

2. Algebraic Soft-decision Decoding of Reed-Solomon Codes

In many situations (see E. R. Berlekamp, R. E. Peile, S. P. Pope, "The application of error control to communications," IEEE Commun. Mag., vol. 25, pp. 44–57, 1987; A. Vardy, Y. Be'ery, "Bit-level soft-decision decoding of Reed-Solomon codes", IEEE Trans. Commun., vol. 39, pp. 440–445, March 1991), the decoder can be supplied with probablistic reliability information concerning the received symbols. A decoding algorithm that utilizes such information is generally referred to as a soft-decision decoding algorithm. We now specify this notion precisely, in the context of the present invention. First, we define a memoryless channel, or simply a channel, as a collection of a finite input alphabet $\mathcal{X}$, an output alphabet $\mathcal{Y}$, and $|\mathcal{X}|$ functions $$f(\cdot|x): \mathcal{Y} \to [0,1] \text{ for all } x \in \mathcal{X}$$

that are assumed to be known to the decoder. It is possible to think of channel input and output as random variables X and Y, respectively, and assume that X is uniformly distributed over $\mathcal{X}$. If the channel is continuous (e.g. Gaussian), then Y is continuous and the $f(\cdot|x)$ are probability-density functions, while if the channel is discrete then Y is discrete and the $f(\cdot|x)$ are probability-mass functions. In either case, the decoder can compute the probability that $\alpha \in \mathcal{X}$ was transmitted given that $y \in \mathcal{Y}$ was observed, as follows $$Pr(\chi = \alpha | \Upsilon = y) = \frac{f(y|\alpha)Pr(\chi = \alpha)}{\sum_{x \in \mathcal{X}} f(y|x)Pr(\chi = x)} = \frac{f(y|\alpha)}{\sum_{x \in \mathcal{X}} f(y|x)} \qquad (7)$$

where the second equality follows from the assumption that X is uniform. For Reed-Solomon codes, the input alphabet is always fixed to $\mathcal{X}=\mathbb{F}_q$. Henceforth, let $\alpha_1, \alpha_2, \ldots, \alpha_q$ be a fixed ordering of the elements of $\mathbb{F}_q$; this ordering will be implicitly assumed in the remainder of this specification. Given the vector $y=(y_1,y_2,\ldots,y_n) \in \mathcal{Y}^n$ observed at the channel output, we compute $$\pi_{i,j} \stackrel{def}{=} Pr(\chi = \alpha_i | \Upsilon = y_j) \text{ for } i = 1, 2, \ldots, q \text{ and } j = 1, 2, \ldots, n \qquad (8)$$

according to the expression in (7). Let $\Pi$ be the q×n matrix with entries $\pi_{i,j}$ defined in (8). We will refer to $\Pi$ as the reliability matrix and assume that $\Pi$ is the input to the algebraic soft-decision decoding algorithm. For notational convenience, we will sometimes write $\Pi(\alpha,\beta)$ to refer to the entry found in the j-th column of $\Pi$ in the row indexed by $\alpha \in \mathbb{F}_q$. We note that in some applications (see E. R. Berlekamp, R. E. Peile, S. P. Pope, The application of error control to communications, IEEE Commun. Mag., vol. 25, pp. 44–57, 1987; W. W. Wu, D. Haccoun, R. E. Peile, Y. Hirata, "Coding for satellite communication", IEEE J. Select. Areas Commun., vol. 5, pp. 724–785, 1987), it is the reliability matrix $\Pi$ rather than the vector $y \in \mathcal{Y}^n$ that is directly available at the channel output. In many other cases, the channel output alphabet $\mathcal{Y}$ is quite different from $\mathbb{F}_q$. The first step in hard-decision decoding is thus the construction of the hard-decision vector $u=(u_1,u_2,\ldots,u_n) \in \mathbb{F}_q^n$, where $$u_j \stackrel{def}{=} \text{argmax}_{\alpha \in \mathbb{F}_q} \Pi(\alpha, j) \text{ for } j = 1, 2, \ldots, n \qquad (9)$$

This hard-decision vector is then taken as the channel output y=c+e, thereby converting the channel at hand into a hard-decision channel.

On the other hand, a soft-decision decoder works directly with the probabilities compiled in the reliability matrix $\Pi$. If the decoder is algebraic, it must convert these probabilities into algebraic conditions. Before presenting a formal description of the proposed soft-decision decoding procedures, we give an example that illustrates the main idea. This example was also discussed in detail in the Summary part of this specification.

Example 1. Let q=5, so that $\mathbb{F}_q$ is the set of integers $\{0, 1, 2, 3, 4\}$ with operations modulo 5. We take $D=\mathbb{F}_q=\mathbb{Z}_5$ and consider the Reed-Solomon codes $C_5(5,2)$ defined as $$C_5(5,2) \stackrel{def}{=} \{f(0), f(1), f(2), f(3), f(4)) : f(X) = a + bX \text{ with } a, \qquad (10)$$
$$b \in \mathbb{Z}_5\}$$

Suppose that the codeword c=(1, 2, 3, 4, 0) corresponding to $f(X)=1+X$ was transmitted, resulting in the following reliability matrix $$\Pi = \begin{bmatrix} 0.01 & 0.0025 & 0.05 & 0.14 & 0.20 \\ 0.06 & 0.0025 & 0.09 & 0.14 & 0.05 \\ 0.02 & 0.9900 & 0.15 & 0.07 & 0.20 \\ 0.01 & 0.0012 & 0.61 & 0.44 & 0.40 \\ 0.90 & 0.0038 & 0.10 & 0.21 & 0.15 \end{bmatrix} \quad (11)$$

We assume, as before, that the rows and columns of $\Pi$ are indexed by the elements 0,1,2,3,4 of $\mathbb{Z}_5$, in this order. The hard-decision vector derived from $\Pi$ according to (9) is u=(4,2,3,3,3), which corresponds to errors in positions 0, 3 and 4.

It follows that even a maximum-likelihood hard-decision decoder will fail to reconstruct the transmitted codeword c, since there exists another codeword $(3, 3, 3, 3, 3) \in C_5$ (5,2) that is closer to u in the Hamming metric. The list-decoding algorithm of Guruswami-Sudan (V. Guruswami, M. Sudan, op. cit.) will fail as well, since the number of erroneous positions exceeds the error-correction capability of the algorithm (cf. Theorem 2). The GMD soft-decision decoding algorithm (G. D. Forney, Jr., Generalized minimum distance decoding, IEEE Trans. Inform. Theory, vol. 12, pp. 125–131, April 1966) will also fail to reconstruct c=(1, 2, 3, 4, 0). Since the last three positions in u=(4, 2, 3, 3, 3) are the least reliable, the GMD decoder will perform two decoding trials, attempting to correct u'=(4, 2, 3, 3, $\phi$) and u''=(4, 2, $\phi$, $\phi$, $\phi$), where $\phi$ denotes erasure. However, the decoder will produce $(4, 2, 0, 3, 1) \in C_5$ (5,2) in both trials.

Nevertheless, we now show that the transmitted codeword can, in fact, be reconstructed without resorting to full maximum-likelihood soft-decision decoding. Given the information in the reliability matrix $\Pi$, it is clear that it would be beneficial to weigh each position differently. This can be accomplished by requiring, during the interpolation step, that the polynomial Q(X,Y) passes through different points with different multiplicities. More precisely, we would like to select the interpolation points and their multiplicities so as to reflect the information in $\Pi$ in as much as possible. A simple greedy procedure for this purpose is derived in the next section. This procedure was also illustrated in the Summary part of this specification. For the special case of our example, the procedure produces the following list

| point (x,y) | (1,2) | (0,4) | (2,3) | (3,3) | (4,3) | |
|---|---|---|---|---|---|---|
| multiplicity | 3 | 2 | 2 | 1 | 1 | (12) |

These points and multiplicities are shown to be optimal for the reliability matrix in (11), in a precise sense described in the next section. The minimal (1,1)-weighted degree polynomial that passes through all the points in (12) with the required multiplicities turns out to be $$Q(X, Y) = 1 + X + Y - X^2 - Y^2 - 2X^2Y + Y^2X - Y^3 + X^4 -$$
$$2YX^3 - X^2Y^2 + 2Y^3X$$
$$= (Y - X - 1)(Y - 3X - 4)(1 + Y + 3X + 3X^2 + 3XY)$$

We identify the two solutions $f_1(X)=1+X$ and $f_2(X)=4+3X$ as corresponding to the codewords (1, 2, 3 ,4, 0) and (4, 2, 0, 3, 1), respectively. Referring to the reliability matrix in (11) once again, we see that $$\Pi(1,0)\Pi(2,1)\Pi(3,2)\Pi(4,3)\Pi(0,4) > \Pi(4,0)\Pi(2,1)\Pi(0,2)\Pi(3,3)\Pi(1,4)$$

Thus the transmitted codeword c=(1, 2, 3, 4, 0) is more likely than (4, 2, 0, 3, 1) given the observations; it will therefore be selected as the decoder output.□

Example 1 shows how a soft-decision decoding algorithm for Reed-Solomon codes might work. The "soft" reliability information will enter the decoding process through the choice of interpolation points and their multiplicities. Given a reliability matrix $\Pi$, the key question is how to determine these points. An answer to this question is provided in the next section. In the remainder of this section, we characterize the proposed soft-decoding algorithm for a given choice of interpolation points and their multiplicities.

A convenient way to keep track of the interpolation points and their multiplicities is by means of a multiplicity matrix. A multiplicity matrix is a q×n matrix M with non-negative integer entries $m_{i,j}$. The first step of our decoding algorithm consists of computing the multiplicity matrix M from the reliability matrix $\Pi$ (see Algorithm A of the next section). The second step is the "soft" interpolation step, which may be expressed as follows.

---

Soft interpolation step: Given the point set $D = \{x_1, x_2, ..., x_n\}$ and the multiplicity matrix $M = [m_{ij}]$, compute the nontrivial bivariate polynomial $Q_M(X,Y)$ of minimal (1,k–1)-weighted degree that has a zero of multiplicity at least $m_{ij}$ at the point $(x_j, \alpha_i)$ for every i,j such that $m_{ij} \neq 0$.

---

Note that while the bivariate polynomial $Q_M(X,Y)$ of minimal (1,k–1)-weighted degree is optimal and best selected for use in our method, it is also possible to use a polynomial of other than the least possible (1,k–1)-weighted degree, which polynomial would be sub-optimal. The method will still work, but less efficiently so.

The third step of our algorithm is the factorization step, which is identical to the factorization step of the Sudan algorithm, described in the previous section.

Notice that the soft interpolation step of our algorithm is different from the weighted polynomial reconstruction problem considered in V. Guruswami, M. Sudan, op. cit. Guruswami and Sudan take a fixed set $P=\{(x_1,y_1),(x_2,y_2), \ldots, (x_n,y_n)\}$ of n points in $\mathbb{F}_q \times \mathbb{F}_q$ and seek a polynomial $Q_P(X,Y)$ that passes through these n points with prescribed multiplicities $m_1, m_2, \ldots, m_n$. In contrast, in our algorithm, there is no constraint on the number of nonzero entries in the multiplicity matrix M and/or on their distribution. In fact, in most cases of interest, the polynomial $Q_M(X,Y)$ computed in the soft interpolation step will pass through much more than n points with nonzero multiplicity.

It is easy to see from (4) and (5) that the computation of the polynomial $Q_M(X,Y)$ is equivalent to solving a system of linear equations of the type (4). The complexity of this computation depends primarily on the number of equations in the system.

Definition 3. Given a q×n matrix M with non-negative integer entries $m_{i,j}$, we define the cost of M as follows $$C(M) \stackrel{\text{def}}{=} \frac{1}{2} \sum_{i=1}^{q} \sum_{j=1}^{n} m_{i,j}(m_{i,j} + 1)$$

As observed in (4), a given zero of multiplicity m imposes nm(m+1)/2 linear constraints of $Q_M(X,Y)$. Thus $C(M)$ is precisely the total number of linear equations. It follows that the complexity of computing $Q_M(X,Y)$ is governed by the cost of the multiplicity matrix M. As in (5), we can always find a solution $Q_M(X,Y)$ to the soft interpolation task if the $(1,k-1)$-weighted degree $\delta$ is large enough, namely if $$N_{1,k-1}(\delta) > \mathcal{C}(M) \tag{13}$$

so that the number of degrees of freedom is greater than the number of linear constraints. The solution $Q_M(X,Y)$ is said to contain a codeword $c \in \mathcal{C}_q(n,k)$ if the factorization of $Q_M(X,Y)$ contains a factor $Y-f(X)$ such that $c=(f(x_1), f(x_2), \ldots, f(x_n))$. The fundamental question is under which conditions does the polynomial $Q_M(X,Y)$ found in the soft interpolation step contain a given codeword $c \in \mathcal{C}_q(n,k)$.

The answer to this question is given in Theorem 3 below. In order to state this theorem, we need some more notation. First, we define the function $$\Delta_{w_X,w_Y}(v) \stackrel{def}{=} \min\{\delta \in \mathbb{Z} : N_{w_X,w_Y}(\delta) \geq v\} \tag{14}$$

Notice that $\Delta_{1,k-1}(v) \leq \sqrt{2kv}$ in view of (2). Next, given two $q \times n$ matrices A and B over the same field, we define the inner product $$\langle A, B \rangle \stackrel{def}{=} \sum_{i=1}^{q} \sum_{j=1}^{n} a_{i,j} b_{i,j}$$

Finally, it will be convenient to think of the codewords of the Reed-Solomon code $\mathcal{C}_q$ $(n,k)$ as $q \times n$ matrices over the reals. Specifically, any vector $v=(v_1, v_2, \ldots, v_n)$ over $\mathbb{F}_q$ can be represented by the $q \times n$ real-valued matrix $[v]$ defined as follows: $[v]_{i,j}=1$ if $v_j=\alpha_i$, and $[v]_{i,j}=0$ otherwise. Notice that, by construction, the matrix $[v]$ contains precisely one non-zero entry in each column. With this notation, we have the following definition.

Definition 4. The score of a vector $v=(v_1, v_2, \ldots, v_n)$ over $\mathbb{F}_q$ with respect to a given multiplicity matrix M is defined as the inner product $S_M(v) = \langle M, [v] \rangle$.

Consider now Theorem 3:

Theorem 3. For a given multiplicity matrix M, the polynomial $Q_M(X,Y)$ contains a codeword $c \in \mathcal{C}_q(n,k)$ if the score of $c$ is large enough compared to the cost of M, namely if $$S_M(c) > \Delta_{1,k-1}(\mathcal{C}(M)) \tag{15}$$

Consider now the proof of Theorem 3:

Let $c=(c_1, c_2, \ldots, c_n)$ be a codeword of $\mathcal{C}_q(n,k)$, let $D=\{x_1, x_2, \ldots, x_n\}$ be the set of points used in the construction of $\mathcal{C}_q(n,k)$, and let $f(X)$ be the polynomial generating $c$, so that $c_j=f(x_j)$ for $j=1,2,\ldots,c_n$. Given the bivariate polynomial $Q_M(X,Y)$, we define the polynomial $g(X) \in \mathbb{F}_q[X]$ as follows $$g(X) \stackrel{def}{=} Q_M(X, f(X))$$

It would clearly suffice to prove that (15) implies that $g(X)$ is the all-zero polynomial, since then $Q_M(X,Y)$ must be divisible by $Y-f(X)$. To prove that $g(X)=0$, we will show that deg $g(X) \leq \Delta_{1,k-1}(\mathcal{C}(M))$ and yet $g(X)$ has a factor of degree $S_M(c)$. We write $$S_M(c) = \langle M, [c] \rangle = m_1 + m_2 + \ldots + m_n \tag{16}$$

where $m_j$ denotes the entry found in the j-th column of M in the row indexed by $c_j$. Thus the polynomial $Q_M(X,Y)$ passes through the point $(x_j, c_j)$ with multiplicity at least $m_j$, for $j=1, 2, \ldots, n$.

Consider now Lemma 4:

Lemma 4. Suppose that a bivariate polynomial $Q(X,Y)$ passes through a point $(\alpha, \beta)$ in $\mathbb{F}_q \times \mathbb{F}_q$ with multiplicity at least $m$, and let $p(X)$ be any polynomial $\mathbb{F}_q[X]$ such that $p(\alpha)=\beta$. Then the polynomial $Q(X, p(X))$ is divisible by $(X-\alpha)^m$.

This lemma is identical to Lemma 4 of V. Guruswami, M. Sudan, op. cit., and we omit the proof. Since $f(x_j)=c_j$ for all $j=1, 2, \ldots, n$, it follows from Lemma 4 that the polynomial $g(X) = Q(X, f(X))$ is divisible by the product $$(X-x_1)^{m_1}(X-x_2)^{m_2} \ldots (X-x_n)^{m_n}$$

The degree of this product is $S_M(c)$ by (16). Therefore, either deg $g(X) \geq S_M(c)$ or $g(X)=0$. Since deg $f(X) \leq k-1$, the degree of $g(X)=Q_M(X,f(X))$ cannot exceed the $(1,k-1)$-weighted degree of $Q_M(X,Y)$. Yet it follows from (13) and (14) that the $(1,k-1)$-weighted degree of $Q_M(X,Y)$ is precisely $\Delta_{1,k-1}(\mathcal{C}(M))$. Thus if $g(X) \neq 0$ then $S_M(c) \leq$ deg $g(X) \leq \Delta_{1,k-1}(\mathcal{C}(M))$. Hence (15) implies that $g(X)=0$. This completes the proof of Theorem 3.

3. Determination of Interpolation Points

This section deals with the conversion of posterior probabilities derived from the channel output into a choice of interpolation points and their multiplicities. More specifically, given a reliability matrix $\Pi$, as defined in (8), we would like to compute the multiplicity matrix M that serves as the input to the soft interpolation step of our algorithm.

It is clear from Theorem 3 that the multiplicity matrix M should be chosen so as to maximize the score $S_M(c)$ of the transmitted codeword $c \in \mathcal{C}_q(n,k)$ for a given cost $\mathcal{C}(M)$. Let $\mathcal{M}_{q,n}$ denote the set of all $q \times n$ matrices with nonnegative integer entries $m_{i,j}$, and define $$\mathcal{M}(C) \stackrel{def}{=} \left\{ M \in \mathcal{M}_{q,n} : \frac{1}{2} \sum_{i=1}^{q} \sum_{j=1}^{n} m_{i,j}(m_{i,j}+1) = C \right\}$$

Thus $\mathcal{M}(\mathcal{C})$ is the finite set of all matrices in $\mathcal{M}_{q,n}$ whose cost is equal to $\mathcal{C}$, and our problem is that of finding the optimal matrix in $\mathcal{M}(\mathcal{C})$. We shall see that while this problem is apparently intractable for an arbitrary $\mathcal{C}$, for certain specific values of $\mathcal{C}$ the problem has a simple polynomial-time solution. This will suffice for the purposes of this invention.

Next, we elaborate upon what optimality means in our context. As explained above, we would like to choose $M \in \mathcal{M}(\mathcal{C})$ so as to maximize the score of the transmitted codeword $c \in \mathcal{C}_q(n,k)$. However, the transmitted codeword itself is obviously unknown to the decoder; only some stochastic information about c is available through the observation of the channel output $(y_1, y_2, \ldots, y_n) \in \mathcal{Y}^n$ and the knowledge of the channel transition probabilities $\Pr(X=\alpha|Y=y)$. In fact, as far as the decoder is concerned, the transmitted codeword may be thought of as a random vector, which we denote by $X=(X_1, X_2, \ldots, X_n)$. For a given multiplicity matrix M, the score of the transmitted codeword is a function of X given by $S_M(X) = \langle M, [X] \rangle$. Thus $S_M(X)$ is a random variable, and a reasonable optimization criterion is to choose $M \in \mathcal{M}(\mathcal{C})$ so as to maximize the expected value of $S_M(X)$. Specifically, we define the expected score with respect to a probability distribution $P(\cdot)$ on $X$ as follows $$E_P\{S_M(X)\} \stackrel{def}{=} \sum_{x \in \mathbb{N}^n} S_M(x)P(x) = \sum_{x \in \mathbb{F}_q^n} \sum_{j=1}^n M(x_j, j)P(x)$$

where $M(x_j, j)$ denotes the entry found in the j-th column of $M$ in the row indexed $x_j$. It remains to specify $P(\cdot)$. For this purpose, we adopt the product distribution determined by the channel output $(y_1, y_2, \ldots, y_n) \in \mathcal{Y}^n$, namely $$P(x_1, x_2, \ldots, x_n) \stackrel{def}{=} \prod_{j=1}^n Pr(\chi_j = x_j \mid Y_j = y_j) = \prod_{j=1}^n \Pi(x_j, j) \quad (17)$$

where $\Pi$ is the reliability matrix defined in (8). It is easy to see that this would be the a posteriori distribution of $X$ given the channel observations, if the a priori distribution of $X$ were uniform over the space $\mathbb{F}_q^n$. The remainder of this section is concerned with the computation of the matrix $M(\Pi, \mathcal{C})$ defined as follows $$M(\Pi, C) \stackrel{def}{=} \arg\max_{M \in \mathcal{M}(C)} E_P\{S_M(X)\} \quad (18)$$

where the expectation is taken with respect to the probability distribution $P(\cdot)$ in (17). We start with the following lemma, which gives a useful expression for the expected score.

Lemma 5. The expected score with respect to the probability distribution in (17) is equal to the inner product of the multiplicity matrix and the reliability matrix, namely $$E_P\{S_M(X)\} = \langle M, \Pi \rangle \quad (19)$$

Consider now the proof of Lemma 5:

The lemma follows from the fact that if $X$ is distributed according to (17), then the reliability matrix $\Pi$ is precisely the expected value of $[X]$. To see this, consider the random vector $X' = (X_1, X_2, \ldots, X_{n-1})$ obtained by deleting the last component of $X = (X_1, X_2, \ldots, X_n)$. The probability distribution of $X'$ can be obtained by marginalizing (17) with respect to $X_n$. Explicitly, if $x' = (x_1, x_2, \ldots, x_{n-1}) \in \mathbb{F}_q^{n-1}$ then $$Pr(X' = x') =$$

$$\sum_{x_n \in \mathbb{F}_q} P(x_1, x_2, \ldots, x_{n-1}, x_n) = \sum_{x_n \in \mathbb{F}_q} \prod_{j=1}^n \Pi(x_j, j) = \prod_{j=1}^n \Pi(x_j, j)$$

where the last equality follows from the fact that $$\sum_{x_n \in \mathbb{F}_q} \Pi(x_n, n) = 1.$$

This, in particular, implies that $$1 = \sum_{x \in \mathbb{F}_q^{n-1}} Pr(X' = x') = \sum_{x' \in \mathbb{F}_q^{n-1}} \prod_{j=1}^{n-1} \Pi(x_j, j) = \sum_{\substack{x \in \mathbb{F}_q^n \\ x_j = \alpha}} \prod_{\substack{l=1 \\ l \neq j}}^n \Pi(x_l, l) \quad (20)$$

for any $j \in \{1, 2, \ldots, n\}$ and any $\alpha \in \mathbb{F}_q$. The last equality in (20) follows by applying a similar argument to the random vector obtained by deleting the j-th component of $X$. Now consider the q×n matrix $\mathcal{P} = [p_{i,j}]$ which may be thought of as the expected value of $[X]$ with respect to the distribution $P(\cdot)$ in (17). Specifically, we define $\mathcal{P}$ as follows $$\mathcal{P} \stackrel{def}{=} \sum_{x \in \mathbb{F}_q^n} [x]P(x) \quad (21)$$

Since $[x]_{i,j} = 1$ if $x_i = \alpha_i$, and $[x]_{i,j} = 1$ otherwise, the entry found in row i and column j of the matrix $\mathcal{P}$ is given by $$p_{i,j} = \sum_{\substack{x \in \mathbb{F}_q^n \\ x_j = \alpha_i}} P(x) = \sum_{\substack{x \in \mathbb{F}_q^n \\ x_j = \alpha_i}} \prod_{l=1}^n \Pi(x_l, l) = \Pi(\alpha_i, j) \sum_{\substack{x \in \mathbb{F}_q^n \\ x_j = \alpha_i}} \prod_{\substack{l=1 \\ l \neq j}}^n \Pi(x_l, l) \quad (22)$$

The summation on the right-hand side of (22) evaluates to 1 by (20), which implies that $p_{i,j=\Pi(\alpha_i,j)} = \pi_{i,j}$ for all $i \in \{1, 2, \ldots, q\}$ and all $j \in \{1, 2, \ldots, n\}$. Therefore $\mathcal{P} = \Pi$. The lemma can be now easily proved by interchanging expectation with inner product $E_P\{S_M(X)\} = E_P\{\langle M, [X] \rangle\} = \langle M, E_P\{[X]\} \rangle = \langle M, \Pi \rangle$. More explicitly, we have $$E_P\{S_M(X)\} = \sum_{x \in \mathbb{F}_q^n} \langle M, [x] \rangle P(x) = \sum_{x \in \mathbb{F}_q^n} \langle M, [x]P(x) \rangle$$

$$= \left\langle M, \sum_{x \in \mathbb{F}_q^n} [x]P(x) \right\rangle = \langle M, \Pi \rangle$$

where the first two equalities follows from the linearity of the inner product, while the last equality follows from the definition of $\mathcal{P} = \Pi$ in (21). This completes the proof of Lemma 5.

We will construct $M(\Pi, \mathcal{C})$ iteratively, starting with the all-zero matrix and increasing one of the entries in the matrix at each iteration. Referring to Lemma 5, we see that increasing $_{i,j}$ from 0 to 1 increases the expected score by $\pi_{i,j}$ while increasing the cost by 1. If we require that $Q_M(X,Y)$ passes through the same point again—that is, increase $m_{i,j}$ from 1 to 2—then the expected score again grows by $\pi_{i,j}$, but now we have to "pay" two additional linear constraints. In general, increasing $m_{i,j}$ from a to a+1 always increases the expected score by $\pi_{i,j}$ while introducing a+1 additional constraints of type (4).

Example 2. Returning to Example 1 of the previous section, consider the code $\mathbb{C}_5(5,2)$ given by (10) and the reliability matrix $\Pi$ in (11). Suppose we restrict the cost of the multiplicity matrix to 14, that is, we wish to find $$M(\Pi, 14) = \arg\max_{M \in Q_{(14)}} \langle M, \Pi \rangle$$

We construct a multiplicity matrix M by a greedy iterative process, starting with the 5×5 all-zero matrix, and requiring at each iteration that the newly chosen interpolation point maximizes the increase in the expected score normalized by the number of additional linear constraints (the increase in cost). This process is explained in detail in the Summary part of this specification.

TABLE 1

Iterative construction of a multiplicity matrix

| iteration | interpolation point (i,j) | increase in score | increase in cost | d score d cost | total cost | expected score |
|---|---|---|---|---|---|---|
| 1 | (1,2) | 0.99 | 1 | 0.990 | 1 | 0.99 |
| 2 | (0,4) | 0.90 | 1 | 0.900 | 2 | 1.89 |
| 3 | (2,3) | 0.61 | 1 | 0.610 | 3 | 2.50 |
| 4 | (1,2) | 0.99 | 2 | 0.495 | 5 | 3.49 |
| 5 | (0,4) | 0.90 | 2 | 0.450 | 7 | 4.39 |
| 6 | (3,3) | 0.44 | 1 | 0.440 | 8 | 4.83 |
| 7 | (4,3) | 0.40 | 1 | 0.400 | 9 | 5.23 |
| 8 | (1,2) | 0.99 | 3 | 0.330 | 12 | 6.22 |
| 9 | (2,3) | 0.61 | 2 | 0.305 | 14 | 6.83 |

Table 1 shows the sequence of chosen interpolation points. Observe that the column that contains the ratio of the increase in the expected score to the increase in cost is strictly decreasing. The resulting multiplicity matrix M is described in equation (12) of Example 1 and in the Summary part of this specification. It can be verified by exhaustive search that $\max_{M \in Q(14)} <M,\Pi> = 6.83$, so $M = M(\Pi,14)$. Notice that $N_{1,1}(3)=10$ while $N_{1,1}(4)=15$ by Lemma 1, so that $\Delta_{1,1}(14)=4$. Thus the expected score exceeds the minimum score required for successful decoding (cf. Theorem 3) by a factor of about 1.7. This gives a high level of confidence that the actual score of the transmitted codeword will also exceed $\Delta_{1,k-1}(14)=4$. Indeed, the score of $c=(1,2,3,4,0) \in C_5(5,2)$ with respect to M is $S_M(c)=5$. □

The greedy iterative procedure used in Example 2 turned out to be optimal for that case. We formalize this procedure as Algorithm A:

Algorithm A

Input: Reliability matrix $\Pi$ and a positive integer s, indicating the total number of interpolation points.

Output: Multiplicity matrix M.

Initialization step: Set $\Pi^* \leftarrow \Pi$ and $M \leftarrow$ all-zero matrix.

Iteration step: Find the position (i,j) of the largest element $\pi^*_{i,j}$ in $\Pi^*$, and set $$\pi^*_{i,j} \leftarrow \frac{\pi_{i,j}}{m_{i,j}+2}$$

$$m_{i,j} \leftarrow m_{i,j} + 1$$

$$s \leftarrow s - 1$$

Control step: If s=0, return M; otherwise go the iteration step.

Let $\mathcal{M}(\Pi,s)$ denote the multiplicity matrix produced by Algorithm A for a given reliability matrix $\Pi$ and a given number of interpolation points s (counted with multiplicities). The following theorem shows that this matrix is optimal.

Theorem 6. The matrix $\mathcal{M}(\Pi,s)$ maximizes the expected score among all matrices in $\mathcal{M}_{q,n}$ with the same cost. That is, if $\mathcal{C}$ is the cost of $\mathcal{M}(\Pi,s)$, then $$\mathcal{M}(\Pi,s) = \operatorname{argmax}_{M \in Q(C)} <M,\Pi>$$

Consider now the proof from Theorem 6:

With each position (i,j) in the reliability matrix $\Pi$, we associate an infinite sequence of rectangles $\mathcal{B}_{i,j,1}, \mathcal{B}_{i,j,2}, \ldots$ indexed by the positive integers. Let $\mathcal{B}$ denote the set of all such rectangles. For each rectangle $\mathcal{B}_{i,j,l} \in \mathcal{B}$, we define $\operatorname{length}(\mathcal{B}_{i,j,l})=1$, and $\operatorname{height}(\mathcal{B}_{i,j,l})=\pi_{i,j}/l$, and $\operatorname{area}(\mathcal{B}_{i,j,l})=\operatorname{length}(\mathcal{B}_{i,j,l}) \cdot \operatorname{height}(\mathcal{B}_{i,j,l})=\pi_{i,j}$. For a multiplicity matrix $M \in \mathcal{M}_{q,n}$, we define the corresponding set of rectangles S(M) as $$S(M) = \{(\mathcal{B})_{i,j,l} : 1 \le i \le q, 1 \le j \le n, \text{ and } 1 \le l \le m_{i,j}\} \quad (23)$$

Observe that (23) establishes a one-to-one correspondence between the set of all q×n multiplicity matrices and the set of all finite subsets $\mathcal{B}$. Also notice that the number of rectangles in S(M) is $$\sum_{i=1}^{q} \sum_{j=1}^{n} m_{i,j},$$

which is precisely the total number of interpolation points imposed by the multiplicity matrix M (counted with multiplicities). Furthermore $$\mathcal{C}(M) = \sum_{\substack{i=1 \\ j=1}}^{q,n} \frac{m_{i,j}(m_{i,j}+1)}{2} = \sum_{\substack{i=1 \\ j=1}}^{q,n} \sum_{l=1}^{m_{i,j}} l =$$

$$\sum_{\substack{i=1 \\ j=1}}^{q,n} \sum_{l=1}^{m_{i,j}} \operatorname{length}(\mathcal{B}_{i,j,l}) = \sum_{\mathcal{B} \in S(M)} \operatorname{length}(\mathcal{B})$$

$$\langle M, \Pi \rangle = \sum_{\substack{i=1 \\ j=1}}^{q,n} m_{i,j} \cdot \pi_{i,j} = \sum_{\substack{i=1 \\ j=1}}^{q,n} \sum_{l=1}^{m_{ij}} \pi_{i,j} =$$

$$\sum_{\substack{i=1 \\ j=1}}^{q,n} \sum_{l=1}^{m_{i,j}} \operatorname{area}(\mathcal{B}_{i,j,l}) = \sum_{\mathcal{B} \in S(M)} \operatorname{area}(\mathcal{B})$$

Thus the cost of M is the total length of all the rectangles in S(M) and the expected score $\mathcal{M}(\Pi,s)$ is the total area of all the rectangles in S(M). It is intuitively clear that to maximize the total area for a given total length, one has to choose the highest rectangles. This is precisely what Algorithm A does: the algorithm constructs the matrix $\mathcal{M}(\Pi,s)$ that corresponds to the set of s highest rectangles in $\mathcal{B}$. It is now obvious that if the s highest rectangles in $\mathcal{B}$ have total length $\mathcal{C}$ then no collection of rectangles of total length at most $\mathcal{C}$ can have a larger total area. This completes the proof of Theorem 6.

Although Algorithm A produces an optimal multiplicity matrix $\mathcal{M}(\Pi,s)$ for an arbitrary number of interpolation points s, it cannot be used to solve the optimization problem (18) for an arbitrary value of the cost $\mathcal{C}$. The algorithm computes a solution to (18) only for those costs that are expressible as the total length of the s highest rectangles in $\mathcal{B}$ for some s. In other words, if $M(\Pi,1), M(\Pi,2), M(\Pi,3), \ldots$ is the infinite sequence of matrices defined by (18) for $\mathcal{C}=1,2,3,\ldots$, then $\mathcal{M}(\Pi,1), \mathcal{M}(\Pi,2), \mathcal{M}(\Pi,3), \ldots$ is a subsequence of this sequence. On the other hand, this is the best one could hope for. It is easy to see from the proof of Theorem 6 that solving (18) for an arbitrary Π and $\mathcal{C}$ is equivalent to solving the knapsack problem, which is a well-known NP-complete problem (see M. R. Garey, D. S. Johnson, *Computers and Intractability: A Guide to the Theory of NP-Completeness*, Freeman, 1979, p. 247).

Observe that any nonzero entry in Π will eventually (for $s\to\infty$) give rise to a nonzero entry in $\mathcal{M}(\Pi,s)$. As the number of interpolation points increases, we can more and more closely match a given reliability matrix Π. In the limit, as the number s of interpolation points (and, hence, the complexity of the interpolation and factorization tasks) approaches infinity, the proposed soft-decision decoding algorithm reaches its limiting performance. The asymptotic performance analysis for $s\to\infty$ (or, equivalently, for $\mathcal{C}\to\infty$) is carried out in Appendix A to this specification. We emphasize that one can approach this limiting performance arbitrarily closely by letting the number s of interpolation points be large but bounded. In this case, the complexity of our soft-decoding algorithm stays bounded by a polynomial in the length of the code.

4. Algebraic Soft-decision Decoding of BCH Codes

Bose-Chaudhuri-Hocquenghem (BCH) codes are easily described as subfield subcodes of Reed-Solomon codes. Let $C_q(n,k)$ be a Reed-Solomon code over $F_q$, as defined in (1), where $q=p^m$ for a prime p and an integer $m \geq 1$. Let $q'=p^{m'}$, where m' is a divisor of m. Then $F_{q'}$ is subfiled $F_q$. A linear BCH code $C'_{q'}(n,k')$ over $F_{q'}$ is given by $$C'_{q'}(n,k') \stackrel{def}{=} C_q(n,k) \cap F_{q'}^n \quad (24)$$

It is easy to see from (24) that the dimension of $C'_{q'}(n,k')$ is $k' \leq k$, and its minimum Hamming distance is $d' \geq n-k+1$. We call $d=n-k+1$ the designed distance (c.f. F. J. MacWilliams, N. J. A. Sloane, *The Theory of Error Correcting Codes*, New York: North-Holland, 1977, p. 202) of $C'_{q'}(n,k')$. Throughout this section, we assume that $q=2^m$ and $q'=2$. Generalization to non-binary BCH codes (arbitrary prime powers q and q') is straightforward.

For binary BCH codes, the channel input alphabet is $\mathcal{X}=\{0,1\}$ and the channel is characterized by two transition-probability functions $f(y|0)$ and $f(y|1)$, as defined in (7). For $y \in \mathcal{Y}$, let $$\mu(y) \stackrel{def}{=} \frac{f(y|0)}{f(y|0)+f(y|1)} = Pr(\chi=0|\Upsilon=y) \quad (25)$$

and suppose that the vector $y=(y_1,y_2,\ldots,y_n) \in \mathcal{Y}^n$ is observed at the channel output. The corresponding reliability matrix is then the 2×n matrix given by $$\Pi(y) \stackrel{def}{=} \begin{bmatrix} \mu(y_1) & \mu(y_2) & \cdots & \mu(y_n) \\ 1-\mu(y_1) & 1-\mu(y_2) & \cdots & 1-\mu(y_n) \end{bmatrix} \quad (26)$$

The key to algebraic soft-decision decoding of BCH codes is the following simple idea. The 2×n matrix in (26) can be formally extended to a q×n reliability matrix Π by appending for each $\alpha \in F_q \backslash F_2$ an all-zero row to Π(y). The algebraic soft-decision decoder, presented with the q×n matrix Π, then proceeds exactly as before, following the three computation steps described in Sections 2 and 3. Note that the multiplicity matrix M computed in the first step (using Algorithm A) is essentially a 2×n matrix, since a zero entry in Π always leads to a zero entry in M. The soft interpolation step thus produces a polynomial $Q_M(X,Y)$ with coefficients in $F_q$ that has zeros (of prescribed multiplicities) at points of type $(x_j,\alpha)$, where $x_j \in F_q$ and $\alpha \in F_2$. Finally, during the factorization step, we are only interested in those factors of type $Y-f(X)$ for which deg $f(X)<k$ and $f(X) \in F_q[X]$ evaluates to $F_2$ for all $x_j$ in the defining point-set D.

It follows directly from the discussion above that all the results derived in the preceding three sections for Reed-Solomon codes extend to the case of BCH codes. In particular, Theorem 3 holds without change. In the remainder of this section, we analyze the performance of binary BCH codes under algebraic soft-decision decoding for two channels of particular interest: the binary-input AWGN channel and the binary symmetric channel.

On additive white Gaussian noise channel with BPSK modulation $0 \to 1$ and $1 \to -1$, the function $\mu(y)$ in (25) takes the form $$\mu(y) = \frac{e^{y/\sigma^2}}{e^{y/\sigma^2}+e^{-y/\sigma^2}} = \frac{e^{2y/\sigma^2}}{1+e^{2y/\sigma^2}} \quad (27)$$

where σ is the noise variance. The asymptotic condition for successful decoding can be therefore stated as follows.

Theorem 7. Suppose that a codeword of an (n,k',d') binary BCH code $C'_2(n,k')$ is transmitted over a BPSK-modulated AWGN channel, and the vector $(y_1,y_2,\ldots,y_n) \in \mathbb{R}^n$ is observed at the channel output. Then the algebraic soft-decision decoder produces a list that contains a codeword $c=(c_1,c_2,\ldots,c_n) \in C'_2(n,k')$ provided $$\frac{\sum_{j=1}^{n} \frac{e^{2y_j c_j/\sigma}}{1+e^{2y_j/\sigma}}}{\sqrt{\sum_{j=1}^{n} \frac{1+e^{4y_j/\sigma}}{(1+e^{2y_j/\sigma})^2}}} \geq \sqrt{n-d+1} + o(1)$$

where σ is the noise variance, d is the designed distance of $C'_2(n,k')$, and o(1) denotes a function of the total number s of interpolation points that tends to zero as $s \to \infty$.

We next consider a binary symmetric channel (BSC) with crossover probability ε. For this channel, $\mathcal{Y}=\{0,1\}$ and the function $\mu(y)$ in (25) is given by $$\mu(y) = f(y|0) = \begin{cases} 1-\varepsilon & y=0 \\ \varepsilon & y=1 \end{cases}$$

Suppose that a vector $y=(y_1,y_2,\ldots,y_n) \in \{0,1\}^n$ is observed at the output of the BSC. Then the corresponding 2×n reliability matrix from (26) is given by $$\Pi(y) = \begin{bmatrix} 1 - y_1 + \varepsilon(2y_1 - 1) & 1 - y_2 + \varepsilon(2y_2 - 1) & \cdots & 1 - y_n + \varepsilon(2y_n - 1) \\ y_1 + \varepsilon(2y_1 - 1) & y_2 + \varepsilon(2y_2 - 1) & \cdots & y_n + \varepsilon(2y_n - 1) \end{bmatrix} \quad (28)$$

For this matrix, we have $\langle \Pi(y), \Pi(y) \rangle = n - 2n\epsilon(1-\epsilon)$ and $\langle \Pi(y), [c] \rangle = \epsilon t + (1-\epsilon)(n-t)$, where t is the Hamming distance between y and c. Thus for a binary symmetric channel the asymptotic condition for successful decoding is as follows.

Theorem 8. Suppose that a codeword of an (n,k',d') binary BCH code $C'_2(n,k')$ is transmitted over a BSC with crossover probability e and the vector $(y_1, y_2, \ldots, y_n) \in \{0,1\}^n$ ends observed at the channel output. Then the algebraic soft-decision decoder produces a list that contains a codeword $C = (c_1, c_2, \ldots, c_n) \in C'_2(n,k')$ provided $$\frac{t}{n} \leq \frac{(1-\varepsilon) - \sqrt{\left(1 - \frac{d-1}{n}\right) - 2\left(1 - \frac{d-1}{n}\right)\varepsilon(1-\varepsilon)}}{(1-\varepsilon) - \varepsilon} + o(1) \quad (29)$$

where t is the Hamming distance between y and c, d is the designed distance of $C'_2(n,k')$, and o(1) is a function of the total number s of interpolation points.

Although the binary symmetric channel does not provide "soft" reliability information in the usual sense, it turns out that the soft-decoding techniques developed in this specification make it possible to decode well beyond the Guruswarni-Sudan bound $\tau \leq 1 - \sqrt{R}$ (see V. Guruswami, M. Sudan, op. cit.).

While this is already evident from Theorem 8, we can do even better, as described in what follows. First, let us rewrite the condition (29) in the following form $$\tau \leq \frac{1 - \varepsilon - \sqrt{R - 2R\varepsilon(1-\varepsilon)}}{1 - 2\varepsilon} \quad (30)$$

where $\_ = t/n$ is the fraction of erroneous positions that can be corrected using our soft-decoding algorithm and $R = k/n = 1 - (d-1)/n$ is the rate of the underlying Reed-Solomon code (notice that this rate is always higher than the rate $R' = k'/n$ of the BCH code). Next, let us consider the following interpretation of Theorem 8: the algebraic soft-decision decoder, when presented with the reliability matrix $\Pi(y)$ in (28) corrects a fraction of errors specified by (30). It is clear from this interpretation that one does not have to use the actual crossover probability of the BSC in setting-up the reliability matrix in (28). Rather, we are interested in the value of $\epsilon \in [0, 0.5]$ that maximizes the right-hand side of (30) for a fixed R. The optimal value of $\epsilon$ is given by $$\varepsilon^* \stackrel{def}{=} \frac{1}{2} - \frac{1}{2}\sqrt{2R - 1} = \frac{1}{2} - \frac{1}{2}\sqrt{1 - 2(d-1)/n} \quad (31)$$

in which case the right-hand side of (30) is equal to $\epsilon^*$. In other words, if upon observing the vector $y \in \{0,1\}^n$ at the output of the BSC, one constructs the matrix $$\Pi*(y) \stackrel{def}{=} \begin{bmatrix} 1 - y_1 + \varepsilon^*(2y_1 - 1) & 1 - y_2 + \varepsilon^*(2y_2 - 1) & \cdots & 1 - y_n + \varepsilon^*(2y_n - 1) \\ y_1 + \varepsilon^*(2y_1 - 1) & y_2 + \varepsilon^*(2y_2 - 1) & \cdots & y_n + \varepsilon^*(2y_n - 1) \end{bmatrix}$$

where $\epsilon^*$ is given by (31), then the algebraic soft-decision decoder, operating on $\Pi^*(y)$ as the reliability matrix, will produce a list of all codewords of $C'_2(n,k')$ at Hamming distance at most $\tau n$ from y, where $$\tau = \frac{1}{2} - \frac{1}{2}\sqrt{2R - 1} = \frac{1}{2} - \frac{1}{2}\sqrt{1 - 2(d-1)/n} \quad (32)$$

We observe that the right-hand side of (32) can be characterized as the (smaller) root of the quadratic equation $\tau(1-\tau) = (d-1)/2n$. Thus we have the following theorem.

Theorem 9. Let $C'_2(n,k')$ be a binary BCH code with designed distance d, let $R = k/n$ be the rate of the underlying Reed-Solomon code, and let $t_{BCH} = (d-1)/2$. Then algebraic soft-decision list decoding of $C'_2(n,k')$ on a binary symmetric channel corrects any fraction of $\tau \leq 0.5$ errors, provided that $\tau$ satisfies the following inequality $$\tau(1 - \tau) \leq \frac{t_{BCH}}{n} = \frac{1 - R}{2} \quad (33)$$

The bound of Theorem 9 makes it possible to directly compare our results with conventional hard-decision decoding (which corrects up to $t_{BCH}$ errors) and with the list-decoding algorithm of Guruswami-Sudan (V. Guruswami, M. Sudan, op. cit.). Note that the Guruswarni-Sudan bound on the fraction of correctable errors can be written as $(1-\tau)^2 \geq R$, whereas (33) can be recast as $$(1-\tau)^2 + \tau^2 \geq R \quad (34)$$

Figure 7:
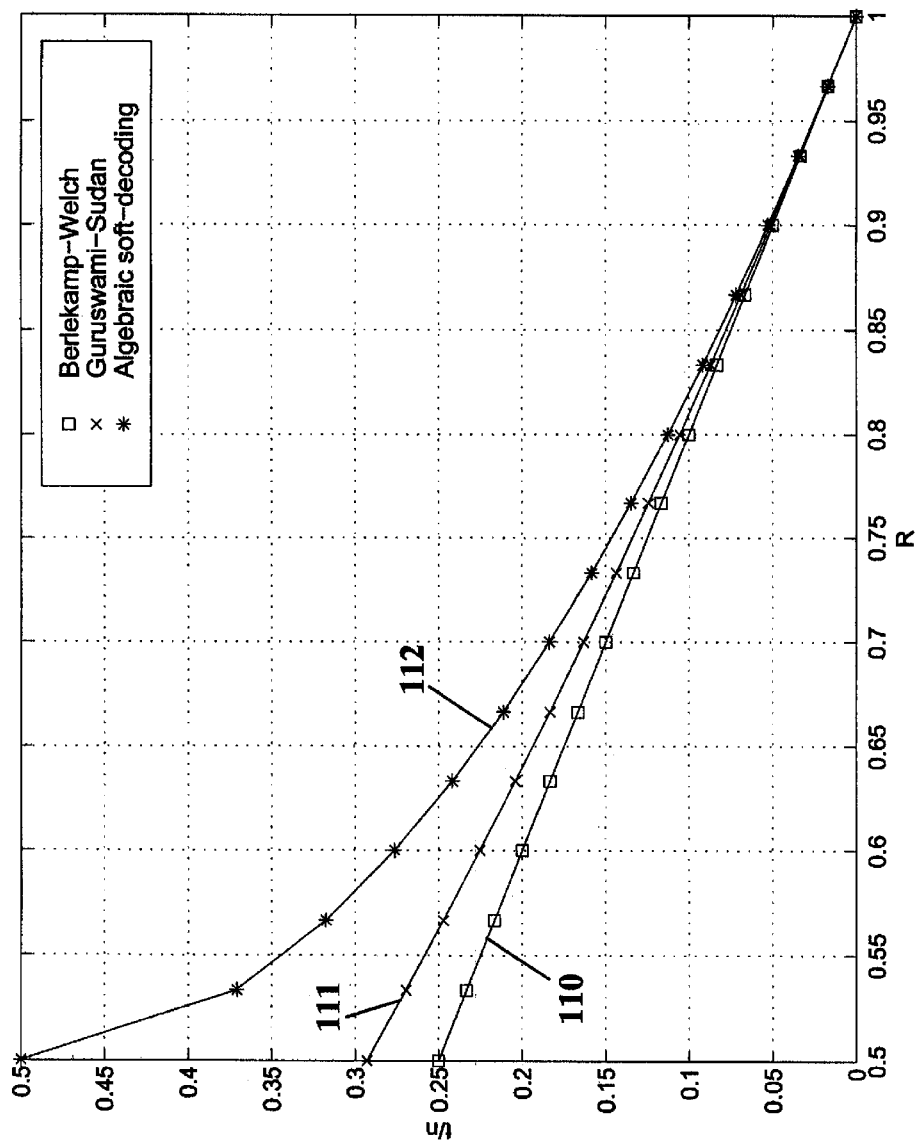
FIG. 7 is a graph showing the fraction t/n of correctable errors using binary BCH codes on a binary symmetric channel, plotted as a function of the rate R of the underlying Reed-Solomon code, for three different algorithms: classical Berlekamp-Welch hard-decision decoding up to half the minimum distance (see L. R. Welch and E. R. Berlekamp, op. cit.) 110, hard-decision list decoding of Guruswami-Sudan (see V. Guruswami, M. Sudan, op. cit.) 111, and the algebraic soft-decision decoding of the present invention 112.

The corresponding curves are plotted in FIG. 7 as a function of R. We observe that for $R \leq 0.5$, the conditions (33) and (34) become vacuous since $\min_{0 \leq \tau \leq 1}\{(1-\tau)^2 + \tau^2\} = 0.5$.

This is consistent with the fact that for $R = k/n \leq 0.5$, the binary BCH code $C'_2(n,k')$ degenerates to the (n,1,n) repetition code, for which list decoding is trivial.

Figure 2:
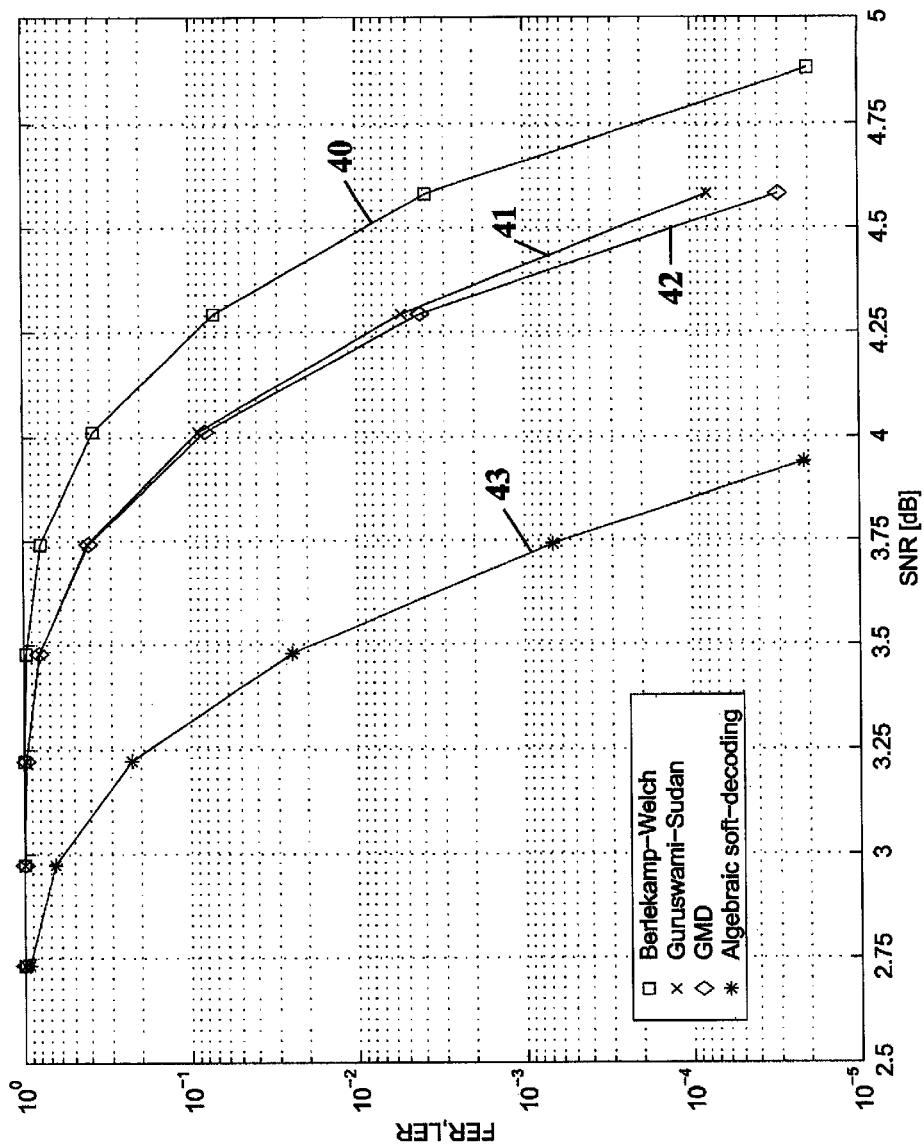
FIG. 2 is a graph showing a comparison for a particular simple concatenated coding scheme, where a RS (256,144, 113) code over $\mathbb{F}_{256}$ is concatenated with a binary parity check code of length 9 so that the coding scheme corresponds to a binary code with rate 1/2, the channel being an additive white Gaussian noise channel while the inner parity check code is in all cases decoded with a maximum a posteriori likelihood decoding algorithm: the different curves 40–43 correspond to the performance achieved by two hard-decision decoding algorithms (decoding up to half the minimum distance 40 and the algorithm by Guruswami and Sudan 41), and two soft-decoding algorithms (Forney's GMD 42 decoding and the algebraic soft-decision decoding algorithm 43 of the present invention taught within this specification).
Figure 3:
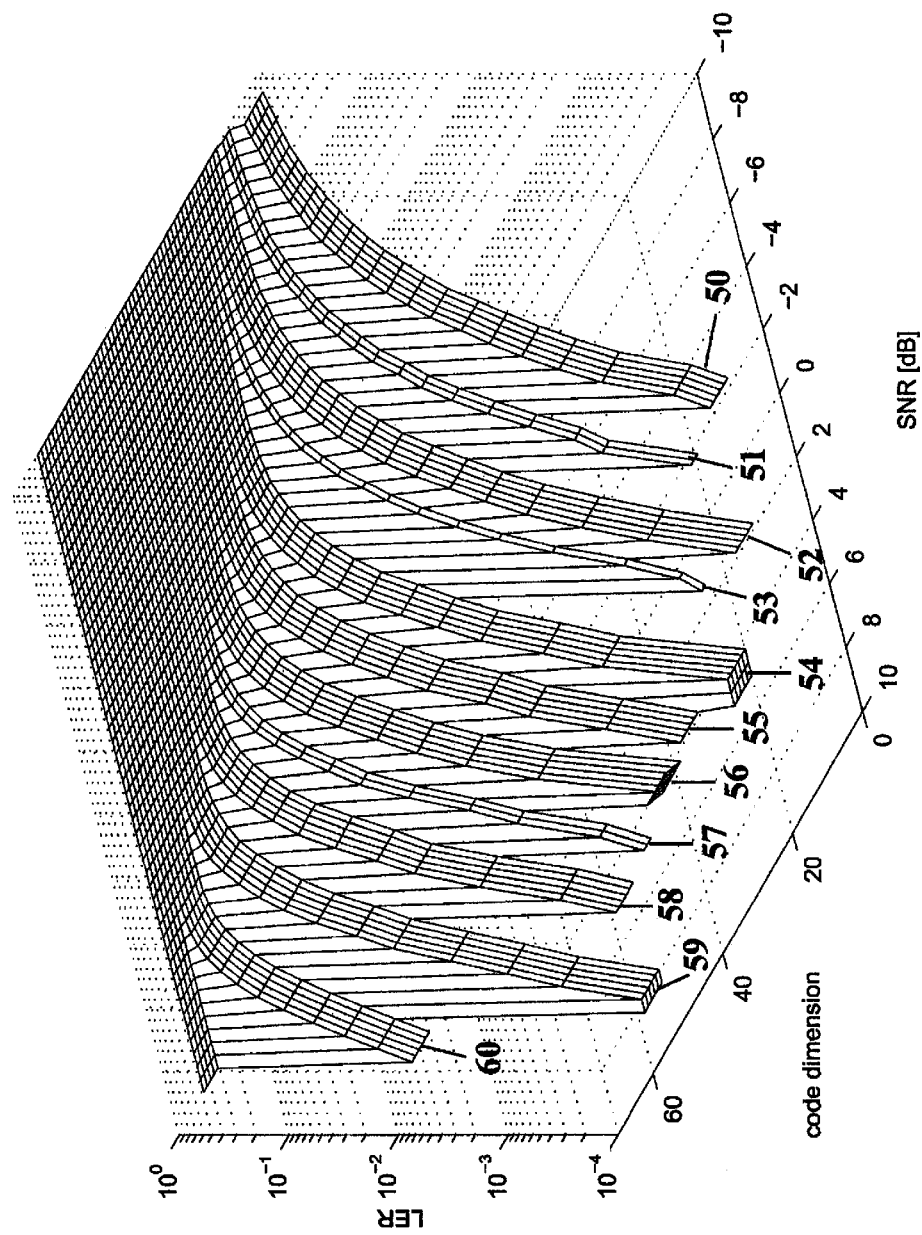
FIG. 3 is a graph showing the performance of binary BCH codes of length 63, on a BPSK-modulated additive white Gaussian noise (AWGN) channel, under the algebraic soft-decision decoding method of the present invention. The plurality of curves 50–60 show the probability that the transmitted codeword is not on the list produced by (the factorization step in) the algebraic soft-decision decoder, for a large number of interpolation points (s→∞). Said probability is plotted versus the SNR and versus the dimension of the corresponding BCH codes.
Figure 4:
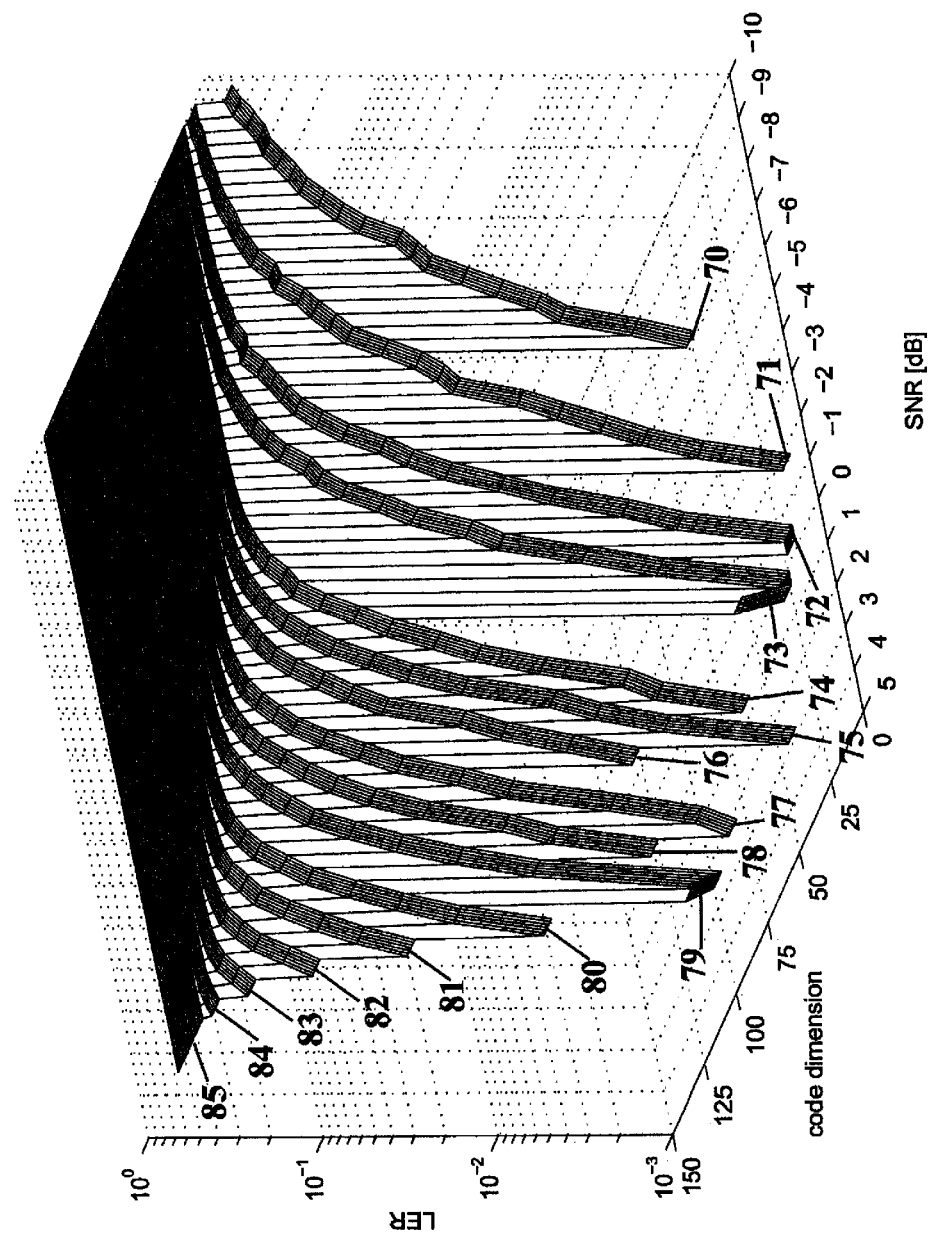
FIG. 4 is another graph, similar to the graph of FIG. 3, showing the performance of binary BCH codes of length 127, on a BPSK-modulated AWGN channel, under the algebraic soft-decision decoding method of the present invention. The plurality of curves 70–85 show the probability that the transmitted codeword is not on the list produced by (the factorization step in) the algebraic soft-decision decoder, for a large number of interpolation points (s→∞). Said probability is plotted versus the SNR and versus the dimension of the corresponding BCH codes.
Figure 5:
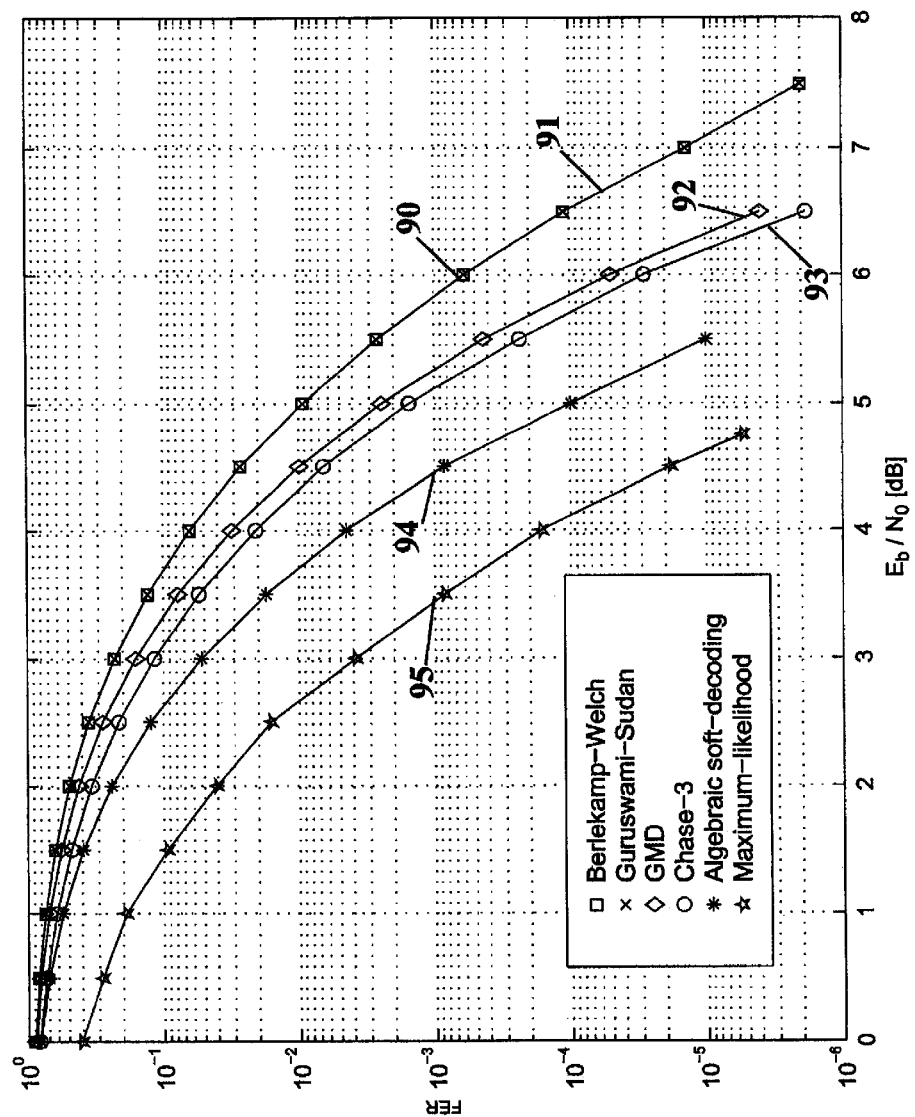
FIG. 5 is a graph showing the performance of the (63, 36,11) binary BCH code on a BPSK-modulated AWGN channel, under different decoding methods. The six different curves correspond to the performance achieved by six different decoding methods: classical Berlekamp-Welch hard-decision decoding up to half the minimum distance (see L. R. Welch, E. R. Berlekamp, Error Correction for Algebraic Block Codes, U.S. Pat. No. 4,633,470, issued Dec. 30, 1986) 90 hard-decision list decoding of Guruswami-Sudan (see V. Guruswami, M. Sudan, op. cit.) 91, GMD soft-decision decoding (see G. D. Forney, Jr., Generalized minimum distance decoding, IEEE Trans. Inform. Theory, vol. 12, pp. 125–131, 1966) 92, Chase-3 soft-decision decoding algorithm (see D. Chase, A class of algorithms for decoding block codes with channel measurement information, IEEE Trans. Inform. Theory, vol. 18, pp. 170–182, 1972) 93, algebraic soft-decision decoding of the present invention 94, and maximum-likelihood soft-decision decoding 95.
Figure 6:
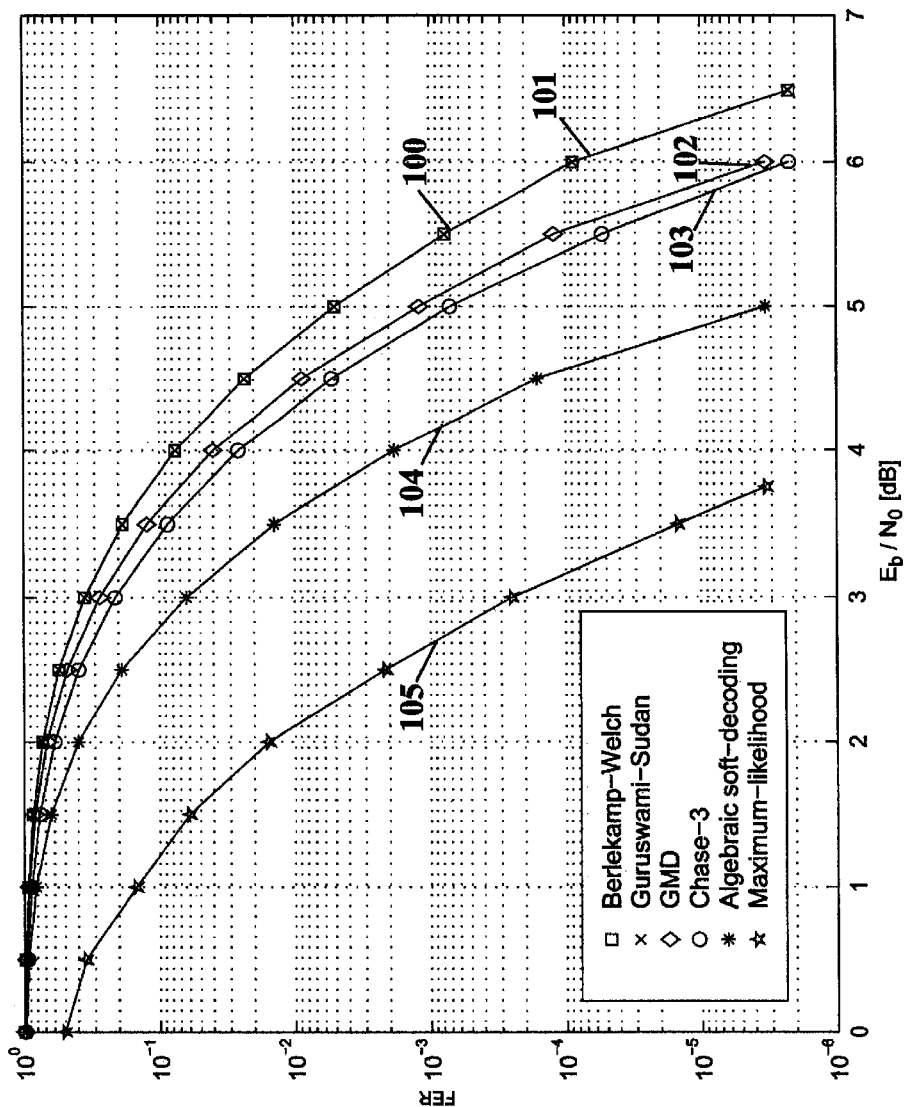
FIG. 6 is another graph, similar to the graph of FIG. 5, showing the performance of the (127,71,19) binary BCH code on a BPSK-modulated AWGN channel, under different decoding methods. The six different curves correspond to the performance achieved by six different decoding methods: classical Berlekamp-Welch hard-decision decoding up to half the minimum distance (see L. R. Welch, E. R. Berlekamp, op. cit.) 100, hard-decision list decoding of Guruswami-Sudan (see V. Guruswami, M. Sudan, op. cit.) 101, GMD soft-decision decoding (see G. D. Forney, Jr., op. cit.) 102, Chase-3 soft-decision decoding algorithm (see D. Chase, op. cit.) 103, algebraic soft-decision decoding of the present invention 104, and maximum-likelihood soft-decision decoding 105.
Figure 8:
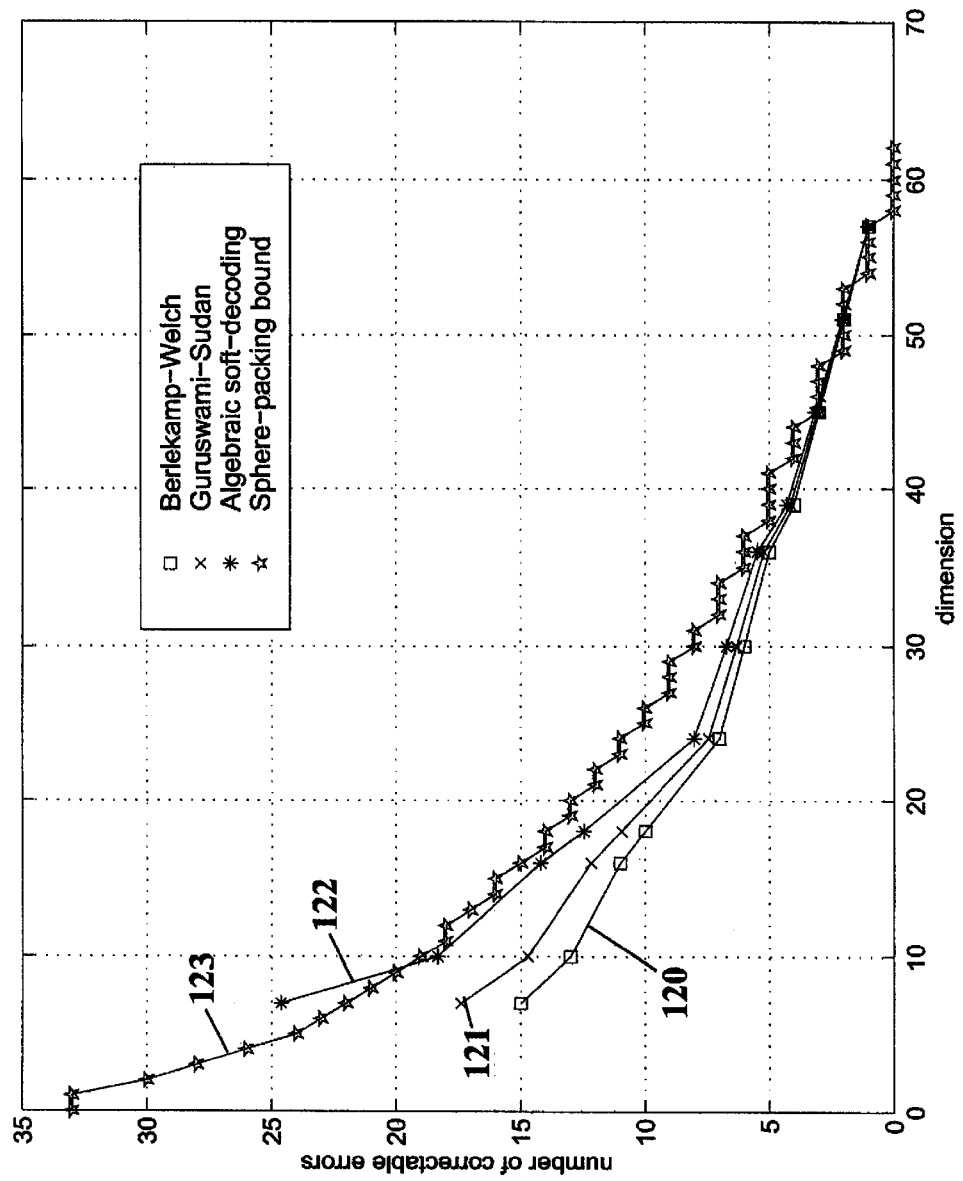
FIG. 8 is a graph showing the number t of corretable errors using binary BCH codes of length 63 on a binary symmetric channel, plotted as a function of the dimension of said BCH codes, for three different algorithms: classical Berlekamp-Welch hard-decision decoding up to half the minimum distance (see L. R. Welch, E. R. Berlekamp, op. cit.) 120, hard-decision list decoding of Guruswami-Sudan (see V. Guruswami, M. Sudan, op. cit.) 121, and the algebraic soft-decision decoding of the present invention 122. Also plotted in FIG. 8, for comparison, is the well-known sphere-packing bound on t 123.
Figure 9:
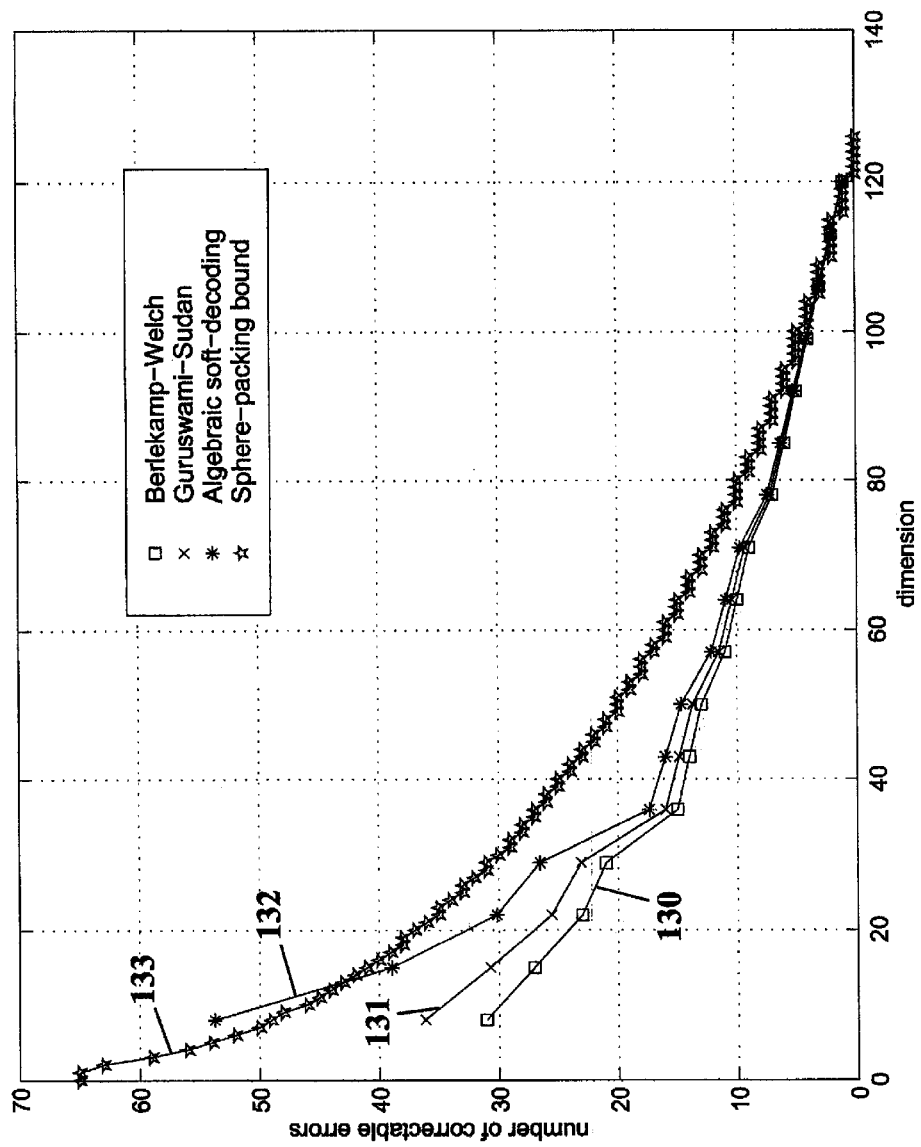
FIG. 9 is another graph, similar to the graph of FIG. 8, showing the number t of correctable errors using binary BCH codes of length 127 on a binary symmetric channel, plotted as a function of the dimension of said BCH codes, for three different algorithms: classical Berlekamp-Welch hard-decision decoding up to half the minimum distance (see L. R. Welch, E. R. Berlekamp, op. cit.) 130, hard-decision list decoding of Guruswami-Sudan (see V. Guruswami, M. Sudan, op. cit.) 131, and the algebraic soft-decision decoding of the present invention 132. Also plotted in FIG. 9, for comparison, is the well-known sphere-bound on 133.

For any specific length n, one can deduce the rate $R' = k'/n$ of the binary BCH code from the rate $R = k/n$ of the underlying Reed-Solomon code, which makes it possible to re-plot the curves in FIG. 2 as a function of the dimension k' of $C'_2(n,k')$. T) his is done in FIGS. 8 and 9 for binary BCH codes of length 63 and of length 127, respectively. Also plotted in FIGS. 8 and 9 for comparison, is the sphere-packing bound $$\log_2 \sum_{i=0}^{t} \binom{n}{i} \leq n - k'.$$

5. Soft-decision Decoding of Algebraic-geometric Codes

The decoding algorithms of Sudan (V. Guruswami, M. Sudan, op. cit.; and M. Sudan, op. cit.) can be adapted to the general class of algebraic-geometric codes. This was shown by Shokrollahi and Wasserman (M. A. Shokrollahi, H. Wasserman, List decoding of algebraic-geometric codes, IEE Trans. Info. Theory, vol. 45, pp. 432–437, 1999) and by Guruswami and Sudan (V. Guruswami, M. Sudan, op. cit.). The essential ideas of our soft-decision decoding algorithm carry over to algebraic-geometric codes in a similar way. In this section, we give a short description of algebraic-geometric codes and how soft-decision decoding can be applied to them.

5.1. Algebraic-geometric Codes

For simplicity we restrict our attention to codes from plane curves. Let $\overline{\mathbb{F}}_q$ denote the algebraic closure $\mathbb{F}_q$. Given an irreducible polynomial $F(X,Z) \in \mathbb{F}_q[X,Z]$, a plane irreducible curve $X: F(X,Z)=0$ is defined as follows $$X \stackrel{def}{=} \{(x,z) \in \overline{\mathbb{F}}_q : \mathcal{F}(x,z) = 0\}$$

We let $X_q = X \cap \mathbb{F}_q^2$ denote the restriction of X to $\mathbb{F}_q$. We will be interested in the behavior of rational functions on the curve X. Let $P=(x,z) \in X$ be an arbitrary point on X, and let $f(X,Z)=g(X,Z)/h(X,Z)$ be a rational function, where g, $h \in \mathbb{F}_q[X,Z]$. We write $f(P)$ to denote the evaluation of $f(X,Z)$ at P, namely $f(P)=f(x,z)$. We will be interested only in the vies of $f$ at the points on the curve X. Thus, it is useful to think of $f$ as a mapping $f: X_q \to \overline{\mathbb{F}}_q \cup \{\infty\}$. Restricting to $X_q$, it is obvious that $f: X_q \to \mathbb{F}_q \cup \{\infty\}$.

The points $P \in X$ where $f(P)=0$ are called the zeros of $f$, and the points $P \in X$ where $f(P)=\infty$ are called the poles of $f$. See T. Høholdt, J. H. van Lint, R. Pellikaan, Algebraic geometry codes, Chapter 10, in V. S. Pless, W. C. Huffman (Editors), *Handbook of Coding Theory*, Amsterdam: Elsevier, 1998, p. 880 and H. Stichtenoth, *Algebraic Function Fields and Codes*, Berlin: Springer-Verlag, 1993, p. 7, for the definition of a multiplicity of a zero (pole) of $f$. The following fundamental result is well known.

Lemma 10. For any rational function $f \neq 0$, the number of zeros of $f$ in $\overline{\mathbb{F}}_q$ equals the number of poles of $f$ in $\overline{\mathbb{F}}_q$, counted with proper multiplicities including points at infinity.

Let P be any point on X. Given a rational function of $f$ on X, a number of $v_P(f)$ called the valuation of $f$ at P can be defined as follows:

$$v_P(f) \stackrel{def}{=} \begin{cases} \infty & f = 0 \\ m & f \text{ has a zero of multiplicity } m \text{ but not } m+1 \text{ at } P \\ -m & f \text{ has a pole of multiplicity } m \text{ but not } m+1 \text{ at } P \end{cases}$$

Next, we fix a point $Q \in X_q$ and define $L(mQ)$ as the set of rational functions on X that may contain a pole only at $Q$ and the multiplicity of this pole is at most m. It is known that $L(mQ)$ is an $\mathbb{F}_q$-linear space, of dimension dim $L(mQ)$. Let $$g \stackrel{def}{=} \max_{m \geq 0} \{m - dim\, L(mQ)\} + 1 \tag{35}$$

The number g is called the genus of X. It is a consequence of the Riemann-Roch theorem that g is well-defined (see H. Stichtenoth, Algebraic Function Fields and Codes, Berlin: Springer-Verlag, 1993). That is, g is finite and independent of the choice of $Q \in X_q$.

Let $D=\{P_1, P_2, \ldots P_n\}$ be a set of n distinct points in $X_q$, such that $Q \notin D$. We define an algebraic-geometric (AG) code $\mathbb{C}_X(m,Q)$, in a manner analogous to (1), as follows $$\mathbb{C}_X(m,Q) \stackrel{def}{=} \{(f(P_1), f(P_2), \cdots, f(P_n)) : f \in L(m,Q)\} \tag{36}$$

It follows trivially from (36) that $\mathbb{C}_X(m,Q)$ has length n. For $m < n$, the dimension of $\mathbb{C}_X(m,Q)$ is $k = \dim L(mQ)$, and it follows directly from the definition of genus of X in (35) that $k \geq m-g+1$. Moreover, it is well known that $k=m-g+1$ if $2g-1 \leq m < n$. In most cases of interest, the genus g is small, and therefore the latter condition is not a significant restriction on the rate of the resulting code. Thus, we shall henceforth assume that $2g-1 \leq m < n$ always holds. The minimum distance of $\mathbb{C}_X(m,Q)$ satisfies $d \geq n-m$. This follows immediately from the fact that since $f \in L(m,Q)$ has at most m poles, it cannot have more than m zeros in D by Lemma 10.

5.2. Algebraic Soft-decision Decoding

Following the work of Shokrollahi-Wasserman (M. A. Shokrollahi, H. Wasserman, op. cit.) and Guruswami-Sudan (V. Guruswami, M. Sudan, op. cit.), we now show how every step in the decoding of Reed-Solomon codes has a clear analogue in the case of algebraic-geometric codes. Note that the first step of our algorithm remains unchanged: given a q×n reliability matrix Π, we compute the corresponding multiplicity matrix $M = \mathcal{M}(\Pi,s)$ using Algorithm A, as described in Section 3.

In order to describe the soft interpolation step of our algorithm, we need more notation. In particular, we need to extend the notions of interpolation polynomial, weighted degree and zero of multiplicity m of the interpolation polynomial to the case of algebraic-geometric codes. First, we define a basis for the space $L(mQ)$. Since $\dim L(mQ) = m-g+1$, there must exist numbers $o_1, o_2, \ldots, o_g$ such that $\dim L(o_i Q) = \dim L((o_i - 1)Q)$. For a given point $Q$, these numbers $o_1, o_2, \ldots, o_g$ are called the gaps at $Q$. For $i=0, 1, \ldots, m$, we fix an arbitrary rational function $\phi_i$ in $L(iQ) \setminus L((i-1)Q)$ if such a function exists, which happens if and only if $i \notin \{o_1, o_2, \ldots, o_g\}$. For $i \in \{o_1, o_2, \ldots, o_g\}$, we set $\phi_i = 0$ by convention. It is obvious by construction that the (nonzero) functions $\phi_0, \phi_1, \ldots, \phi_m$ are linearly independent over $\mathbb{F}_q$ and span the space $L(mQ)$. We will expand all rational functions in $L(mQ)$ in the basis $\phi_0, \phi_1, \ldots, \phi_m$, namely $$f \in L(mQ) \Leftrightarrow f = f_0\phi_0 + f_1\phi_1 + \ldots + f_m\phi_m \text{ with } f_0, f_1, \ldots, f_m \in \mathbb{F}_q \tag{37}$$

As a convention, we set $f_i = 0$ for $i \in \{o_1, o_2, \ldots, o_g\}$. Next, we consider the ring $KQ$ of rational functions that have poles only at $Q$, which is given by $$K_Q \stackrel{def}{=} \bigcup_{m=0}^{\infty} L(mQ)$$

The interpolation polynomial that one needs to compute at the soft interpolation step turns out to be a polynomial over $K_Q$. Notice that we can write any polynomial $A(Y)$ in $K_Q[Y]$ in the form $$A(Y) = \sum_{i=0}^{\infty} \sum_{j=0}^{\infty} a_{i,j} \phi_i Y^j.$$

The following definition is the counterpart of Definition 1 for algebraic-geometry codes, where the basis $\phi_0, \phi_1, \ldots$ plays the role of the variable X.

5 Definition 5. Let $$A(Y) = \sum_{i=0}^{\infty} \sum_{j=0}^{\infty} a_{i,j} \phi_i Y^j$$

be a polynomial over $K_Q$ and let $w_Q$, $w_Y$ be nonnegative real numbers. The $(w_Q, w_Y)$-weighted $Q$-valuation of $A(Y)$ is defined as the maximum over all numbers $iw_Q + jw_Y$ such that $a_{i,j} \neq 0$.

It remains to define interpolation points and their multiplicities. As for Reed-Solomon codes, the interpolation points are pairs $(P, \alpha)$, where $P_j$ is a point in D and $\alpha \in \mathbb{F}_q$. In order to define the multiplicity of a generic interpolation point $(P, \alpha)$, we need to introduce a new basis for $L(mQ)$. For each point $P \neq Q$ on X, we introduce the functions $\phi_{0,P}$, $\phi_{1,P}, \ldots \phi_{m,P} \in L(mQ)$ defined as follows. If there exists a function $f \in L(mQ)$ such that $v_P(f) = i$, then we set $\phi_{i,P} = f$ (if there is more than one such function $f$, we fix one arbitrarily). Otherwise, we set $\phi_{i,P} = 0$ by convention. Again, it is a direct consequence of the Riemann-Roch theorem that there exist g numbers $o_{0,P}, o_{1,P}, \ldots o_{o,P}$ called the P-gaps at $Q$, such that $\phi_{o_{i,P},P} = 0$. It is known (H. Stichtenoth, *Algebraic Function Fields and Codes*, Berlin: Springer-Verlag, 1993) that the functions $\phi_{0,P}, \phi_{1,P}, \ldots \phi_{m,P}$ form a basis for $L(mQ)$ and we can write any $f \in L(mQ)$, by a simple change of basis, as follows $$f = f_{0,P} \phi_{0,P} + f_{1,P} \phi_{1,P} + \ldots + f_{m,P} \phi_{m,P} \text{ with } f_{0,P}, f_{1,P}, \ldots f_{m,P} \in \mathbb{F}_q \quad (38)$$

where $f_{i,P} = 0$ for $i \in \{o_{1,P}, o_{2,P}, \ldots, o_{g,P}\}$ by convention. Since (38) holds for all $m \geq 0$, the above clearly extends to a basis $\phi_{0,P}, \phi_{1,P}, \ldots$ for the ring $K_Q[Y]$. The following definition is the counterpart of Definition 2 for algebraic-geometric codes.

Definition 6. Let $A(Y)$ be a polynomial in $K_Q[Y]$, and consider the shifted polynomial $B(Y) = A(Y + \alpha)$ expressed in the basis $\phi_{0,P}, \phi_{1,P}, \ldots$, namely $$B(Y) = \sum_{i=0}^{\infty} \sum_{j=0}^{\infty} b_{i,j} \varphi_{i,P} Y^j \quad (39)$$

We say $A(Y)$ has a zero of multiplicity m at the interpolation point $(P, \alpha)$, if $b_{i,j} = 0$ for $i+j < m$ and there exists a nonzero coefficient $b_{i,j}$ with $i+j = m$.

It follows from (39) that the change of basis from $\phi_0$, $\phi_2, \ldots$ to $\phi_{0,P}, \phi_{1,P}, \ldots$ plays the role of shift in the variable X. We are now ready to describe the second step of our algorithm.

---

Soft interpolation step: Given the point set $D = \{P_1, P_2, \ldots, P_n\}$ for the code $C_X(m, Q)$ and the multiplicity matrix $M = [m_{ij}]$, compute the (nontrivial) polynomial $Q_M(Y) \in K_Q[Y]$ of minimal (1,m)-weighted $Q$-valuation that has a zero of multiplicity at least $m_{ij}$ at the interpolation point $(P_j, \alpha_i)$ for every i,j such that $m_{ij} \neq 0$.

---

Let $f(P_1), f(P_2), \ldots f(P_n))$ be a codeword in $C_X(m, Q)$. As in the case of Reed-Solomon codes, we associate with each such codeword an expression of the type $Y - f$, where $f \in L(mQ)$. The third and final step of our algorithm thus consists of the following.

---

Factorization step: Given the polynomial $Q_M(Y) \in K_Q[Y]$, identify all the factors of $Q_M(Y)$ of type $Y - f$ with $f \in L(mQ)$. The output of the algorithm is a list of the codewords that correspond to these factors.

---

Note that the factorization above takes place in the ring $K_Q[Y]$, and not over $\mathbb{F}_q[X,Y]$. In fact, the polynomial $e_M(Y)$ usually will not have a linear factor (in Y) over $\mathbb{F}_q[X,Y]$.

6. Performance Improvements for Certain Channels

We have observed in Section 4, that it is possible to improve the asymptotic (for $s \to \infty$) performance of our soft-decision decoding algorithm on a binary symmetric channel by assuming a critical crossover probability $\epsilon^*$ that is different from the actual crossover probability of the BSC. In this section, we explore this possibility further for certain important classes of communication channels.

All channels considered in this section are discrete, meaning that the output alphabet $\mathcal{Y}$ is discrete and finite. Such discrete channels can be conveniently characterized by an $|\mathcal{X}| \times |\mathcal{Y}|$ transition-probability matrix $W_{y|x}$ whose rows and columns are indexed by $x \in \mathcal{X}$ and $y \in \mathcal{Y}$, respectively, and whose entries are $$W_{y|x}(x, y) \stackrel{def}{=} Pr(\mathcal{Y} = y | \mathcal{X} = x) = f(y|x)$$

where the $f(\cdot|x)$ are transition-probability mass functions, as defied in (7). The specific channels investigated in this section are: the q-ary symmetric channel, the q-ary symmetric channel with erasures, and a simplified version of the q-ary PSK channel. All these channels are, in fact, hard-decision channels, but the decoding method of the present invention can be used on such channels as well. The necessary modifications to the method are taught in this section.

In each case, our goal is to maximize the set of correctable error patterns, for a code of a given rate. In each case, we find that to achieve this goal, we have to disregard the actual channel parameters, and use instead parameters derived from the rate of the code at hand and from the properties of the decoding algorithm. Thus, the resulting solutions are ideally suited to the frequently encountered situation where the channel parameters are not known, or not known exactly. This is somewhat related to the recent work on universal decoding, or decoding under channel mismatch (A. Lapidoth, P. Narayan, Reliable communication under channel uncertainty, IEEE Trans. Info. Theory, vol. 44, pp.

2148–2177, 1998). We believe that similar strategies for improving the asymptotic performance of our soft-decoding algorithm can be developed for any discrete channel.

6.1. The q-ary Symmetric Channel

Consider a q-ary symmetric channel with parameter $\epsilon$. For this channel, $\mathcal{X} = \mathcal{Y} = \mathbb{F}_q$ and the transition-probability matrix is given by $$W_{y|x}(x, y) = \begin{cases} 1 - \varepsilon & y = x \\ \dfrac{\varepsilon}{q-1} & y \neq x \end{cases}$$

Suppose that a codeword $c \in \mathbb{F}_q^n$ of a Reed-Solomon (or BCH) code $\mathcal{C}_q(n,k)$ is transmitted over a q-ary symmetric channel, and a vector $y \in \mathbb{F}_q^n$ is observed at the channel output. Then the corresponding reliability matrix is given by $$\Pi = (1-\varepsilon)[y] + \frac{\varepsilon}{q-1}(1-[y]) \qquad (40)$$

By symmetry, the multiplicity matrix M that maximizes the fraction of correctable errors will have only two different values, say a and b. Explicitly, we have $M=a[y]+b(1-[y])$. The cost of M is thus $\mathcal{C}(M)=na(a+1)/2+n(q-1)b(b+1)/2$. It t errors occur during the transmission, then the score of the transmitted codeword is given by $S_M(c)=a(n-t)+bt$. Thus, the condition $S_M(c) > \sqrt{2k\mathcal{C}}$ of Corollary 5 is satisfied if $$\tau < \frac{a - \sqrt{Ra(a+1) + R(q-1)b(b+1)}}{a-b} \qquad (41)$$

where $\tau = t/n$ and $R = k/n$. It follows that to maximize the fraction of correctable errors, one should choose a and b so as to maximize the right-hand side of (41), subject to a constraint on the normalized cost $\mathcal{C}'(M)=2\mathcal{C}(M)/n$ (which determines the complexity of decoding). While, in general, this appears to be a difficult nonlinear optimization problem, there is a simple solution for the asymptotic case, when the total number of interpolation points $s=na+n(q-1)b$ tends to infinity. For large numbers a and b, the normalized cost is well approximated by $a^2+(q-1)b^2$. Let $b'=b\sqrt{q-1}$. Then the condition for successful decoding can be rewritten as $$\frac{a(1-\tau) + b\tau}{\sqrt{a^2 + (q-1)b^2}} = \frac{a(1-\tau) + \dfrac{\tau}{\sqrt{q-1}}b'}{\sqrt{a^2 + b'^2}} \geq \sqrt{R} \qquad (42)$$

It is easy to see that for a fixed $\tau$, the left-hand side of (42) is maximized if (a,b) is a multiple of $(1-\tau, \tau/q-1)$. For these values of a and b, the inequality (42) reduces to the following $$(1-\tau)^2 + \frac{\tau^2}{q-1} \geq R \qquad (43)$$

Given a Reed-Solomon code of rate R, we first determine the maximal $\tau$ such that (43) is satisfied. This value of $\tau$ then determines the values of $a=\gamma(1-\tau)$ and $b=\gamma\tau/(q-1)$, where the scaling constant $\gamma$ is chosen so that a and b are positive integers (such a constant exists if $\tau$ is rational). With this choice of a and b, our soft-decoding algorithm, operating on the multiplicity matrix $M=a[y]+b(1-[y])$, will produce a list that contains the transmitted codeword c provided that at most $\tau n$ error occur during the transmission for some $\tau$ that satisfies (43).

The bound (43) is stronger than the results reported by Guruswami and Sudan in V. Guruswami, M. Sudan, op. cit. The difference $\tau^2/(q-1)$ with respect to the bound $(1-\tau)^2 \geq R$ derived in V. Guruswami, M. Sudan, op. cit. is especially significant for small alphabets. In fact (43) reduces to (34) for q=2; the resulting improvement over the Guruswami-Sudan list decoding is illustrated in FIG. 7.

We observe that the bound (43) can also be derived using an equivalent, but different approach. This approach is described in what follows, since it will be useful in subsequent subsections. We consider directly the asymptotic case $s \to \infty$, and employ Theorem A.5. For the reliability matrix in (40), we have $$\langle \Pi, \Pi \rangle = \frac{n\varepsilon^2}{q-1} + (n(1-\varepsilon))^2$$

$$\langle \Pi, [c] \rangle = (1-\varepsilon)(n-t) + \frac{t\varepsilon}{q-1}$$

It follows that on a q-ary symmetric channel, the asymptotic condition for successful decoding in Theorem A.5 reduces to the following $$\frac{\dfrac{\tau}{\sqrt{q-1}}\dfrac{\varepsilon}{\sqrt{q-1}} + (1-\tau)(1-\varepsilon)}{\left(\dfrac{\varepsilon^2}{q-1} + (1-\varepsilon)^2\right)^{1/2}} \geq \sqrt{R} + o(1) \qquad (44)$$

Recall that our goal is to maximize $\tau$ for a fixed code rate R. The key idea in this context is to regard the channel parameter $\epsilon$ not as given, but as a variable. Indeed, if we vary $\epsilon$ in (40) and use the resulting matrix as the "reliability" matrix at the input to our soft-decoding algorithm, then the condition for successful decoding in (44) remains valid and varies accordingly. Hence, we should choose $\epsilon$ to maximize the left-hand side of (44) for a given rate R. Intuitively, this corresponds to maximizing the expected score with respect to the "worst" channel (or, equivalently, the largest $\epsilon$) that we can still handle for a given rate. A straightforward calculation now shows that the left-hand side of (44) is maximized for $\epsilon = \tau$. For this value of $\epsilon$(63), is precisely the same condition on $\tau$ as (43).

We note that a similar analysis can be carried out for algebraic-geometric codes. Although we will not mention AG codes again in this section, this remark applies to the subsequent subsections as well.

6.2. The q-ary Symmetric Erasure Channel

For a q-ary symmetric erasure channel, we have $\mathcal{X} = \mathbb{F}_q$ and $\mathcal{Y} = \mathbb{F}_q \cup \{\phi\}$, where the special symbol $\phi$ denotes erasure. The transition-probability matrix is given by $$W_{y|x}(x, y) = \begin{cases} \zeta & y = \phi \\ (1-\zeta)(1-\varepsilon) & y = x \\ (1-\zeta)\dfrac{\varepsilon}{q-1} & y \neq x \text{ and } y \neq \phi \end{cases}$$

where $\epsilon$ and $\zeta$ denote the error probability and the erasure probability, respectively. Suppose that a codeword c of a Reed-Solomon (or BCH) code $\mathcal{C}_q(n,k)$ is transmitted over a q-ary symmetric erasure channel and a vector $y=(y_1, y_2, \ldots, y_n)$ over $\mathbb{F}_q \cup \{\phi\}$ is observed at the channel output. It will be convenient to introduce the q×n real-valued matrix $\{y\}$ defined as follows: $\{y\}_{i,j}=1$ if $y_j=\alpha_i$, $\{y\}_{i,j}=1/q$ if $y_j=\phi$, and $\{y\}_{i,j}=0$ otherwise. With this notation, the corresponding reliability matrix is given by $$\Pi = (1-\varepsilon)\{y\} + \frac{\varepsilon}{q-1}(1-\{y\}) \tag{45}$$

Using the approach described at the end of Section 6.1, we consider the asymptotic case, when the total number of interpolation points tends to infinity, and employ Theorem A.5. Suppose that $\tau n$ errors and $\sigma n$ erasures occurred during the transmission. Then $$\langle \Pi, \Pi \rangle = n(1-\sigma)\left((1-\varepsilon)^2 + \frac{\varepsilon^2}{q-1}\right) + \frac{n\sigma}{q}$$

$$\langle \Pi, [c] \rangle = n(1-\sigma-\tau)(1-\varepsilon) + n\tau\frac{\varepsilon}{q-1} + \frac{n\sigma}{q}$$

It follows that on a q-ary symmetric erasure channel, the asymptotic condition for successful decoding in Theorem A.5 reduces the following $$\frac{(1-\sigma-\tau)(1-\varepsilon) + \frac{\tau\varepsilon}{q-1} + \frac{\sigma}{q}}{\left((1-\sigma)\left((1-\varepsilon)^2 + \frac{\varepsilon^2}{q-1}\right) + \frac{\sigma}{q}\right)^{1/2}} \geq \sqrt{R} + o(1) \tag{46}$$

It is easy to see that the left-hand side of (46) is maximized for $\epsilon = \tau/(1-\sigma)$. For this value of $\epsilon$, the inequality (46) reduces to the following bound $$\frac{1}{1-\sigma}\left((1-\sigma-\tau)^2 + \frac{\tau^2}{q-1}\right) + \frac{\sigma}{q} \geq R \tag{47}$$

The bound (47) describes the asymptotic performance of the following algorithm. Upon observing y at the output of a q-ary symmetric erasure channel, we count the number $\sigma n$ of erasures. Given q and R (determined by the code) and the observed value of $\sigma$, we solve for the largest $\tau$ that satisfies (47). Next, we set $\epsilon = \tau/(1-\sigma)$ in (45) and use the resulting matrix $\Pi$ as the "reliability" matrix at the input to our soft-decoding algorithm. Then, as the number s of interpolation points approaches infinity, the algorithm corrects any fraction of $\tau$ errors and $\sigma$ erasures, provided that $\tau$ and $\sigma$ satisfy (47).

6.3. A Simplified q-PSK Channel

We consider a simplified model of the q-ary phase-shift keying (q-PSK) channel. Namely, we distinguish only between errors to the nearest neighbors in the q-PSK constellation and errors beyond the nearest neighbors. This model is usually quite adequate in practice.

For a q-PSK channel, both the input alphabet and the output alphabet have q letters and it will be convenient to identify both alphabets with $\mathbb{Z}_q$, the ring of integers modulo q. Thus, $\mathcal{X} = \mathcal{Y} = \{0, 1, \ldots q-1\}$, with addition modulo q. (Of course, for the purposes of algebraic decoding, we can still identify $\mathcal{X}$ and $\mathcal{Y}$ with $F_q$.) The transition-probability matrix for our model is given by $$W_{y|x}(x,y) = \begin{cases} 1-\varepsilon-\rho & y = x \\ \rho/2 & y = x+1 \text{ or } y = x-1 \\ \frac{\varepsilon}{q-3} & y \notin \{x-1, x, x+1\} \end{cases}$$

where $\rho$ is the probability of error to one of the two nearest neighbors and $\epsilon$ is the probability of error beyond the nearest neighbors. If a codeword $c \in C_q(n,k)$ is transmitted and a vector $y \in \mathbb{Z}_q^n$ is observed at the channel output, the reliability matrix is given by $$\Pi = (1-\varepsilon-\rho)\{y\} + \frac{\rho}{2}([y+\underline{1}] + [y-\underline{1}]) + \tag{48}$$

$$\frac{\varepsilon}{q-3}(1 - [y+\underline{1}] - \{y\} - [y+\underline{1}])$$

where $\underline{1}$ denotes the all-one vector of length n, and the notation $[\cdot]$ is extended to vectors over $\mathbb{Z}_q$ in the obvious way. Suppose that $\sigma n$ errors to the nearest neighbors and $\tau n$ errors beyond the nearest neighbors have occurred during the transmission. Then $$\langle \Pi, \Pi \rangle = n\left((1-\varepsilon-\rho)^2 + \frac{\rho^2}{2} + \frac{\varepsilon^2}{q-3}\right)$$

$$\langle \Pi, [c] \rangle = n(1-\tau-\sigma)(1-\varepsilon-\rho) + \frac{n\sigma\rho}{2} + \frac{n\tau\varepsilon}{q-3}$$

It follows that for (our model of) the q-PSK channel, the asymptotic condition for successful decoding in Theorem A.5 reduces to the following $$\frac{(1-\tau-\sigma)(1-\varepsilon-\rho) + \frac{\tau\varepsilon}{q-3} + \frac{\sigma\rho}{2}}{\left((1-\varepsilon-\rho)^2 + \frac{\varepsilon^2}{q-3} + \frac{\rho^2}{2}\right)^{1/2}} \geq \sqrt{R} + o(1) \tag{49}$$

It is easy to see that the left-hand side of (49) is maximized for $\epsilon = \tau$ and $\rho = \sigma$. For these values of $\epsilon$ and $\rho$, the inequality (49) reduces to the following bound $$(1-\tau-\sigma)^2 + \frac{\tau^2}{q-3} + \frac{\sigma^2}{2} \geq R \tag{50}$$

However, it is not immediately clear what this bound describes. If the actual value of $\tau$ were known at the decoder, we could proceed as follows. Given $\tau, q$, and R, solve for the largest $\sigma$ that satisfies (50). Then set $\epsilon = \tau$ and $\rho = \sigma$ in (48) and use the resulting matrix $\Pi$ as the "reliability" matrix at the input to our soft-decoding algorithm. The algorithm then corrects (for $s \to \infty$) any fraction of $\sigma$ errors to the nearest neighbors and $\tau$ errors beyond the nearest neighbors, provided that $\sigma$ and $\tau$ satisfy (50). The problem is that the number $\tau n$ of errors beyond the nearest neighbors that actually occurred is generally not known at the decoder. A simple work-around in this situation is to try all the n possible values of $\tau$. Clearly, this strategy increases the overall decoding complexity by at most a linear factor. Moreover, in practice, it would be safe to assume that $\tau$ is small ($\tau \geq 2\epsilon$, say, is extremely unlikely), so that the complexity increase is by a factor much less than n.

APPENDIX A

Asymptotic Analysis

In this appendix, we investigate the multiplicity matrix $\mathcal{M}(\Pi, s)$ produced by Algorithm A as $s \to \infty$. We shall see that for $s \to \infty$ the matrix $\mathcal{M}(\Pi, s)$ becomes proportional to $\Pi$. Based on this observation, we derive an asymptotic condition for successful list-decoding, and provide a geometric characterization of the asymptotic decoding regions of the algorithm described in this specification.

We start with two simple lemmas. In all of the subsequent analysis, we keep the reliability matrix $\Pi=[\pi_{i,j}]$ fixed, while s ranges over the positive integers. For notational convenience, we define $\Phi=\{1,2,\ldots,q\}\times\{1,2,\ldots,n\}$. Let $\chi(\Pi)$ denote the support of $\Pi$, that is the set of all $(i,j)\in\Phi$ such that $\pi_{i,j}\neq 0$. Let $m_{i,j}(s)$ denote the entries in the matrix $\mathcal{M}(\Pi,s)$ produced by Algorithm A, put forth in Section 3 of the Description of Preferred Embodiment part of this specification.

Lemma A.1. As $s\to\infty$, every nonzero entry in $\mathcal{M}(\Pi,s)$ grows without bound. In other words $m_{i,j}(s)\to\infty$ when $s\to\infty$ for all $(i,j)\in\chi(\Pi)$.

Consider now the proof of Lemma A.1:

Define $m_{max}(s)=\max_{(i,j)\in\Phi}m_{i,j}(s)$ and $m_{min}(s)=\min_{(i,j)\in\chi(\Pi)}m_{i,j}(s)$. Clearly, it would suffice to show that $m_{min}(s)\to\infty$ as $s\to\infty$. Notice that $$s = \sum_{i=1}^{q}\sum_{j=1}^{n} m_{i,j}(s) \leq qn\, m_{\max}(s) \tag{A.1}$$

It follows from (A.1) that $m_{max}(s)\to\infty$ as $s\to\infty$. Hence there exists an infinite integer sequence $s_1,s_2,s_3,\ldots$ defined by the property that $m_{max}(s_r)=r$ and $m_{max}(s_r+1)=r+1$. The iterative nature of Algorithm A implies that for all $s\geq 1$, there is exactly one position $(i_0,j_0)$ such that $m_{i_0,j_0}(s+1)=m_{i_0,j_0}(s)+1$. We say that $(i_0,j_0)$ is the position updated at iteration $s+1$ of Algorithm A. This position is distinguished by the property that $$\frac{\pi_{i_0,j_0}}{m_{i_0,j_0}(s)+1} \geq \frac{\pi_{ij}}{m_{ij}(s)+1} \quad \text{for all } (ij)\in\Phi \tag{A.2}$$

For $r=1,2,\ldots$, let $(i_r,j_r)$ denote the position updated at iteration $s_r+1$ of Algorithm A. Then it follows from (A.2) and the definition of $s_r$ that $$m_{ij}(s_r)+1 \geq \frac{\pi_{ij}}{\pi_{i_r j_r}}(m_{\max}(s_r)+1) \geq \frac{\pi_{\min}}{\pi_{\max}}r + \frac{\pi_{\min}}{\pi_{\max}} \quad \text{for all } (ij)\in\chi(\Pi)$$

where $\pi_{max}=\max_{(i,j)\in\Phi}\pi_{i,j}$ and $\pi_{min}=\min_{(i,j)\in\chi(\Pi)}\pi_{i,j}$. Denoting by $\rho$ the ratio $\pi_{min}/\pi_{max}$, we conclude from the above that $m_{min}(s_r)\geq\rho r+\rho-1$. Since $\rho$ is a positive constant while $r\to\infty$ as $s\to\infty$, it follows that $m_{min}(s)$ grows without bound for $s\to\infty$. This completes the proof of Lemma A.1.

Henceforth, let $(i_s,j_s)$ denote the position updated at iteration s of Algorithm A, and consider the sequence of ratios of the increase in the expected score to the increase in cost at successive iterations of Algorithm A, namely $$\theta_1 \stackrel{def}{=} \frac{\pi_{i_1 j_1}}{m_{i_1 j_1}(1)},\ \theta_2 \stackrel{def}{=} \frac{\pi_{i_2 j_2}}{m_{i_2 j_2}(2)},\ \theta_3 \stackrel{def}{=} \frac{\pi_{i_3 j_3}}{m_{i_3 j_3}(2)},\ldots$$

It follows from (A.2) that the sequence $\theta_1,\theta_2,\ldots$ is non-increasing. Clearly, $\theta_1=\pi_{max}$ while $\lim_{s\to\infty}\theta_s=0$ by Lemma A.1.

Lemma A.2. For every positive integer s, there exists a positive constant $K=K(s)\leq\pi_{max}$, such that $$K(m_{i,j}(s)+1)\geq\pi_{i,j}\geq Km_{i,j}(s) \quad \text{for all } (i,j)\in\Phi \tag{A.3}$$

Conversely, for every positive constant $K\leq\pi_{max}$ there exists a positive integer $s=s(K)$ such that the inequality (A.3) holds Consider now the proof of Lemma A.2:

Given s, we chose $K=K(s)$ so that $\theta_{s+1}\leq K\leq\theta_s$, which is always possible as the sequence $\theta_1,\theta_2,\ldots$ is non-increasing. To prove the first inequality in (26), observe that $$K \geq \theta_{s+1} = \frac{\pi_{i_{s+1} j_{s+1}}}{m_{i_{s+1} j_{s+1}}(s+1)} = \frac{\pi_{i_{s+1} j_{s+1}}}{m_{i_{s+1} j_{s+1}}(s)+1} \geq \frac{\pi_{i,j}}{m_{i,j}(s)+1} \quad \text{for all } (ij)\in\Phi$$

where the last inequality follows from (A.2). The second inequality in (A.3) holds vacuously if $m_{i,j}(s)=0$, so assume that $m_{i,j}(s)\geq 1$. This assumption implies that position $(i,j)$ was updated at least once, and we let $s^*\leq s$ denote the number of the most recent iteration of Algorithm A at which position $(i,j)$ was updated. Then $$K \leq \theta_s \leq \theta_{s^*} = \frac{\pi_{i,j}}{m_{i,j}(s^*)} = \frac{\pi_{i,j}}{m_{i,j}(s)}$$

where the last equality follows from the fact that position $(i,j)$ was not updated since iteration $s^*$. Finally, given $0\leq K_s\leq\pi_{max}$, we chose $s=s(K)$ so that $\theta_{s+1}\leq K\leq\theta_s$ once again. This choice is possible because the sequence $\theta_1,\theta_2,\ldots$ is non-increasing, $\theta_1=\pi_{max}$ and $\lim_{s\to\infty}\theta_s=0$. The proof then remains exactly the same. This completes the proof of Lemma A.2.

Since (A.3) holds for all $(i,j)\in\Phi$, both inequalities in (A.3) remain valid under summation over all $(i,j)\in\Phi$. Thus it follows from Lemma A.2 that:

$$\sum_{(i,j)\in\Phi} K(m_{ij}(s)+1) \geq \sum_{(i,j)\in\Phi}\pi_{ij} \geq \sum_{(i,j)\in\Phi} Km_{i,j}(s) \tag{A.4}$$

These inequalities lead to upper and lower bounds on the constant $K=K(s)$ in Lemma A.2. Since $\Sigma_{(i,j)\in\Phi}m_{i,j}(s)=s$ while $\Sigma_{(i,j)\in\Phi}\pi_{i,j}=n$, we conclude from (A.4) that $$\frac{n}{s} \geq K(s) \geq \frac{n}{s+qn} \tag{A.5}$$

Next, we define the normalized multiplicity matrix $\mathcal{M}'(\Pi,s)=[\mu_{i,j}(s)]$ and the normalized reliability matrix $\Pi'=[\pi'_{i,j}]$ as follows: $\mu_{i,j}(s)=m_{i,j}(s)/s$ and $\pi'_{i,j}=\pi_{i,j}/n$ for all $(i,j)\in\Phi$. It is clear from these definitions that $<\mathcal{M}',1>=<\Pi',1>=1$, where 1 denotes the all-one matrix. The following theorem is the key result of this appendix: the theorem shows that the optimal multiplicity matrix $\mathcal{M}(\Pi,s)$ becomes proportional to $\Pi$ as $s\to\infty$.

Theorem A.3. As $s\to\infty$, the normalized multiplicity matrix converges to the normalized reliability matrix. In other words, for every $\epsilon>0$, there exists an $s_0$ such that for all $s\geq s_0$ we have $$|\pi'_{i,j}-\mu_{i,j}(s)| = \left|\frac{\pi'_{i,j}}{n}-\frac{m_{i,j}(s)}{s}\right| \leq \varepsilon \quad \text{for all } (i,j)\in\Phi \tag{A.6}$$

Consider now the proof for Theorem A.3:

It follows from Lemma A.2 that for all s, there exists a constant $K(s)$ such that $1 \geq \pi_{i,j}/K(s) - m_{i,j}(s) \geq 0$ for all $(i,j) \in \Phi$. Dividing this inequality by s, we obtain $$\frac{1}{s} \geq \frac{\pi_{i,j}}{sK(s)} - \mu_{i,j}(s) \geq 0 \quad (A.7)$$

From the bounds on $K(s)$ in (A.5), we conclude that $\pi'_{i,j} \leq \pi_{i,j}/sK(s) \leq \pi'_{i,j} + q\pi_{i,j}/s$. Combining this with (A.7), we get $$\frac{1}{s} \geq \pi'_{i,j} - \mu_{i,j}(s) \geq -\frac{q\pi_{max}}{s} \quad (A.8)$$

It follows that for all $s \geq \max\{1/\epsilon, \pi_{max}q/\epsilon\} = \pi_{max}q/\epsilon$, the bound in (A.6) holds for all $(i,j) \in \Phi$. Thus $s_0 = \pi_{max}q/\epsilon$. This completes the proof of Theorem A.3.

We conclude this appendix with a geometric characterization of the (asymptotic) decoding regions of our soft-decision decoding algorithm. To start with, consider Lemma A.4.

Lemma A.4. For a given multiplicity matrix M, the algebraic soft-decision decoding algorithm outputs a list that contains a codeword $c \in C_q(n,k)$ if $$\frac{\langle M, [c] \rangle}{\sqrt{\langle M, M \rangle + \langle M, 1 \rangle}} > \sqrt{k} \quad (A.9)$$

Theorem A.3 and Lemma A.4 lead to a precise characterization of the performance limits of our algorithm as the number of interpolation points approaches infinity. In the following theorem, $o(1)$ denotes a function of s that tends to zero as $s \to \infty$. Consider now Theorem A.5:

Theorem A.5. The algebraic soft-decision decoding algorithm outputs a list that contains a codeword $c \in C_q(n,k)$ if $$\frac{\langle \Pi, [c] \rangle}{\sqrt{\langle \Pi, \Pi \rangle}} \geq \sqrt{k} + o(1) \quad (A.10)$$

Consider now the proof for Theorem A.5:

Substituting the optimal multiplicity matrix $\mathcal{M}(\Pi, s)$ in (A.9) and normalizing (dividing by s the numerator and the denominator), we obtain the equivalent condition $$\frac{\langle M'(\Pi, s), [c] \rangle}{\sqrt{\langle M'(\Pi, s), M'(\Pi, s) \rangle + \frac{1}{s}}} > \sqrt{k} \quad (A.11)$$

It follows from Theorem A.3 that for $s \to \infty$, one can replace $\mathcal{M}(\Pi, s)$ in (A.11) by $\Pi'$, which upon re-normalization yields (A.10). More explicitly, we have $$\frac{\langle M'(\Pi, s), [c] \rangle}{\sqrt{\langle M'(\Pi, s), M'(\Pi, s) \rangle + \frac{1}{s}}} \geq$$

$$\frac{\langle \Pi, [c] \rangle - \frac{n^2}{s}}{\sqrt{\langle \Pi, \Pi \rangle + \frac{(2q\pi_{max}+1)n^2}{s} + \frac{q^3 n^3 \pi_{max}^2}{s^2}}} = \frac{\langle \Pi, [c] \rangle}{\sqrt{\langle \Pi, \Pi \rangle}} + o(1)$$

where the first inequality follows from (A.8) after some straightforward manipulations. In conjunction with (A.11), this completes the proof of Theorem A.5.

Finally, Theorem A.5 has a particularly nice interpretation if the reliability matrix $\Pi$ and the codeword $[c]$ are viewed as vectors in the qn-dimensional Euclidean space $\mathbb{R}^{qn}$.

$$\cos \beta \geq \sqrt{R} + o(1)$$

Thus the asymptotic decoding regions of our algorithm are spherical cones in the Euclidean space $\mathbb{R}^{qn}$, extending from the origin to the surface of a sphere ⓢ of radius $\sqrt{n}$. The codeword $[c]$ is a point of ⓢ, and the line connecting the origin to this point constitutes the central axis of the spherical cone. The central angle of each spherical cone is $\cos^{-1}\sqrt{R}$. Notice that since the algorithm is a list-decoding algorithm, its decoding regions are not disjoint: the spherical cones of angle $\cos^{-1}\sqrt{R}$ are overlapping.

It follows from Theorem 2 that the asymptotic (for $m \to \infty$) decoding regions of the Guruswami-Sudan algorithm are spherical caps on the surface of ⓢ of the same spherical angle $\cos^{-1}\sqrt{R}$, but the decoding process involves projecting $\Pi$ onto a point $[y]$ on the surface of ⓢ in a nonlinear fashion, according to equation (10). Finally, the decoding regions of conventional Berlekamp-Welch hard-decision decoding are also spherical caps on the surface of ⓢ and the same nonlinear projection is employed, but the spherical angle of these caps is $\cos^{-1}(½+½R)$.

APPENDIX B

Exemplary Programmed Implementation of the Method of the Present Invention

The method of the present invention for the algebraic soft-decision decoding of codes of the Reed-Solomon (RS) and Bose-Chaudhuri-Hocquenghem (BCH) types may be implemented in special purpose digital logic or as a software program running on a general purpose microprocessor, or digital computer. The following is an exemplary program, written in the C programming language, implementing the method of the present invention.

It will be understood by practitioner of the programming arts that the program could equally as well have been written in many other programming languages, and that variations in the code and even the structure of the program are possible nonetheless to realizing the same purpose, and the same method. In the event of any inconsistencies between the performance of the program and the method of the invention as taught by reference to the mathematical process thereof within the Detailed Description of the Preferred Embodiment section of this specification, the description within the Detailed Description of the Preferred Embodiment shall control.

```
#include <stdio.h>
#include <stdlib.h>
#include <math.h>
#define q 64
#define q2 8
#define max_grad 100
#define pi 3.141592654
#define st dummy=getc(stdin)
typedef struct{
    double p;
    int x;
    int y;
    int mult;
} recc;
int k;
int s;
int ls;
int rs;
int no_cons;
int no_tests;
int no_right_soft;
int no_right_hard;
int error_weight;
int ssudanscore;
float dbb;
double sigma;
double sp[q][2];
double M[q][q];
int A[q][q];
int cword[q];
int hard_dec[q];
int no_errors;
int soft_sudan_score;
recc AA[q*q];
void init();
double sq(double x);
void random_word(void);
int choose_int_points(int 11);
static int reccompare(recc *a,recc *b);
char dummy;
/*******************************************
*         main procedure                   *
********************************************/
main()
{
    int i,j,test,a,l;
    printf("\n Code length is: %d",q);
    printf("\n Enter db and hit the return key: ");
    scanf("%f",&dbb);
    printf("\n Enter dimension k and hit the return key: ");
    scanf("%d",&k);
    printf("\n Enter multiplicity s and hit the return key: ");
    scanf("%d",&s);
    sigma=exp(-dbb/20.0);printf("\n sigma:%f",sigma);
    init();
    srand(109);
    no_right_soft=0;
    no_right_hard=0;
    for (i=1;i<100000;i++)
        {random_word();
         qsort((recc *) AA ,q*q,sizeof(recc), reccompare);
         ssudanscore=choose_int_points(no_cons);
         if (ssudanscore>ls) no_right_soft++;
         if (error_weight<=ceil(q-(float)ls/s-1)) no_right_hard++;
         if (i%1==0)
         printf(" Score: %d, necessary score: %d",ssudanscore,ls);
         st;}
}
/***************main ends **************/
/********************************************
*         init procedure                   *
********************************************/
void init()
{
    int ii,jj;
    double ss;
    /*determination of ls, no_cons etc.*/
    for (ii=0;((k-1)*((ii-1)*ii))<(q*(s*(s+1)));ii++);
    ii=ii-1;
    rs=ii;
    ls=floor(q*{(float)s*((float)s+1)/2.0/rs+((float)rs-1.0)*(k-1.0)/2);
    printf("\nminimum success score: %d",ls);
    printf("\nerror correction (Sudan's algorithm)<=%f",ceil(q-(float)
    ls/s-1));
    no_cons=q*(s*(s+1))/2;
    printf("\nnumber of linear constraints: %d",no_cons);
    /* determination of signalpoints*/
    ss=0; /*ss is the average energy*/
    for (ii=0;ii<q2;ii++)
        for (jj=0;jj<q2;jj++)
            {
            sp[ii*q2+jj][0]=ii-q2/2+0.5;
            sp[ii*q2+jj][1]=jj-q2/2+0.5;
            ss=ss+sq(sp[ii*q2+jj][0])+sq(sp[ii*q2+jj][1]);
            }
    ss=ss/q;
    for (ii=0;ii<q;ii++)
        {
        if ((ii % q2)==0) printf("\n");
        sp[ii][0]=sp[ii][0]/sqrt(ss)/sigma;
        sp[ii][1]=sp[ii][1]/sqrt(ss)/sigma;
        }
    st;
}
/***********init ends******************/
/********************************************
*         random word procedure             *
********************************************/
void random_word(void)
{
    int i,j,iii;
    double u1,u2,mx,sss;
    double pr;
    double dist[q];
    double rr[2];
    error_weight=0;
    for (i=0;i<q;i++)
    { cword[i]=36;   /*rand() % q;*/
        u1=(double)rand()/(1<<15);
        u2=(double)rand()/(1<<15);
        rr[0]=sp[cword[i]][0]+sqrt(-2*log(u2))*cos(2*pi*u1);
        rr[1]=sp[cword[i]][1]+sqrt(-2*log(u2))*sin(2*pi*u1);
        pr=0;
        mx=0;
        for (j=0;j<q;j++)
        {
            sss=(sq(sp[j][0]-rr[0])+sq(sp[j][1]-rr[1]))/2;
            dist[j]=exp(-sss);
            if (dist[j]>mx)
                {
                mx=dist[j];
                hard_dec[i]=j;
                }
            pr=pr+dist[j];
        }
        if (hard_dec[i]!=cword[i]) error_weight++;
        sss=0;
        for (j=0;j<q;j++)
        {
            M[i][j]=dist[j]/pr;sss=M[i][j]+sss;
            iii=i*q+j;
            AA[iii].p=M[i][j];AA[iii].x=i;AA[iii].y=j;AA[iii].mult=0;
        }
    }
};
/*******random word ends**************/
/********************************************
*         choose_int_points procedure      *
********************************************/
int choose_int_points(int 11)
{
    int ii,i,j,ipos,jpos,used_so_far,rig;
    double maxi,sss,expscore;
    recc temp;
    for (i=0;i<q;i++) for (j=0;j<q;j++) A[i][j]=0;
```

-continued

```
soft_sudan_score=0;
expscore=0;
used_so_far=0;
while (used_so_far<11)
        (for (i=0;(((AA[i].mult+used_so_far)>11) && (i<q*q));i++);
        if (i<q*q)
        {
            AA[i].mult=AA[i].mult+1;
            expscore=expscore+AA[i].p;
            used_so_far=AA[i].mult+used_so_far;
            if (cword[AA[i].x]==AA[i].y) {soft_sudan_score++;}
            AA[i].p=AA[i].p*AA[i].mult/(AA[i].mult+1);
            temp=AA[i];
            while ((temp.p<AA[i+1].p) && (i+2<q*q))
                {
                    AA[i]=AA[i+1];
                    i=i+1;
                }
            AA[i]=temp;
        }
    }
return(soft_sudan_score);
}
/********************************************
*       auxiliary procedures                 *
********************************************/
double sq(double x) {return(x*x);};
static int reccompare(recc *a,recc *b)
{if ((((*a).p/((*a).mult+1)) > ((*b).p/((*b).mult+1)))
    return (-1);
if ((((*a).p/((*a).mult+1)) < ((*b).p/((*b).mult+1)))
    return (1);
return(0);}
```

What is claimed is:

1. A method of decoding an error-correcting code comprising a plurality of codewords, each codeword having multiple symbols, the error-correcting code being of the Reed-Solomon type and/or of the Bose-Chaudhuri-Hocquenghem (BCH) type, the method of decoding comprising the steps of:

1) converting reliability information concerning individual code symbols into algebraic interpolation conditions;

2) finding a non-trivial polynomial that satisfies said interpolation conditions; and 3) generating a list of candidate codewords of the Reed-Solomon code or the BCH code.

2. The method according to claim 1 wherein the reliability information comprise reliability information concerning the relative likelihoods of individual code symbols, and/or, equivalently, data from which the reliability information concerning the relative likelihoods of individual code symbols can be computed, and wherein the method of decoding comprises:

1) given the reliability information, computing from this reliability information a set of algebraic interpolation conditions;

2) given the algebraic interpolation conditions, interpolating to find a non-trivial interpolation polynomial that satisfies these conditions; and 3) given the interpolation polynomial, factoring the polynomial to find factors that correspond to codewords of the Reed-Solomon code or the BCH code, therein generating a list of candidate codewords.

3. The method according to claim 2, wherein at least one of the 1) computing, the 2) interpolating, and the 3) factoring is implemented in special purpose digital logic.

4. The method according to claim 2, wherein at least one of the 1) computing, the 2) interpolating, and the 3) factoring is implemented by software in a general purpose digital computing device, including a digital signal processing (DSP) integrated circuit or a digital computer.

5. The method according to claim 2 wherein the error-correcting code comprises a coding scheme taken from the group consisting of concatenated coding schemes, multi-level coding schemes, and combinations thereof.

6. The method according to claim 2 wherein the step of converting reliability information comprises the step of converting reliability information concerning individual code symbols used in a communication system.

7. The method according to claim 2 wherein the step of converting reliability information comprises the step of converting reliability information concerning individual code symbols used in a recording system.

8. The method according to claim 2, wherein a coding gain provided by the method of decoding is traded-off for a computational complexity of the method of decoding, relatively more coding gain being realized at relatively more computational complexity while relatively less coding gain is realized at relatively less computational complexity.

9. The method according to claim 2 further comprising the step, after the step of 3) factoring:

4) selecting one or more codeword(s) from the list of candidate codewords generated in the 3) factoring, thereby forming a subset of selected codewords.

10. The method according to claim 1 wherein the error-correcting code comprises an (n,k,d) Reed-Solomon code over a finite field $\mathbb{F}_q$ with q elements, or an (n,k',d') BCH code over a finite field $\mathbb{F}_{q'}$ with q' elements, where $n \geq 1$ is the length, $k \leq n$ is the dimension, and $d=n-k+1$ is the minimum distance of the Reed-Solomon code, and where n is the length, $k' \leq k$ is the dimension, and $d' \leq d$ is the minimum distance of the BCH code, the BCH code being a subfield subcode of the Reed-Solomon code, wherein the reliability information comprises, for each of the multiple symbols, reliability information concerning the relative likelihood of each code symbol being equal to $\alpha \in \mathbb{F}_q$, for each element $\alpha$ of the finite field $\mathbb{F}_q$, and/or, equivalently, data from which such reliability information can be computed, and wherein the method of decoding comprises:

1) given the reliability information, computing from this information non-negative integer-valued numbers $m_{i,j}$ for each position j in the code, where $1 \leq j \leq n$, and for each element $\alpha_i \in \mathbb{F}_q$, where $1 \leq i \leq q$, so that the total number of non-zeros among the non-negative integer-valued numbers $m_{i,j}$ depends on the reliability information, the total number of non-zeros being possibly greater than n;

2) given the numbers $m_{i,j}$, interpolating to find a (non-trivial) polynomial $Q_M(X,Y)$ that has a zero of multiplicity at least $m_{i,j}$ at the point $(x_j,\alpha_i)$ for each j in the range $1 \leq j \leq n$ and each i in the range $1 \leq i \leq q$, the polynomial $Q_M(X,Y)$ best selected to have the least possible (1,k-1)-weighted degree; and 3) given the polynomial $Q_M(X,Y)$, factoring this polynomial to find factors of type $Y-f(X)$, where the degree of the polynomial $f(X)$ is less than k, each factor corresponding to a codeword of the Reed-Solomon code or of the BCH code, thereby generating a list of candidate codewords;

wherein each of the 1) computing and the 2) interpolating and the 3) factoring has a computational complexity that is always bounded by a polynomial function of the length n of a codeword of the Reed-Solomon code and/or the BCH code; and wherein the entire decoding method thus has a computational complexity that is always bounded by a polynomial function of the length n of a codeword of the Reed-Solomon code and/or the BCH code.

11. The method according to claim 10 wherein the reliability information further comprises a positive integer s, which is an arbitrary design parameter indicating the total number of interpolation points and governing the computational complexity of the entire decoding method; and wherein the 1) computing of non-negative integer-valued numbers $m_{i,j}$ comprises:

1.1) computing from said input data an initial set of numbers $\pi_{i,j}$, where each number $\pi_{i,j}$ suitably reflects the relative likelihood of the j-th code symbol being equal to $\alpha_i \in \mathbb{F}_q$, for each integer j in the range $1 \leq j \leq n$ and for each element $\alpha_i$ of the finite field $\mathbb{F}_q$, where i is an integer in the range $1 \leq i \leq q$;

1.2) initializing so as to set $m_{i,j}=0$ and $\pi^*_{i,j}=\pi_{i,j}$ for all integers i in the range $1 \leq i \leq q$ and for all integers j in the range $1 \leq j \leq n$;

1.3) finding the index $(i_0, j_0)$ of a number $\pi^*_{i_0, j_0}$ so that $$\pi^*_{i_0,j_0} \geq \pi^*_{i,j}$$

for all integers i in the range $1 \leq i \leq q$ and for all integers j in the range $1 \leq j \leq n$;

1.4) deriving $$\pi^*_{i_0,j_0} \leftarrow \frac{\pi_{i_0,j_0}}{m_{i_0,j_0} + 2}$$

$$m_{i_0,j_0} \leftarrow m_{i_0,j_0} + 1$$

$$s \leftarrow s - 1$$

1.5) deciding if s=0, and if so then outputting the non-negative integer-valued numbers $m_{i,j}$ for all integers i in the range $1 \leq i \leq q$ and for all integers j in the range $1 \leq j \leq n$, else returning to performing the 1.3) finding and the 1.4) deriving and the 1.5) deciding.

12. The method according to claim 11, wherein the computing of non-negative integer-valued numbers $m_{i,j}$ continues until a stopping criterion is reached, which stopping criterion is based on the computational-complexity design parameter s being preset to an arbitrary fixed positive integer value.

13. The method according to claim 10, wherein the computing of non-negative integer-valued numbers $m_{i,j}$ is contingent upon a stopping criterion that is adaptively set during the computing using the results of the computing.

14. The method according to claim 10, wherein the step of 3) factoring comprises factoring to yield a correct codeword c among the list of candidate codewords if $$S_M(c) > \Delta(C)$$

where $S_M(c)$ is a particular function, called a score, of the codeword c with respect to the non-negative integer-valued numbers $m_{i,j}$ generated by the 1) computing, C is the total cost of the non-negative integer-valued numbers $m_{i,j}$, and $\Delta(C) < \sqrt{2kC}$ is the least non-negative integer such that the total number of bivariate monomials of $(1,k-1)$-weighted degree at most $\Delta(C)$ is greater than C.

15. A method of decoding an algebraic-geometric error-correcting code comprising a plurality of codewords, each codeword having multiple symbols, the method of decoding comprising the steps of:

1) converting reliability information concerning individual code symbols into algebraic interpolation conditions;

2) finding a non-trivial polynomial that satisfies said interpolation conditions; and 3) generating a list of candidate codewords of the algebraic-geometric code.

16. The method according to claim 15 wherein the reliability information comprises reliability information concerning the relative likelihoods of individual code symbols, and/or, equivalently, data from which the reliability information concerning the relative likelihoods of individual code symbols can be computed, and wherein the method of decoding comprises:

1) given the reliability information, computing from this reliability information a set of algebraic interpolation conditions, 2) given the algebraic interpolation conditions, interpolating to find a non-trivial interpolation polynomial that satisfies these conditions; and 3) given the interpolation polynomial, factoring the polynomial to find factors that correspond to codewords of the algebraic-geometric code, therein generating a list of candidate codewords.

17. The method according to claim 16, wherein at least one of the 1) computing, the 2) interpolating, and the 3) factoring is implemented in special purpose digital logic.

18. The method according to claim 16, wherein at least one of the 1) computing, the 2) interpolating, and the 3) factoring is implemented by software in a general purpose digital computing device, including a digital signal processing (DSP) integrated circuit or a digital computer.

19. The method according to claim 16 wherein the error-correcting code comprises a coding scheme taken from the group consisting of concatenated coding schemes, multi-level coding schemes, and combinations thereof.

20. The method according to claim 16 wherein the step of converting reliability information comprises the step of converting reliability information concerning individual code symbols used in a communication system.

21. The method according to claim 16 wherein the step of converting reliability information comprises the step of converting reliability information concerning individual code symbols used in a recording system.

22. The method according to claim 16, wherein a coding gain provided by the method of decoding is traded-off for a computational complexity of the method of decoding, relatively more coding gain being realized at relatively more computational complexity while relatively less coding gain is realized at relatively less computational complexity.

23. The method according to claim 16 further comprising the step, after the step of 3) factoring:

4) selecting one or more codeword(s) from the list of candidate codewords generated in the 3) factoring, thereby forming a subset of selected codewords.

24. The method according to claim 15 wherein the error-correcting code comprises an (n,k,d) algebraic-geometric code over a finite field $F_q$ with q elements, where $n \geq 1$ is the length, $k \leq n$ is the dimension, and $d \leq n-k+1$ is the minimum distance of the algebraic-geometric code, wherein the reliability information comprises, for each of the multiple symbols, reliability information concerning the relative likelihood of each code symbol being equal to $\alpha \in F_q$, for each element $\alpha$ of the finite field $F_q$, and/or, equivalently, data from which such reliability information can be computed, and wherein the method of decoding comprises:

1) given the reliability information, computing from this information non-negative integer-valued numbers $m_{i,j}$ for each position j in the code, where $1 \leq j \leq n$, and for each element $\alpha_i \in F_q$, where $1 \leq i \leq q$, so that the total number of non-zeros among the non-negative integer-valued numbers $m_{i,j}$, depends on the reliability information, the total number of non-zeros being possibly greater than n;

2) given the numbers $m_{i,j}$, interpolating to find a (non-trivial) polynomial $Q_M(Y)$ over the ring $K_Q[Y]$ that has a zero of multiplicity at least $m_{i,j}$ at the point $(P_j, \alpha_i)$ for each j in the range $1 \leq j \leq n$ and each i in the range $1 \leq i \leq q$, where for each j in the range $1 \leq j \leq n$, $P_j \neq Q$ is a point on the algebraic curve used to construct the algebraic-geometric code, and where the polynomial $Q_M(Y)$ is best selected to have the least possible (1,m)-weighted Q-valuation, Q being a fixed point on the algebraic curve distinct from the points $P_1, P_2, \ldots, P_n$, and m being the highest pole order at Q of rational functions (on the algebraic curve) that are evaluated in the construction of the algebraic-geometric code; and 3) given the polynomial $Q_M(Y)$, factoring this polynomial to find factors of type $Y-f$, where $f$ is a rational function whose highest pole order at Q is at most m, each such factor corresponding to a codeword of the algebraic-geometric code, thereby generating a list of candidate codewords;

wherein each of the 1) computing and the 2) interpolating and the 3) factoring has a computational complexity that is always bounded by a polynomial function of the length n of a codeword of the algebraic-geometric code; and wherein the entire decoding method thus has a computational complexity that is always bounded by a polynomial function of the length n of a codeword of the algebraic-geometric code.

25. The method according to claim 24 wherein the reliability information further comprises a positive integer s, which is an arbitrary design parameter indicating the total number of interpolation points and governing the computational complexity of the entire decoding method; and wherein the 1) computing of non-negative integer-valued numbers $m_{i,j}$ comprises:

1.1) computing from said input data an initial set of numbers $\pi_{i,j}$, where each number $\pi_{i,j}$ suitably reflects the relative likelihood of the j-th code symbol being equal to $\alpha_i \in F_q$, for each integer j in the range $1 \leq j \leq n$ and for each element $\alpha_i$ of the finite field $F_q$, where i is an integer in the range $1 \leq j \leq q$;

1.2) initializing so as to set $m_{i,j}=0$ and $\pi^*_{i,j}=\pi_{i,j}$ for all integers i in the range $1 \leq i \leq q$ and for all integers j in the range $1 \leq j \leq n$;

1.3) finding the index $(i_0, j_0)$ of a number $\pi^*_{i_0,j_0}$ so that $$\pi^*_{i_0,j_0} \geq \pi^*_{i,j}$$

for all integers i in the range $1 \leq i \leq q$ and for all integers j in the range $1 \leq j \leq n$;

1.4) deriving $$\pi^*_{i_0,j_0} \leftarrow \frac{\pi_{i_0,j_0}}{m_{i_0,j_0}+2}$$

$$m_{i_0,j_0} \leftarrow m_{i_0,j_0}+1$$

$$s \leftarrow s-1$$

1.5) deciding if s=0, and if so then outputting the non-negative integer-valued numbers $m_{i,j}$ for all integers i in the range $1 \leq i \leq q$ and for all integers j in the range $1 \leq j \leq n$, else returning to performing the 1.3) finding and the 1.4) deriving and the 1.5) deciding.

26. The method according to claim 24, wherein the computing of non-negative integer-valued numbers $m_{i,j}$ continues until a stopping criterion is reached, which stopping criterion is based on the computational-complexity design parameter s being preset to an arbitrary fixed positive integer value.

27. The method according to claim 24, wherein the computing of non-negative integer-valued numbers $m_{i,j}$ is contingent upon a stopping criterion that is adaptively set during the computing using the results of the computing.

28. The method according to claim 24, wherein the step of 3) factoring comprises factoring to yield a correct codeword c among the list of candidate codewords if $$S_M(c) > \Delta(C)$$

where $S_M(c)$ is a particular function, called a score, of the codeword c with respect to the non-negative integer-valued numbers $m_{i,j}$ generated by the 1) computing, C is the total cost of the non-negative integer-valued numbers $m_{i,j}$, and $$\Delta_X(C) < g + \sqrt{2m(C+g)+g^2}$$

is the least non-negative integer such that the total number of different non-zero expressions of type $\phi_i Y^j$ with (1,m)-weighted Q-valuation at most $\Delta_X(C)$ is greater than C, and where g is the genus of the algebraic curve used in the construction of the algebraic-geometric code.

29. A method of decoding a Reed-Solomon error-correcting code of length n and rate R over a finite field $F_q$ with q elements or a Bose-Chaudhuri-Hocquenghem (BCH) error-correcting code of length n and rate R' over the finite field $F_q$ on a channel of type drawn from the group consisting of q-ary symmetric channels, q-ary symmetric erasure channels, and q-PSK channels, where input to the decoding method consists of data that includes:
- a vector y=($y_1, y_2, \ldots, y_n$) observed at the channel output, where all the n elements of the vector y belong to the finite field $\mathbb{F}_q$ in the case of q-ary symmetric channels and q-PSK channels, whereas in the case of q-ary symmetric erasure channels, all the n elements of the vector y belong to $\mathbb{F}_q \cup \{\phi\}$, where the special symbol $\phi$ denotes erasure, the decoding method comprising:
1) given the vector y=($y_1, y_2, \ldots, y_n$), computing from this vector y a set of algebraic interpolation conditions that specify values of an interpolation polynomial;
2) given the algebraic interpolation conditions interpolating to find a (non-trivial) interpolation polynomial that satisfies these conditions; and
3) given the interpolation polynomial, factoring this polynomial to find factors that correspond to codewords of the Reed-Solomon code or the BCH code, thereby generating a list of candidate codewords.

30. The method according to claim 29 wherein the error-correcting code comprises a Reed-Solomon code or a BCH code on a q-ary symmetric channel, or a q-ary symmetric erasure channel, or a q-PSK channel, the decoding method comprising:
1) given the vector y=($y_1, y_2, \ldots, y_n$), computing from this vector y non-negative integer-valued numbers $m_{i,j}$ for each positions j in the code, where $1 \leq j \leq n$, and for each element as $\alpha_i \in \mathbb{F}_q$, where $1 \leq i \leq q$, the total number of non-zeros among the non-negative numbers $m_{i,j}$ being possibly greater than n;
2) given the numbers $m_{i,j}$, interpolating to find a (non-trivial) polynomial $Q_M(X,Y)$ that has a zero of multiplicity at least $m_{i,j}$ at the point ($x_j, \alpha_i$) for each j in the range $1 \leq j \leq n$ and each i in the range $1 \leq i \leq q$, the polynomial $Q_M(X,Y)$ best selected to have the least possible (1,nR−1)-weighted degree; and
3) given the polynomial $Q_M(X,Y)$, factoring this polynomial to find factors of type $Y-f(X)$, where the degree of the polynomial $f(X)$ is less than nR, each such factor corresponding to a codeword of the Reed-Solomon code or the BCH code, therein generating a list of candidate codewords, wherein each of the 1) computing and the 2) interpolating and the 3) factoring has a computational complexity that is always bounded by a polynomial function of the length n of a codeword of the Reed-Solomon code and/or the BCH code, and wherein the entire decoding method thus has a computational complexity that is always bounded by a polynomial function of the length n of a codeword of the Reed-Solomon code and/or the BCH code.

31. The method according to claim 30 wherein the error-correcting code comprises a Reed-Solomon code or a BCH code on a q-ary symmetric channel, and wherein the 1) computing of non-negative integer-valued numbers $m_{i,j}$ comprises:

for each integer j in the range $1 \leq j \leq n$, setting $m_{i,j}$=a if $y_j=\alpha_i$ and $m_{i,j} \neq$a otherwise, where $y_j$ is the j-th element of the observed vector y and $\alpha_i$ is the i-th element of the finite field $\mathbb{F}_q$, and where a is an appropriately chosen positive integer;

wherein, as the number of interpolation points in the 2) interpolating becomes very large, the decoding method produces a list of candidate codewords that contains the particular codeword at the input to the q-ary symmetric channel, provided that less than t errors have occurred, further provided that the fraction $\tau=t/n$ satisfies the inequality:

$$(1-\tau)^2 + \frac{\tau^2}{q-1} \geq R$$

where q is the size of the alphabet of the q-ary symmetric channel and R is the rate of the Reed-Solomon code being decoded or, in the case of decoding BCH codes, the rate of the Reed-Solomon code that underlies the BCH code being decoded.

32. The decoding method according to claim 30 wherein the error-correcting code comprises a Reed-Solomon code or a BCH code on a q-ary symmetric erasure channel, and wherein the 1) computing of non-negative integer-valued numbers $m_{i,j}$ comprises:

for each integer j in the range $1 \leq j \leq n$, setting $m_{i,j}$=a if $y_j=\alpha_i$, $m_{i,j}$=b if $y_j=\phi$, and $m_{i,j} \notin \{a,b\}$ otherwise, where $y_j$ is the j-th element of the observed vector y while $\alpha_i$ is the i-th element of the finite field $\mathbb{F}_q$ and $\phi$ is a special symbol denoting erasure, and where a,b are appropriately chosen positive integers;

wherein, as the number of interpolation points in the 2) interpolating becomes very large, the decoding method produces a list of candidate codewords that contains the particular codeword at the input to the q-ary symmetric erasure channel, provided that less than t errors have occurred, further provided that the fraction $\tau=t/n$ satisfies the inequality:

$$\frac{1}{1-\sigma}\left((1-\sigma-\tau)^2 + \frac{\tau^2}{q-1}\right) + \frac{\sigma}{q} \geq R$$

where q is the size of the alphabet of the q-ary symmetric erasure channel, not counting the symbol $\phi$ denoting erasure, $\sigma$ is the number of erasures that occurred, and R is the rate of the Reed-Solomon code being decoded or, in the case of decoding BCH codes, the rate of the Reed-Solomon code that underlies the BCH code being decoded.

33. The decoding method according to claim 30 wherein the error-correcting code comprises a Reed-Solomon code or a BCH code on a q-PSK channel, and wherein the 1) computing of non-negative integer-valued numbers $m_{i,j}$ comprises:

for each integer j in the range $1 \leq i \leq n$, setting $m_{i,j}$=a if $y_j$ is the QPSK symbol that corresponds to $\alpha_i$, $m_{i,j}$=b if $y_j$ is a nearest neighbor of the QPSK symbol that corresponds to $\alpha_i$, and $m_{i,j} \notin \{a,b\}$ otherwise, where $y_j$ is the j-th element of the observed vector y and $\alpha_i$ is the i-th element of the finite field $\mathbb{F}_q$, and where a,b are appropriately chosen positive integers;

wherein, as the number of interpolation points in the 2) interpolating becomes very large, the method produces a list of candidate codewords that contains the particular codeword at the input to the q-PSK channel, provided that less than s errors to the nearest neighbors and less than t errors beyond the nearest neighbors have occurred, further provided that the fractions σ=s/n and τ=t/n satisfy the inequality:

$$(1-\tau-\sigma)^2 + \frac{r^2}{q-3} + \frac{\sigma^2}{2} \geq R$$

where q is the size of the alphabet of the q-PSK channel and R is the rate of the Reed-Solomon code being decoded or, in the case of decoding BCH codes, the rate of the Reed-Solomon code that underlies the BCH code being decoded.

34. The method according to claim 29,
wherein at least one of the 1) computing, the 2) interpolating, and the 3) factoring is implemented in special purpose digital logic.

35. The method according to claim 29,
wherein at least one of the 1) computing, the 2) interpolating, and the 3) factoring is implemented by software in a general purpose digital computing device, including a digital signal processing (DSP) integrated circuit or a digital computer.

36. The method according to claim 29 wherein the error-correcting code comprises a coding scheme taken from the group consisting of concatenated coding schemes, multi-level coding schemes, and combinations thereof.

37. The method according to claim 29 wherein the step of converting reliability information comprises the step of converting reliability information concerning individual code symbols used in a communication system.

38. The method according to claim 29 wherein the step of converting reliability information comprises the step of converting reliability information concerning individual code symbols used in a recording system.

39. The method according to claim 29 further comprising the step, after the step of 3) factoring:
4) selecting one or more codeword(s) from the list of candidate codewords generated in the 3) factoring, thereby forming a subset of selected codewords.

40. A method of decoding an algebraic-geometric error-correcting code of length n, dimension k≤n, and rate R=k/n, over a finite field $F_q$ with q elements, the algebraic-geometric code being constructed on an algebraic curve of genus g, the method of decoding being applied to decode the algebraic-geometric code on a channel of type drawn from the group consisting of q-ary symmetric channels, q-ary symmetric erasure channels, and q-PSK channels, p1 where input to the decoding method consists of data that includes:
a vector $y=(y_1, y_2, \ldots, y_n)$ observed at the channel output, where all the n elements of the vector y belong to the finite field $F_q$ in the case of q-ary symmetric channels and q-PSK channels, whereas in the case of q-ary symmetric erasure channels, all the n elements of the vector y belong to $F_q \cup \{\phi\}$, where the special symbol φ denotes erasure,
the decoding method comprising:
1) given the vector $y=(y_1, y_2, \ldots, y_n)$, computing from this vector y a set of algebraic interpolation conditions that specify values of an interpolation polynomial;
2) given the algebraic interpolation conditions, interpolating to find a (non-trivial) interpolation polynomial that satisfies these conditions; and
3) given the interpolation polynomial, factoring this polynomial to find factors that correspond to codewords of the algebraic-geometric code, thereby generating a list of candidate codewords.

41. The method according to claim 40 wherein the error-correcting code comprises an algebraic-geometric code on a q-ary symmetric channel, or a q-ary symmetric erasure channels, or a q-PSK channel,
the decoding method comprising:
1) given the vector $y=(y_1, y_2, \ldots, y_n)$, computing from this vector y non-negative integer-valued numbers $m_{i,j}$ for each position j in the code, where $1 \leq j \leq n$, and for each element $\alpha_j \in F_q$, where $1 \leq i \leq q$, the total number of non-zeros among the non-negative numbers $m_{i,j}$ may being possibly greater than n;
2) given the numbers $m_{i,j}$ interpolating to find a (non-trivial) polynomial $Q_M(Y)$ over the ring $K_Q[Y]$ that has a zero of multiplicity at least $m_{i,j}$ at the point $(P_j, \alpha_i)$ for each j in the range $1 \leq j \leq n$ and each i in the range $1 \leq i \leq q$, where for each j in the range $1 \leq j \leq n$, $P_j \neq Q$ is a point on the algebraic curve used to construct the algebraic-geometric code, and where the polynomial $Q_M(Y)$ is best selected to have the least possible (1,m)-weighted Q-valuation, Q being a fixed point on the algebraic curve distinct from the points $P_1, P_2, \ldots, P_n$, and m being the highest pole order at Q of rational unctions (on the algebraic curve) that are evaluated in the construction of the algebraic-geometric code, and
3) given the polynomial $Q_M(Y)$, factoring this polynomial to find factors of type $Y-f$, where $f$ is a rational function whose highest pole order at Q is at most m, each such factor corresponding to a codeword of the algebraic-geometric code, therein generating a list of candidate codewords;
wherein each of the 1) computing and the 2) interpolating and the 3) factoring has a computational complexity that is always bounded by a polynomial function of the length n of a codeword of the algebraic-geometric code; and
wherein the entire decoding method thus has a computational complexity that is always bounded by a polynomial function of the length n of a codeword of the algebraic-geometric code.

42. The decoding method according to claim 41 wherein the error-correcting code comprises an algebraic-geometric code on a q-ary symmetric channel, wherein the 1) computing of non-negative integer-valued numbers $m_{i,j}$ comprises:
for each integer j in the range $1 \leq j \leq n$, setting $m_{i,j}=a$ if $y_j=\alpha_i$ and $m_{i,j} \neq a$ otherwise, where $y_j$ s the j-th element of the observed vector y and $\alpha_i$ is the i-th element of the finite field $F_q$, and where a is an appropriately chosen positive integer;
wherein, as the number of interpolation points in the 2) interpolating becomes very large, the decoding method produces a list of candidate codewords that contains the particular codeword at the input to the q-ary symmetric channel, provided that less than t errors have occurred, further provided that the fraction τ=t/n satisfies the inequality:

$$(1-\tau)^2 + \frac{\tau^2}{q-1} \geq R + \frac{g}{n}$$

where q is the size of the alphabet of the q-ary symmetric channel, R is the rate of the algebraic-geometric code, and g is the genus of the algebraic curve that is used in the construction of the algebraic-geometric code.

43. The decoding method according to claim 41 wherein the error-correcting code comprises an algebraic-geometric code on a q-ary symmetric erasure channel, wherein the 1) computing of non-negative integer-valued numbers $m_{i,j}$ comprises:

for each integer j in the range $1 \leq j \leq n$, setting $m_{i,j}=a$ if $y_j=\alpha_i$, $m_{i,j}=b$ if $y_j=\phi$, and $m_{i,j} \notin \{a,b\}$ otherwise, where $y_j$ is the j-th element of the observed vector y while $\alpha_i$ is the i-th element of the finite field $\mathbb{F}_q$ and $\phi$ is a special symbol denoting erasure, and where a,b are appropriately chosen positive integers;

wherein, as the number of interpolation points in the 2) interpolating becomes very large, the decoding method produces a list of candidate codewords that contains the particular codeword at the input to the q-ary symmetric erasure channel, provided that less than t errors have occurred, further provided that the fraction $\tau=t/n$ satisfies the inequality $$\frac{1}{1-\sigma}\left((1-\sigma-\tau)^2 + \frac{\tau^2}{q-1}\right) + \frac{\sigma}{q} \geq R + \frac{g}{n}$$

where q is the size of the alphabet of the q-ary symmetric erasure channel, not counting the symbol $\phi$ denoting erasure, $\sigma$ is the number of erasures that occurred, R is the rate of the algebraic-geometric code, and g is the genus of the algebraic curve that is used in the construction of the algebraic-geometric code.

44. The decoding method according to claim 41 wherein the error-correcting code comprises an algebraic-geometric code on a q-PSK channel, wherein the 1) computing of non-negative integer-valued numbers $m_{i,j}$ comprises:

for each integer j in the range $1 \leq j \leq n$, setting $m_{i,j}=a$ if $y_j$ is the QPSK symbol that corresponds to $\alpha_i$, $m_{i,j}=b$ if $y_j$ is a nearest neighbor of the QPSK symbol that corresponds to $\alpha_i$, and $m_{i,j} \notin \{a,b\}$ otherwise, where $y_j$ is the j-th element of the observed vector y and $\alpha_i$ is the i-th element of the finite field $\mathbb{F}_q$, and where a,b are appropriately chosen positive integers;

wherein, as the number of interpolation points in the 2) interpolating becomes very large, the method produces a list of candidate codewords that contains the particular codeword at the input to the Q-PSK channel, provided that less than s errors to the nearest neighbors and less than t errors beyond the nearest neighbors have occurred, further provided that the fractions $\sigma=s/n$ and $\tau=t/n$ satisfy the inequality:

$$(1-\tau-\sigma)^2 + \frac{\tau^2}{q-3} + \frac{\sigma^2}{2} \geq R + \frac{g}{n}$$

where q is the size of the alphabet of the q-PSK channel, R is the rate of the algebraic-geometric code, and g is the genus of the algebraic curve that is used in the construction of the algebraic-geometric code.

45. The method according to claim 40, wherein at least one of the 1) computing, the 2) interpolating, and the 3) factoring is implemented in special purpose digital logic.

46. The method according to claim 40, wherein at least one of the 1) computing, the 2) interpolating, and the 3) factoring is implemented by software in a general purpose digital computing device, including a digital signal processing (DSP) integrated circuit or a digital computer.

47. The method according to claim 40 wherein the error-correcting code comprises a coding scheme taken from the group consisting of concatenated coding schemes, multi-level coding schemes, and combinations thereof.

48. The method according to claim 40 wherein the step of converting reliability information comprises the step of converting reliability information concerning individual code symbols used in a communication system.

49. The method according to claim 40 wherein the step of converting reliability information comprises the step of converting reliability information concerning individual code symbols used in a recording system.

50. The method according to claim 40 further comprising the step, after the step of 3) factoring:

4) selecting one or more codeword(s) from the list of candidate codewords generated in the 3) factoring, thereby forming a subset of selected codewords.

\* \* \* \* \*

UNITED STATES PATENT AND TRADEMARK OFFICE
CERTIFICATE OF CORRECTION

PATENT NO. : 6,634,007 B1
DATED : October 14, 2003
INVENTOR(S) : Koetter

It is certified that error appears in the above-identified patent and that said Letters Patent is hereby corrected as shown below:

Title page,
Item [75], Inventors, delete "Alexander Vardy, San Diego, CA (US);"

Column 8,
Line 63, delete "receive" and add -- received --;

Column 11,
Lines 20-40, replace table with the following table (include all lines);

| π | | | | | M | | | | |
|---|---|---|---|---|---|---|---|---|---|
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.44 | 0.40 | 0 | 0 | 1 | 0 | 0 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.22 | 0.40 | 0 | 0 | 1 | 1 | 0 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.3300 | 0.15 | 0.07 | 0.20 | 0 | 2 | 0 | 0 | 0 |
| 0.01 | 0.0012 | 0.305 | 0.22 | 0.20 | 0 | 0 | 1 | 1 | 1 |
| 0.30 | 0.0038 | 0.10 | 0.21 | 0.10 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.2475 | 0.15 | 0.07 | 0.20 | 0 | 3 | 0 | 0 | 0 |
| 0.01 | 0.0012 | 0.305 | 0.22 | 0.20 | 0 | 0 | 1 | 1 | 1 |
| 0.30 | 0.0038 | 0.10 | 0.21 | 0.15 | 2 | 0 | 0 | 0 | 0 |
| 0.01 | 0.0025 | 0.05 | 0.14 | 0.20 | 0 | 0 | 0 | 0 | 0 |
| 0.06 | 0.0025 | 0.09 | 0.14 | 0.05 | 0 | 0 | 0 | 0 | 0 |
| 0.02 | 0.2475 | 0.15 | 0.07 | 0.20 | 0 | 3 | 0 | 0 | 0 |
| 0.01 | 0.0012 | 0.1575 | 0.22 | 0.20 | 0 | 0 | 1 | 1 | 1 |
| 0.30 | 0.0038 | 0.10 | 0.21 | 0.15 | 2 | 0 | 0 | 0 | 0 |

Column 18,
Line 16, delete "sphere-bound on 133" and replace with -- sphere-packing bound on τ 133 --;

Column 22,
Line 10, delete "equation (7)" and replace with the following equation;

$$\Pr(X = \alpha \mid Y = y) = \frac{f(y|\alpha) \Pr(X = \alpha)}{\sum_{x \in \mathcal{X}} f(y|x) \Pr(X = x)} = \frac{f(y|\alpha)}{\sum_{x \in \mathcal{X}} f(y|x)} \qquad (7)$$

UNITED STATES PATENT AND TRADEMARK OFFICE
CERTIFICATE OF CORRECTION

PATENT NO. : 6,634,007 B1
DATED : October 14, 2003
INVENTOR(S) : Koetter

It is certified that error appears in the above-identified patent and that said Letters Patent is hereby corrected as shown below:

Column 22, cont'd.,
Line 22, delete "equation 8" and replace with the following equation;

$$\pi_{i,j} \stackrel{\text{def}}{=} \Pr(X = \alpha_i \mid Y = y_j) \quad \text{for } i = 1,2,\ldots,q \text{ and } j = 1,2,\ldots,n$$

Column 24,
Line 46, delete "$F_{q \times} F_q$ and add -- $F_q \times F_q$ --;

Column 29,
Line 67, delete equation and replace with the following equation;

$$\mathcal{M}(\Pi, s) = \operatorname{argmax}_{M \in \mathcal{M}(\mathcal{O})} (M, \Pi)$$

Column 35,
Line 35, delete "vies" and add -- values --.

Signed and Sealed this

Nineteenth Day of October, 2004

JON W. DUDAS
*Director of the United States Patent and Trademark Office*